(12) United States Patent  
Murakami et al.

(10) Patent No.: US 8,742,962 B2  
(45) Date of Patent: Jun. 3, 2014

(54) SEMICONDUCTOR DEVICE AND SENSOR SYSTEM

(71) Applicant: Renesas Electronics Corporation, Kawasaki (JP)

(72) Inventors: Akihide Murakami, Kawasaki (JP); Hideaki Koyama, Kawasaki (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 13/660,872

(22) Filed: Oct. 25, 2012

(65) Prior Publication Data

US 2013/0120178 A1    May 16, 2013

(30) Foreign Application Priority Data

Nov. 15, 2011    (JP) ................. 2011-250100

(51) Int. Cl.
  *H03M 1/00*  (2006.01)
  *G01D 5/00*  (2006.01)
(52) U.S. Cl.
  CPC .. *H03M 1/00* (2013.01); *G01D 5/00* (2013.01)
  USPC ........................................ 341/139; 341/155
(58) Field of Classification Search
  CPC ........................................................ G01D 5/00
  USPC .................................................... 341/155, 139
  See application file for complete search history.

(56) References Cited

U.S. PATENT DOCUMENTS

| | | | | |
|---|---|---|---|---|
| 4,852,080 A * | 7/1989 | Ohtake et al. | ................. | 370/295 |
| 5,379,294 A * | 1/1995 | Ohtake et al. | ................. | 370/295 |
| 5,825,826 A * | 10/1998 | May et al. | ..................... | 375/295 |
| 5,831,456 A * | 11/1998 | Sutardja | ........................ | 327/100 |
| RE37,751 E * | 6/2002 | Sutardja | ........................ | 327/100 |
| 6,437,723 B1 * | 8/2002 | Otsuka et al. | ................. | 341/155 |
| 7,480,347 B2 * | 1/2009 | Black et al. | ................... | 375/316 |
| 7,492,847 B2 * | 2/2009 | Chou | ............................ | 375/355 |

FOREIGN PATENT DOCUMENTS

JP        10-320684 A    12/1998

* cited by examiner

*Primary Examiner* — Jean B Jeanglaude  
(74) *Attorney, Agent, or Firm* — McGinn IP Law Group, PLLC

(57) ABSTRACT

A semiconductor device includes an analog front-end unit that performs analog front-end processing of a measurement signal input from a sensor, where circuit configuration and circuit characteristics for performing the analog front-end processing are changeable, and an MCU unit that converts the measurement signal after the analog front-end processing from analog to digital and sets circuit configuration and circuit characteristics to the analog front-end unit.

18 Claims, 54 Drawing Sheets

Fig. 1
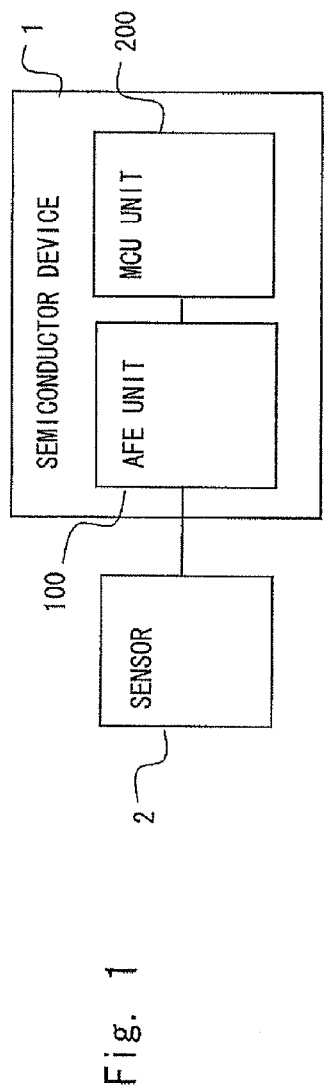
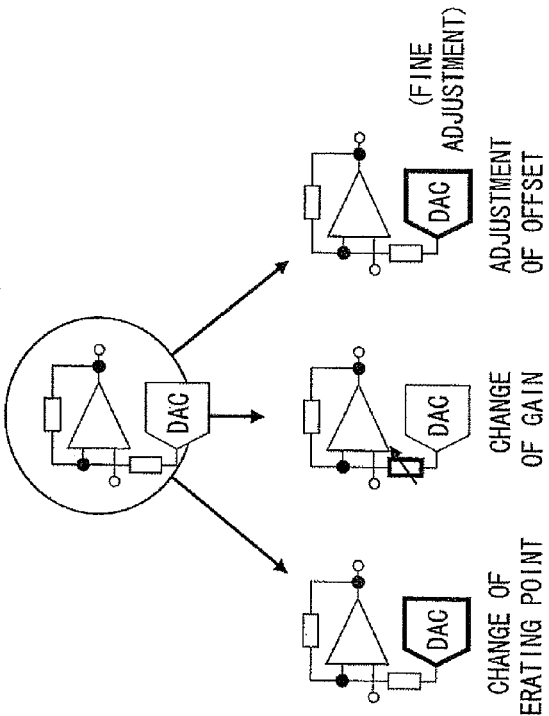
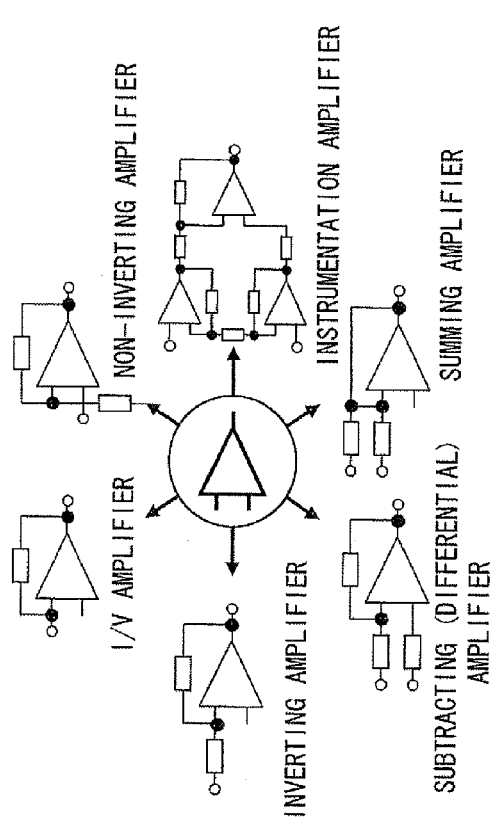

Register List

Font 6 ▼    RegisterReload ~503

| ADDRESS | REGISTER NAME | ATTRI-BUTE | D7 | D6 | D5 | D4 | D3 | D2 | D1 | D0 | HEX |
|---|---|---|---|---|---|---|---|---|---|---|---|
| 00h | CONFIG 1 | R/W | F/F DEFAULT=0 | SW11 | SW12 | SW13 | F/F DEFAULT=0 | SW21 | SW22 | SW23 | 22h |
| | | | 0 | 0 | 0 | 1 | 0 | 0 | 1 | 0 | |
| 01h | CONFIG 2 | R/W | F/F DEFAULT=0 | SW31 | SW32 | SW33 | F/F DEFAULT=0 | SW02 | SW01 | SW00 | 11h |
| | | | 0 | 0 | 0 | 1 | 0 | 0 | 0 | 1 | |
| 02h | CONFIG 3 | R/W | 1V2ch, DIFFE-RENTIAL 1ch | INSTRUMEN-TATION AMP | I/V AMP 3ch | DIFFERENTIAL AMP 3ch | NON-INVERTING AMP 3ch | INVERTING AMP 3ch | OFFSET ADJUSTMENT | | 00h |
| | | | 0 | 0 | 0 | 0 | 0 | 0 | 0 | | |
| 03h | MPX SETTING 1 | R/W | MPX1SEL[1:0] | | MPX2SEL[1:0] | | MPX3SEL[1:0] | | MPX4SEL[1:0] | | CCh |
| | | | 1 | 1 | 0 | 0 | 1 | 1 | 0 | 0 | |
| 04h | MPX SETTING 2 | R/W | F/F DEFAULT=0 | | MPX5SEL[2:0] | | | MPX6SEL[2:0] | | | 23h |
| | | | 0 | 0 | 1 | 0 | 0 | 0 | 1 | 1 | |
| 05h | MPX SETTING 3 | R/W | 0 | 0 | SGF1[1:0] | | SGF2 | | D_AMP[2:0] | | 20h |
| | | | 0 | 0 | 1 | 0 | 0 | 0 | 0 | 0 | |
| 06h | AMP 1 GAIN SETTING | R/W | 0 | 0 | 0 | AMP1[4:0] | | | | | 03h |
| | | | 0 | 0 | 0 | 0 | 0 | 0 | 1 | 1 | |
| 07h | AMP 2 GAIN SETTING | R/W | 0 | 0 | 0 | AMP2[4:0] | | | | | 03h |
| | | | 0 | 0 | 0 | 0 | 0 | 0 | 1 | 1 | |
| 08h | AMP 3 GAIN SETTING INSTRUMENTATION AMP GAIN SETTING | R/W | 0 | 0 | 0 | AMP3[4:0] | | | | | 00h |
| | | | 0 | 0 | 0 | 0 | 0 | 0 | 0 | 0 | |
| 09h | AMP CONSUMPTION CURRENT SWITCH | R/W | F/F DEFAULT=0 | F/F DEFAULT=0 | F/F DEFAULT=0 | F/F DEFAULT=0 | F/F DEFAULT=0 | F/F DEFAULT=0 | CURRENT[1:0] | | 00h |
| | | | 0 | 0 | 0 | 0 | 0 | 0 | 0 | 0 | |
| 0Ah | GAIN AMP GAIN SETTING | R/W | 0 | 0 | 0 | 0 | GAIN AMP[4:0] | | | | 00h |
| | | | 0 | 0 | 0 | 0 | 0 | 0 | 0 | 0 | |
| 0Bh | LDO OUTPUT VOLTAGE SETTING | R/W | 0 | 0 | 0 | 0 | VREF[3:0] | | | | 00h |
| | | | 0 | 0 | 0 | 0 | 0 | 0 | 0 | 0 | |
| 0Ch | DAC VRT, VRB | R/W | 0 | 0 | 0 | 0 | DACVRT[1:0] | | DACVRB[1:0] | | 00h |
| | | | 0 | 0 | 0 | 0 | 0 | 0 | 0 | 0 | |
| 0Dh | DAC 1 INPUT | R/W | DAC1[7:0] | | | | | | | | 00h |
| | | | 0 | 0 | 0 | 0 | 0 | 0 | 0 | 0 | |

Fig. 39

| Count | Ch2 | Ch3 | Ch4 | Ch5 | Ch6 | Ch7 | Ch16 | Ch17 | Ch19 |
|---|---|---|---|---|---|---|---|---|---|
| 1 | | 511 | | | | | | | |
| 2 | | 510 | | | | | | | |
| 3 | | 511 | | | | | | | |
| 4 | | 511 | | | | | | | |
| 5 | | 511 | | | | | | | |
| 6 | | 511 | | | | | | | |
| 7 | | 510 | | | | | | | |
| 8 | | 511 | | | | | | | |
| 9 | | 510 | | | | | | | |
| 10 | | 510 | | | | | | | |
| 11 | | 511 | | | | | | | |
| 12 | | 511 | | | | | | | |
| 13 | | 510 | | | | | | | |
| 14 | | 510 | | | | | | | |
| 15 | | 510 | | | | | | | |
| 16 | | 510 | | | | | | | |
| 17 | | 511 | | | | | | | |
| 18 | | 511 | | | | | | | |
| 19 | | 510 | | | | | | | |

Fig. 40

| Port_Data | | | | | | | |
|---|---|---|---|---|---|---|---|
| FILE | EDIT(E) | VIEW(V) | | | | | |
| Count | Ch2 | Ch3 | V DECIMAL | Ch16 | Ch17 | Ch19 | |
| 1 | | 511 | HEXADECIMAL | | | | |
| 2 | | 510 | AUTOMATIC SCROLL | | | | |
| 3 | | 511 | | | | | |
| 4 | | 511 | | | | | |
| 5 | | 511 | | | | | |
| 6 | | 511 | | | | | |
| 7 | | 510 | | | | | |
| 8 | | 511 | | | | | |
| 9 | | 510 | | | | | |
| 10 | | 510 | | | | | |
| 11 | | 511 | | | | | |
| 12 | | 511 | | | | | |
| 13 | | 510 | | | | | |
| 14 | | 510 | | | | | |
| 15 | | 510 | | | | | |
| 16 | | 510 | | | | | |
| 17 | | 511 | | | | | |
| 18 | | 511 | | | | | |
| 19 | | 510 | | | | | |

Fig. 41

SEMICONDUCTOR DEVICE AND SENSOR SYSTEM

CROSS-REFERENCE TO RELATED APPLICATIONS

This application is based upon and claims the benefit of priority from Japanese patent application No. 2011-250100, filed on Nov. 15, 2011, the disclosure of which is incorporated herein in its entirety by reference.

BACKGROUND

The present invention relates to a semiconductor device and a sensor system and, particularly, to a semiconductor device and a sensor system including an analog front-end circuit.

Sensors are increasingly employed in various equipments such as consumer products, industrial products and medical products because of improvement of usability, enlargement of ecosystem, penetration of health care, enhancement of security and the like. Factors behind this trend include the improved usability of a sensor device and the low voltage and the low power of an analog circuit which is essential to implement a sensor to allow system downsizing and cost reduction. There are various types of sensors including a temperature sensor, infrared sensor, photosensor and shock sensor, and a circuit for processing a sensor signal is formed and characteristic setting is made in accordance with the principle of operation.

In such equipment, a control device such as a microcomputer performs control processing in accordance with a measurement result of a sensor. Because a measurement signal that is output from a sensor cannot be processed by a control device such as a microcomputer, analog front-end processing such as amplification to a specified level and removal of noise is performed by an analog front-end (AFE) circuit before input to the microcomputer. In the analog front-end processing, design in accordance with the principle of operation and the characteristics of a sensor is required and further design know-how specific to analog is needed, and therefore a dedicated AFE circuit or a dedicated IC has been developed for a specific sensor by narrowing down the principle of operation and the characteristics of a sensor to serve as a target.

An AFE circuit according to related art is disclosed in Japanese Unexamined Patent Application Publication No. 10-320684, for example. FIG. 55 shows the circuit configuration according to the related art disclosed therein. The circuit includes a sensor 903, an analog input circuit 911, which is an analog front-end circuit, and a microcomputer 910.

The analog input circuit 911 includes a transformer 920 that receives a signal from the sensor 903, a filter 921 that allows a signal component with a specific frequency to pass through, an amplification circuit 922 that amplifies the output of the filter 921, an A/D converter 923 that converts the output of the amplification circuit 922 from analog to digital, and a comparator circuit 924 that compares the output of the amplification circuit 922 with a reference voltage.

The microcomputer 910 processes a digital signal that is output from the A/D converter 923 and performs processing in accordance with the detection of the sensor 903. Further, the microcomputer 910 outputs a control signal to the filter 921 and changes the frequency characteristics of the filter 921.

SUMMARY

As described above, according to the related art, the characteristics of the filter 921 in the analog input circuit 911 can be changed by the control of the microcomputer 910. On the other hand, a sensor system that incorporates a sensor is increasing today as described above, and it is desired to develop a semiconductor device and a sensor system including an analog circuit in a short period of time for timely entry into the market.

However, because there are various types of sensors including a temperature sensor, infrared sensor, photosensor and shock sensor, it is difficult to develop a semiconductor device and a sensor system that support various types of sensors in a short period of time just by changing the characteristics of the filter as in the related art.

Thus, in order to support various types of sensors, it has been necessary in the related art to prepare circuits with different circuit configurations in accordance with sensors and set the characteristics of the circuits in accordance with sensors, which raises a problem that it is difficult to develop the semiconductor device and the sensor system in a short period of time.

A first aspect of the present invention is a semiconductor device that includes an analog front-end unit that performs analog front-end processing of a measurement signal input from a sensor, where circuit configuration and circuit characteristics for performing the analog front-end processing are changeable, and a control unit that converts the measurement signal after the analog front-end processing from analog to digital and sets circuit configuration and circuit characteristics to the analog front-end unit.

A second aspect of the present invention is a sensor system that includes a sensor that outputs a measurement signal indicating a specified measurement result, and a semiconductor device that performs control operation in accordance with the measurement result, the semiconductor device including an analog front-end unit that performs analog front-end processing of a measurement signal input from a sensor, where circuit configuration and circuit characteristics for performing the analog front-end processing are changeable, and a control unit that converts the measurement signal after the analog front-end processing from analog to digital and sets circuit configuration and circuit characteristics to the analog front-end unit.

According to the above-described aspects of the present invention, because the semiconductor device includes the analog front-end unit whose circuit configuration and circuit characteristics are changeable, one semiconductor device can support various types of sensors, and it is thus possible to reduce the development period of the semiconductor device and the sensor system.

According to the present invention, it is possible to provide a semiconductor device and a sensor system that can be developed in a shorter period of time.

BRIEF DESCRIPTION OF THE DRAWINGS

The above and other aspects, advantages and features will be more apparent from the following description of certain embodiments taken in conjunction with the accompanying drawings, in which:

FIG. 1 is a configuration diagram of a sensor system according to a first embodiment of the invention;

FIG. 39 is a display image diagram of GUI used in setting evaluation of the semiconductor device according to the first embodiment of the invention;

FIG. 40 is a display image diagram of GUI used in setting evaluation of the semiconductor device according to the first embodiment of the invention;

FIG. 41 is a display image diagram of GUI used in setting evaluation of the semiconductor device according to the first embodiment of the invention;

DETAILED DESCRIPTION (First Embodiment of the Present Invention)

A first embodiment of the present invention is described hereinafter with reference to the drawings. FIG. 1 shows a configuration of a sensor system that includes a semiconductor device according to this embodiment.

As shown in FIG. 1, the sensor system includes a sensor 2 and a semiconductor device 1 that is connected to the sensor 2.

As the sensor 2, various sensors such as a current output sensor that outputs a current in accordance with a detection result, a voltage output sensor that outputs a voltage in accordance with a detection result, and a sensor that outputs a faint differential signal in accordance with a detection result may be used. Application examples of sensors are described later.

The semiconductor device 1 includes a MCU unit 200 and an AFE unit 100. The semiconductor device 1 is a SoC (System-on-a-chip) on which a semiconductor chip of the MCU unit 200 and a semiconductor chip of the AFE unit 100 are integrated into one semiconductor device, for example. Note that the MCU unit 200 and the AFE unit 100 may be a semiconductor device of one chip.

The MCU unit (control unit) 200 is a micro controller that converts a measurement signal (detection signal) of the sensor 2 that is input through the AFE unit 100 from analog to digital and performs control processing in accordance with a detection result. Further, the MCU unit 200 outputs a control signal for changing the settings of the configuration and characteristics of the AFE unit 100 to the AFE unit 100.

The AFE unit (analog input unit) 100 is an analog circuit that performs analog front-end processing such as amplification and filtering on the measurement signal that is output from the sensor 2 to generate a signal that is processable by the MCU unit 200. Further, the AFE unit 100 can change in its topology (circuit configuration) and parameter (circuit characteristics) as shown in FIG. 1.

As shown in the FIG. 1, it is possible to change from the configuration of an operational amplifier circuit to an I/V amplifier, a subtracting (differential) amplifier, a summing amplifier, an inverting amplifier, a non-inverting amplifier and an instrumentation amplifier. Further, as shown in a parameter example of a non-inverting amplifier, a change of operating point, a change of gain and adjustment of offset can be made.

Figure 2:
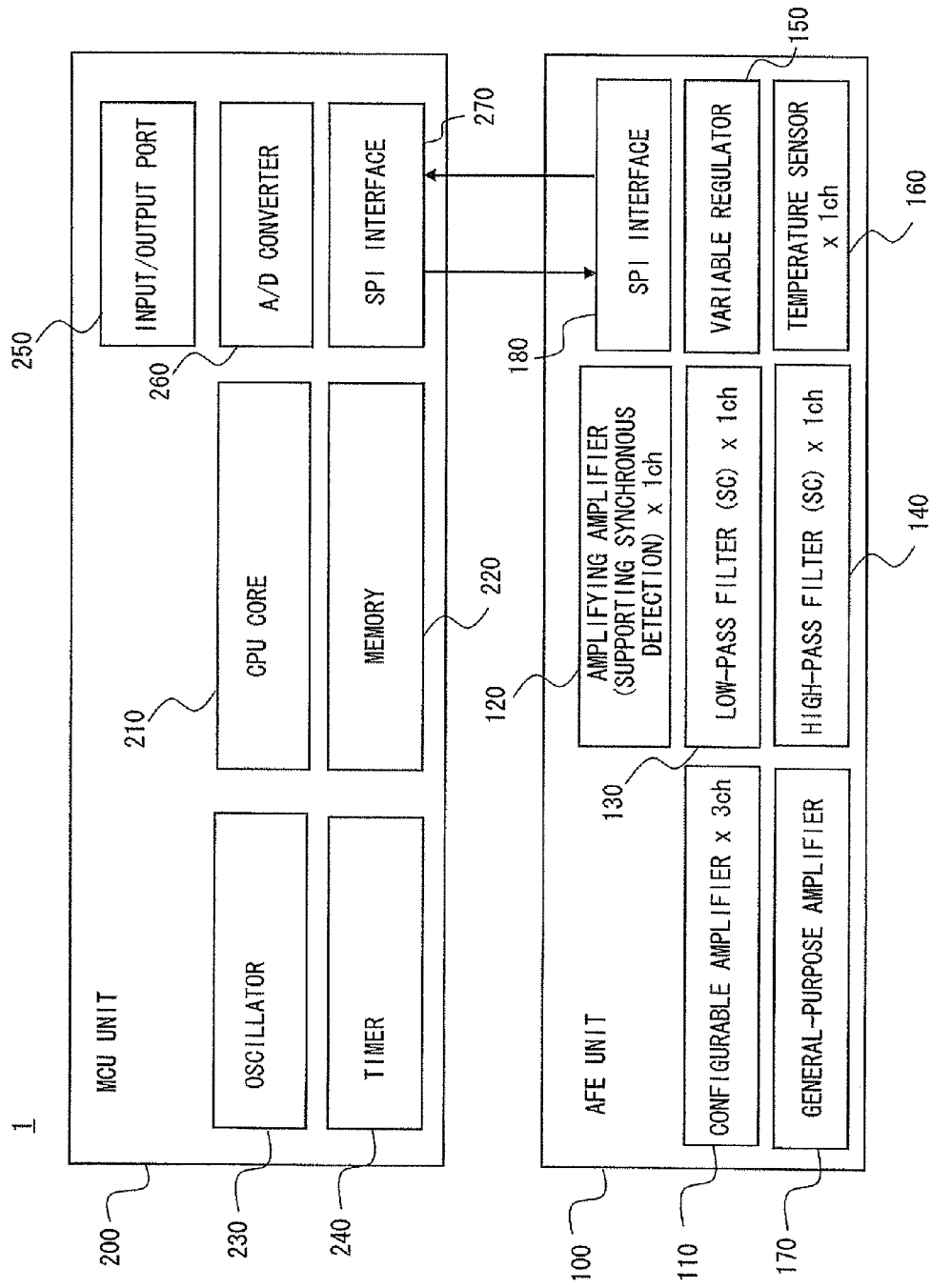
FIG. 2 is a circuit block diagram of a semiconductor device according to the first embodiment of the invention.

FIG. 2 shows a circuit block of the semiconductor device 1. As shown in FIG. 2, the MCU unit 200 includes a CPU core 210, a memory 220, an oscillator 230, a timer 240, an input/output port 250, an A/D converter 260, and a an SPI (Serial Peripheral Interface) interface 270. Note that the MCU unit 200 includes other circuits for implementing the function of a microcontroller, such a DMA and various arithmetic circuits, for example.

The CPU core 210 executes a program stored in the memory 220 and performs control processing according to the program. The memory 220 stores the program to be executed by the CPU core 210 and various data. The oscillator 230 generates an operating clock of the MCU unit 200 and further supplies the clock to the AFE unit 100 according to need. The timer 240 is used for the control operation of the MCU unit 200.

The input/output port 250 is an interface for inputting and outputting data or the like to and from external devices of the semiconductor device 1, and it is connectable to an external computer device or the like as described later, for example.

The A/D converter 260 converts a measurement signal of the sensor 2 that is input through the AFE unit 100 from analog to digital. The power of the A/D converter 260 is supplied from the AFE unit 100.

The SPI (Serial Peripheral Interface) interface 270 is an interface for inputting and outputting data or the like to and from the AFE unit 100. Note that the SPI interface 270 is a general-purpose serial interface, and another microcontroller or microcomputer can connect to the AFE unit 100 if it supports SPI.

The semiconductor device 1 of this embodiment has a configuration compatible with general-purpose applications. To be specific, a complete AFE circuit for sensor is mounted to allow connection with sensors of various types and characteristics. Specifically, the AFE unit 100 includes a configurable amplifier 110, a gain amplifier supporting synchronous detection (which is also referred to hereinafter as a gain amplifier) 120, a Switched Capacitor (SC) low-pass filter (hereinafter as a low-pass filter) 130, a SC high-pass filter (hereinafter as a high-pass filter) 140, a variable regulator 150, a temperature sensor 160, a general-purpose amplifier 170, and an SPI interface 180.

The configurable amplifier 110 is an amplification circuit that amplifies a signal which is input from the outside such as the sensor 2, and its circuit configuration, characteristics and operation can be set according to control from the MCU unit 200. The configurable amplifier 110 includes 3ch amplifiers, which are, three amplifiers. Many different circuit configurations can be implemented by the three amplifiers.

The gain amplifier 120 is an amplification circuit supporting synchronous detection that amplifies an output of the configurable amplifier 110 and a signal input from the outside such as the sensor 2, and its characteristics and operation can be set according to control from the MCU unit 200.

The low-pass filter 130 is an SC filter that removes high-frequency components of outputs of the configurable amplifier 110 and the gain amplifier 120 and signals input from the outside such as the sensor 2, and allows low-frequency components thereof to pass through, and its characteristics and operation can be set according to control from the MCU unit 200. The high-pass filter 140 is an SC filter that removes low-frequency components of outputs of the configurable amplifier 110 and the gain amplifier 120 and signals input from the outside such as the sensor 2, and allows high-frequency components thereof to pass through, and its characteristics and operation can be set according to control from the MCU unit 200.

The variable regulator 150 is a variable voltage source that supplies a voltage to the A/D converter 260 of the MCU unit 200, and its characteristics and operation can be set according to control from the MCU unit 200. The temperature sensor 160 is a sensor that measures the temperature of the semiconductor device 1, and its operation can be set according to control from the MCU unit 200.

The general-purpose amplifier 170 is an amplifier that amplifies a signal that is input from the outside such as the sensor 2, and its operation can be set according to control from the MCU unit 200. The SPI interface 180 is an interface for inputting and outputting data or the like to and from the MCU unit 200 and is connected to the SPI interface 270 of the MCU unit 200 through an SPI bus.

Figure 3:
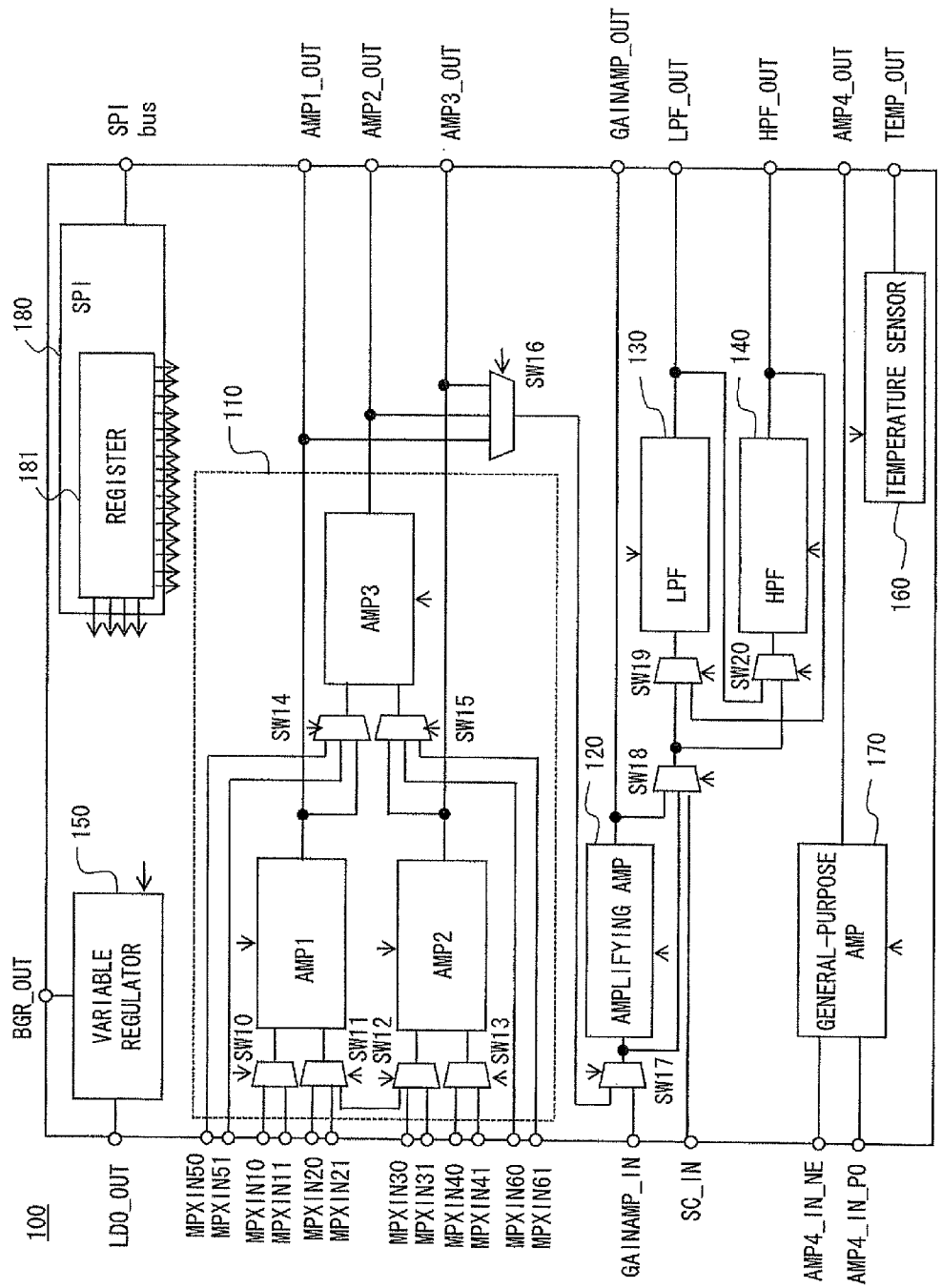
FIG. 3 is a diagram showing connections of circuits in the semiconductor device according to the first embodiment of the invention.

The configuration of the AFE unit 100 of the semiconductor device 1 according to this embodiment is described in detail hereinafter. FIG. 3 shows connections of circuits in the AFE unit 100. The SPI interface 180 is connected to external terminals (CS, SCLK, SDO, SDI) that are connected to the SPI bus and includes a register (control register) 181. The configuration information (setting information) for changing the configuration and characteristics of the circuit is input from the MCU unit 200 through the SPI interface and stored into the register 181. The register 181 is connected to the respective circuits in the AFE unit 100, and the configuration and characteristics of each circuit in the AFE unit 100 are set according to the configuration information in the register 181.

The configurable amplifier 110 includes separate amplifiers AMP1, AMP2 and AMP3, and switches SW10 to SW15 for switching input and output of amplifiers are connected.

In the separate amplifier AMP1, one input terminal is connected to MPXIN10 or MPXIN11 through the switch SW10, the other input terminal is connected to MPXIN20 or MPXIN21 through the switch SW11, and the output terminal is connected to AMP1_OUT. Likewise, in the separate amplifier AMP2, one input terminal is connected to MPXIN30 or MPXIN31 through the switch SW12, the other input terminal is connected to MPXIN40 or MPXIN41 through the switch SW13, and the output terminal is connected to AMP2_OUT.

Further, in the separate amplifier AMP3, one input terminal is connected to MPXIN50, MPXIN51 or the output terminal of the AMP1 through the switch SW14, the other input terminal is connected to MPXIN60, MPXIN61 or the output terminal of the AMP2 through the switch SW15, and the output terminal is connected to AMP3_OUT. The output terminals of the AMP1 to AMP3 are connected also to the gain amplifier 120, the low-pass filter 130 and the high-pass filter 140.

In the configurable amplifier 110, the switches SW10 to SW15 are switched according to the set value of the register 181, and thereby the connections of the AMP1 to AMP3 are changed, and the internal circuit configuration and characteristics are also changed as described later.

Figure 4:
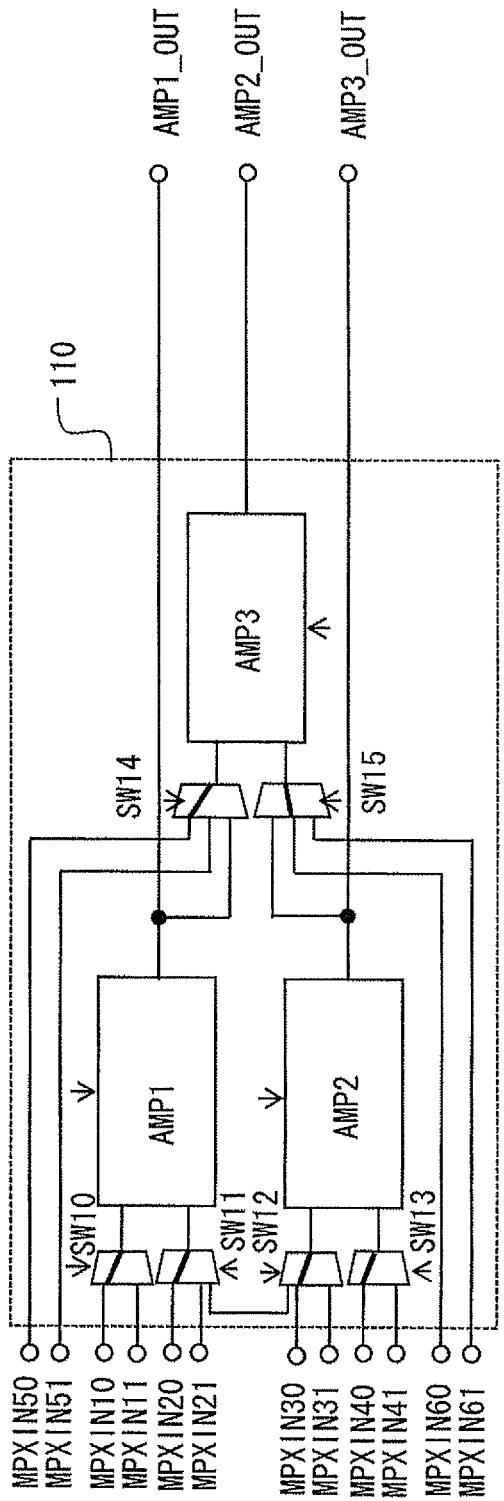
FIG. 4 is a diagram showing an example of connection of a circuit in the semiconductor device according to the first embodiment of the invention.
Figure 5:
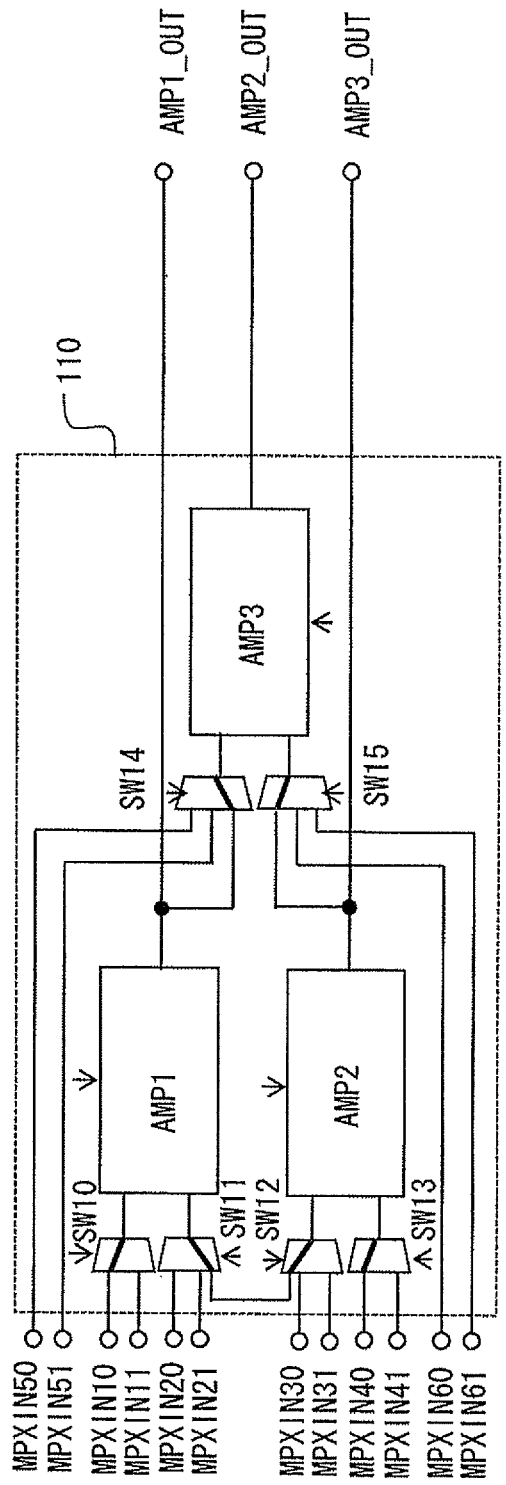
FIG. 5 is a diagram showing an example of connection of a circuit in the semiconductor device according to the first embodiment of the invention.

FIGS. 4 and 5 are examples of switching the connections of the AMP1 to AMP3 by the switches SW10 to SW15. In FIG. 4, by the setting of the register 181, the switches SW10 and SW11 are switched to connect the input terminals of the AMP1 to the MPXIN10 and MPXIN20, the switches SW12 and SW13 are switched to connect the input terminals of the AMP2 to the MPXIN30 and MPXIN40, and the switches SW14 and SW15 are switched to connect the input terminals of the AMP3 to the MPXIN50 and MPXIN60. In these connections, the AMP1, AMP2 and AMP3 can operate as independent amplifiers.

In FIG. 5, by the setting of the register 181, the switch SW10 is switched to connect one input terminal of the AMP1 to the MPXIN10, the switch SW12 is switched to connect one input terminal of the AMP2 to the MPXIN30, the switches SW11 and SW12 are switched to connect the other input terminal of the AMP1 to the other input terminal of the AMP2, the switches SW14 and SW15 are switched to connect one input terminal of the AMP3 to the output terminal of the AMP1 and connect the other input terminal of the AMP3 to the output terminal of the AMP2. In these connections, an instrumentation amplifier connecting the AMP1 to AMP3 can be configured.

Further, as shown in FIG. 3, switches SW16 and SW17 for switching input are connected to the gain amplifier 120. In the gain amplifier 120, the input terminal is connected to the output terminals of the AMP1 to AMP3 through the switches SW16 and SW17 or connected to GAINAMP_IN through the switch SW17, and the output terminal is connected to GAINAMP_OUT. The output terminal of the gain amplifier 120 is connected also to the low-pass filter 130 and the high-pass filter 140.

Switches SW18 and SW19 for switching input are connected to the low-pass filter 130, and switches SW18 and SW20 for switching input are connected to the high-pass filter 140. In the low-pass filter 130, the input terminal is connected to the output terminals of the AMP1 to AMP3, the output terminal of the gain amplifier 120 or SC_IN through the switches SW18 and SW19, or connected to the output terminal of the gain amplifier 120 through the switch SW19, and the output terminal is connected to LPF_OUT. In the high-pass filter 140, the input terminal is connected to the output terminals of the AMP1 to AMP3, the output terminal of the gain amplifier 120 or SC_IN through the switches SW18 and SW19, or connected to the output terminal of the low-pass filter 130 through the switch SW19, and the output terminal is connected to HPF_OUT.

In the gain amplifier 120, the low-pass filter 130 and the high-pass filter 140, the switches SW16 to SW20 are switched according to the set value of the register 181, and the connections of the gain amplifier 120, the low-pass filter 130 and the high-pass filter 140 are changed, and the internal characteristics are also changed as described later.

Figure 6:
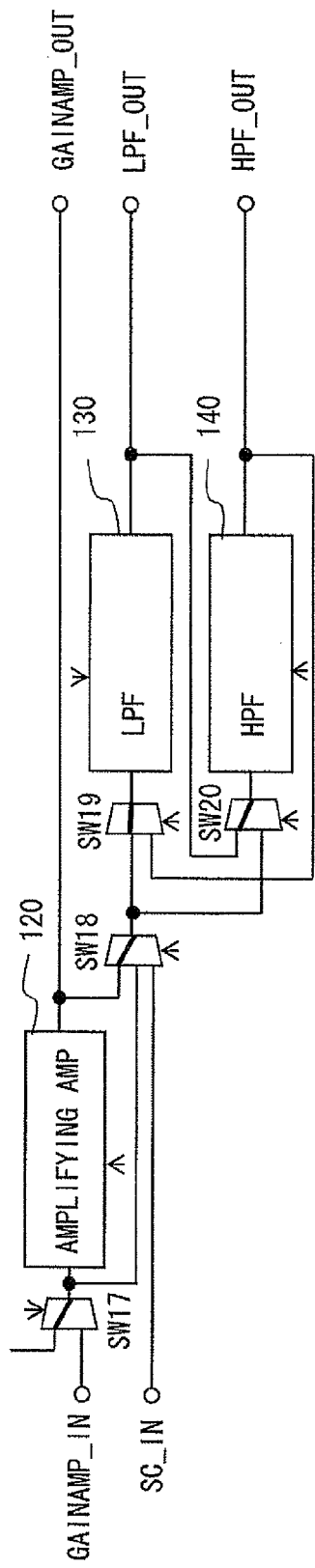
FIG. 6 is a diagram showing an example of connection of a circuit in the semiconductor device according to the first embodiment of the invention.
Figure 7:
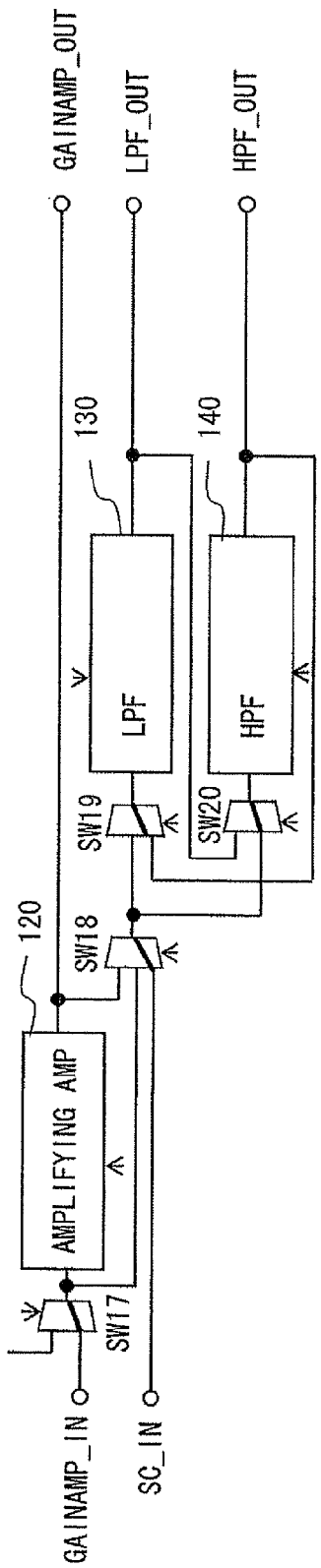
FIG. 7 is a diagram showing an example of connection of a circuit in the semiconductor device according to the first embodiment of the invention.

FIGS. 6 and 7 are examples of switching the connections of the gain amplifier 120, the low-pass filter 130 and the high-pass filter 140 by the switches SW17 to SW20. In FIG. 6, by the setting of the register 181, the switch SW17 is switched to connect the input terminal of the gain amplifier 120 to any output terminal of the AMP1 to AMP3, the switches SW18 and SW19 are switched to connect the input terminal of the low-pass filter 130 to the output terminal of the gain amplifier 120, and the switch SW20 is switched to connect the input terminal of the high-pass filter 140 to the output terminal of the low-pass filter 130. In this switching, a circuit in which any one of the AMP1 to AMP3, the gain amplifier 120, the low-pass filter 130 and the high-pass filter 140 are connected in this order can be formed.

In FIG. 7, by the setting of the register 181, the switch SW17 is switched to connect the input terminal of the gain amplifier 120 to GAINAMP_IN, the switches SW18 and SW20 are switched to connect the input terminal of the high-pass filter 140 to SC_IN, and the switch SW19 is switched to connect the input terminal of the low-pass filter 130 to the output terminal of the high-pass filter 140. In this switching, the gain amplifier 120 can operate as a single independent amplifier, and a circuit in which the high-pass filter 140 and the low-pass filter 130 are connected in this order can be formed.

Further, as shown in FIG. 3, in the variable regulator 150, the output terminal is connected to BGR_OUT and LDO_OUT. The characteristics of the variable regulator 150 are changed as described later according to the set value of the register 181.

In the temperature sensor 160, the output terminal is connected to TEMP_OUT. The characteristics of the temperature sensor 160 are changed as described later according to the set value of the register 181.

In the general-purpose amplifier 170, one input terminal is connected to AMP4_IN_NE, the other input terminal is connected to AMP4_IN_PO, and the output terminal is connected to AMP4_OUT. The general-purpose amplifier is formed by one operational amplifier, and the gain is changed and the power on/off is set according to the set value of the register 181.

A specific circuit configuration of the configurable amplifier 110 is described hereinafter with reference to FIGS. 8 to 14.

The configurable amplifier 110 is an amplifier for amplifying a sensor output signal, and its topology (circuit configuration) and parameter (circuit characteristics) can be changed according to the setting of the control register. As a change in characteristics, the gain can be set to be variable. For example, in the case of using the separate amplifiers independently of one another, the gain can be set in units of 2 dB from 6 dB to 46 dB, and in the case of using them as an instrumentation amplifier, the gain can be set in units of 2 dB from 20 dB to 60 dB. Further, the slew rate can be set to be variable, and the power on/off can be switched by power-off mode.

Figure 8:
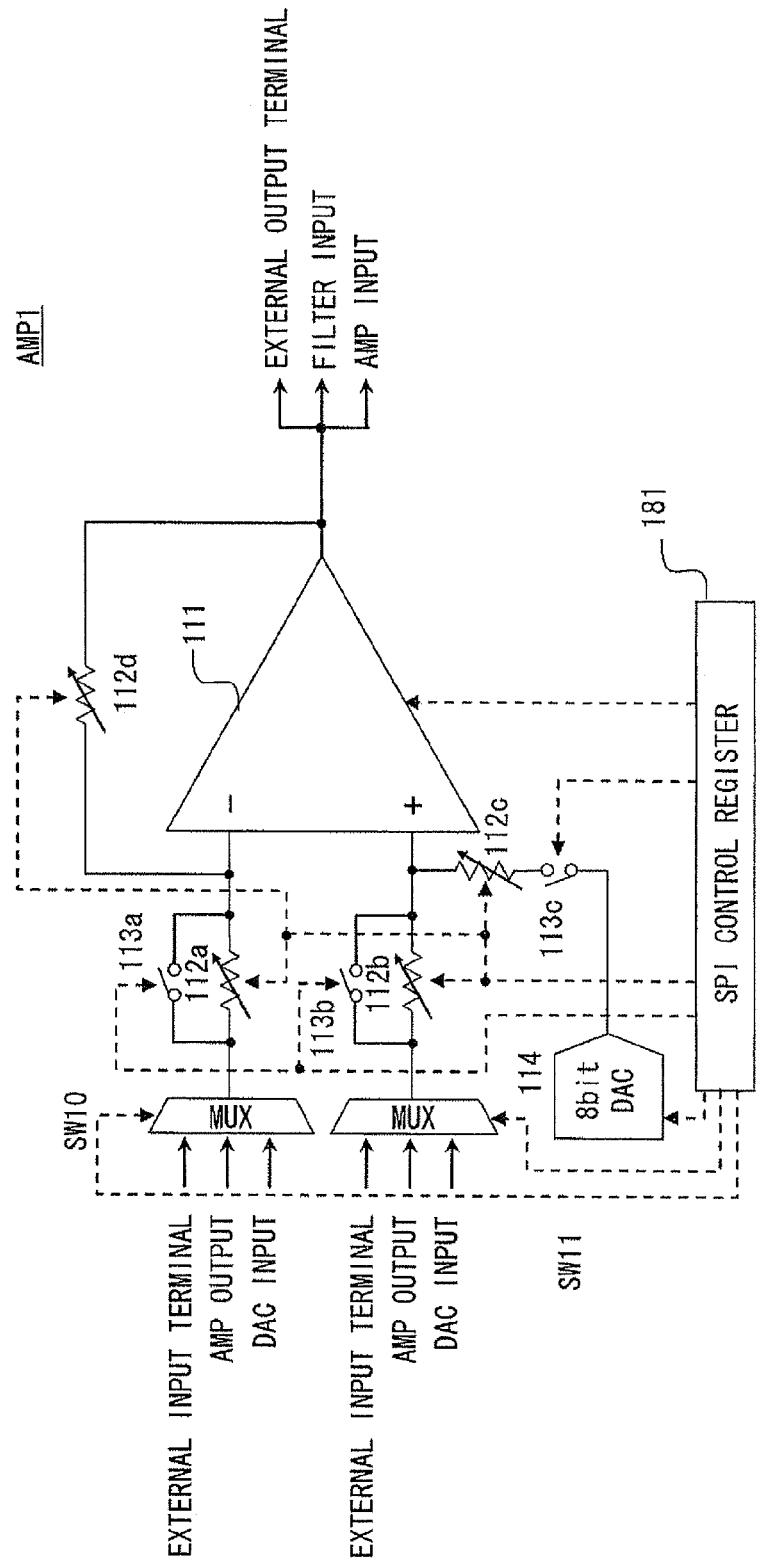
FIG. 8 is a circuit diagram showing a circuit configuration of the semiconductor device according to the first embodiment of the invention.

FIG. 8 shows a circuit configuration of a separate amplifier AMP1 of the configurable amplifier 110. The AMP2 and AMP3 have the same configuration.

As shown in FIG. 8, the separate amplifier AMP1 includes an operational amplifier 111 and further includes variable resistors 112a to 112d, switches 113a to 113c, and a DAC 114 that are connected to terminals of the operational amplifier 111, and multiplexers (switches) SW10 and SW11 are connected to the AMP1 as shown in FIG. 3.

According to the set value of the register 181, the input of the operational amplifier 111 can be switched by the multiplexers SW10 and SW11, the presence or absence of the variable resistors (input resistors) 112a and 112b can be switched by the switches 113a and 113b, and the connection of the DAC 114 can be switched by the switch 113c. Note that the output of the operational amplifier 111 is switched for connection with the gain amplifier 120, the low-pass filter 130 and the high-pass filter 140 by the switches SW16, SW17 and SW18 as shown in FIG. 3. Further, the gain, operating point, offset and the like of the AMP1 can be changed by changing the resistance values of the variable resistors 112a, 112b, 112c and 112d and the setting of the DAC 114 according to the set value of the register 181. Further, the slew rate and the power on/off can be controlled by controlling the operational amplifier 111 according to the set value of the register 181.

An I/V amplifier, an inverting amplifier, a subtracting (differential) amplifier, a non-inverting amplifier, and a summing amplifier can be formed by switching of the switches and multiplexers.

Figure 9:
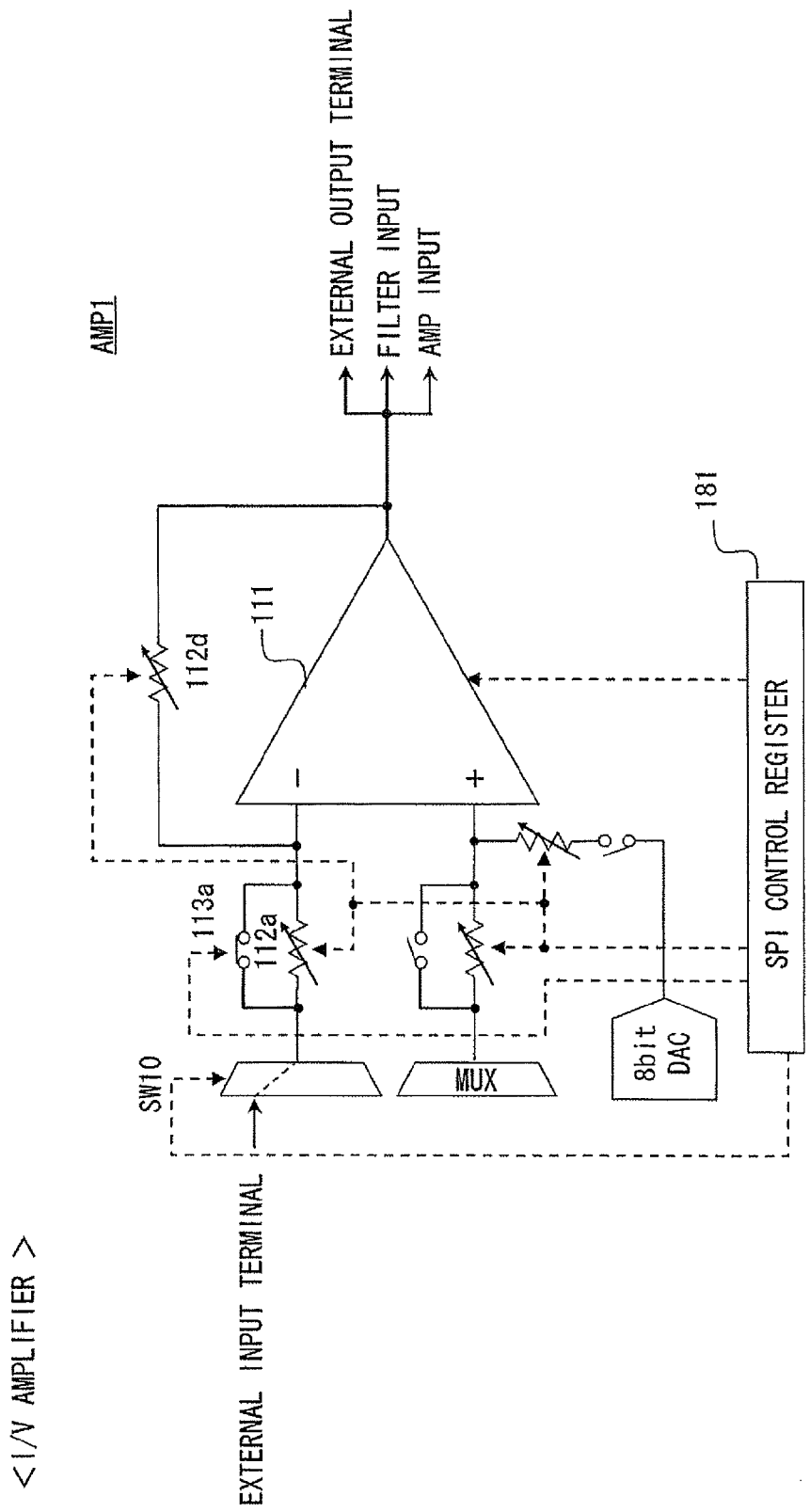
FIG. 9 is a circuit diagram showing an example of configuration change of the semiconductor device according to the first embodiment of the invention.

FIG. 9 shows an example of forming an I/V amplifier. According to the setting of the register 181, the multiplexer SW10 is switched to connect the external input terminal (MPXIN10) to the inverting input terminal, the switch 113a is turned on, and the variable resistor 112a is short-circuited. In such connections, an I/V amplifier is formed. Further, by the setting of the register 181, the resistance values of the variable resistors 112a and 112d are changed to set the gain of the amplifier. When a signal of a current-type sensor is input from the external input terminal, the I/V amplifier converts the input current into a voltage and outputs the voltage.

Figure 10:
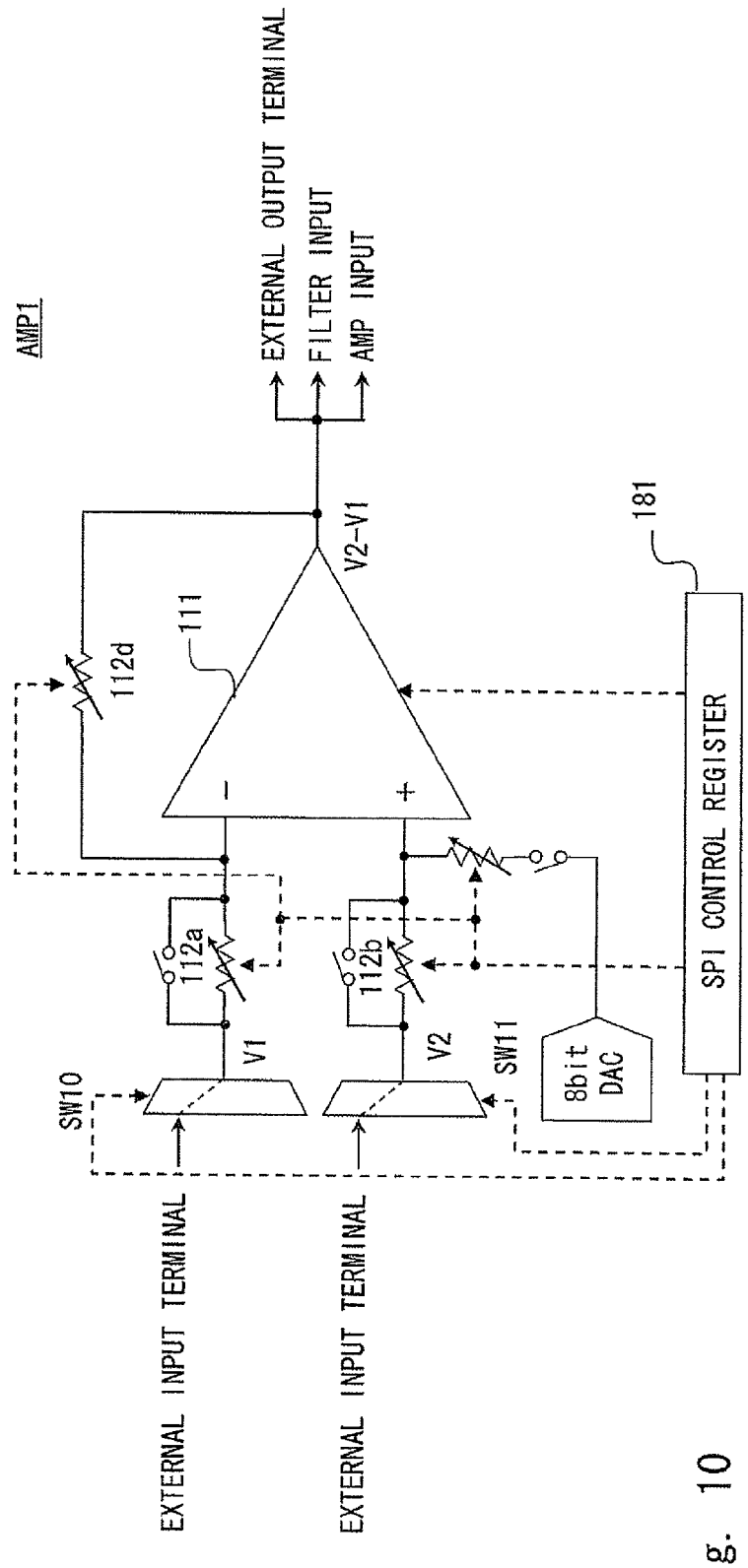
FIG. 10 is a circuit diagram showing an example of configuration change of the semiconductor device according to the first embodiment of the invention.

FIG. 10 is an example of forming a subtracting (differential) amplifier. According to the setting of the register 181, the multiplexers SW10 and SW11 are switched to connect the external input terminal (MPXIN10) to the inverting input terminal and connect the external input terminal (MPXIN20) to the non-inverting input terminal. In such connections, a subtracting amplifier is formed. Further, by the setting of the register 181, the resistance values of the variable resistors 112a, 112b and 112d are changed to set the gain of the amplifier. When two signals (V1, V2) are input from the external input terminals, the subtracting amplifier outputs a voltage (V2−V1) obtained by subtracting one input voltage from the other input voltage.

Figure 11:
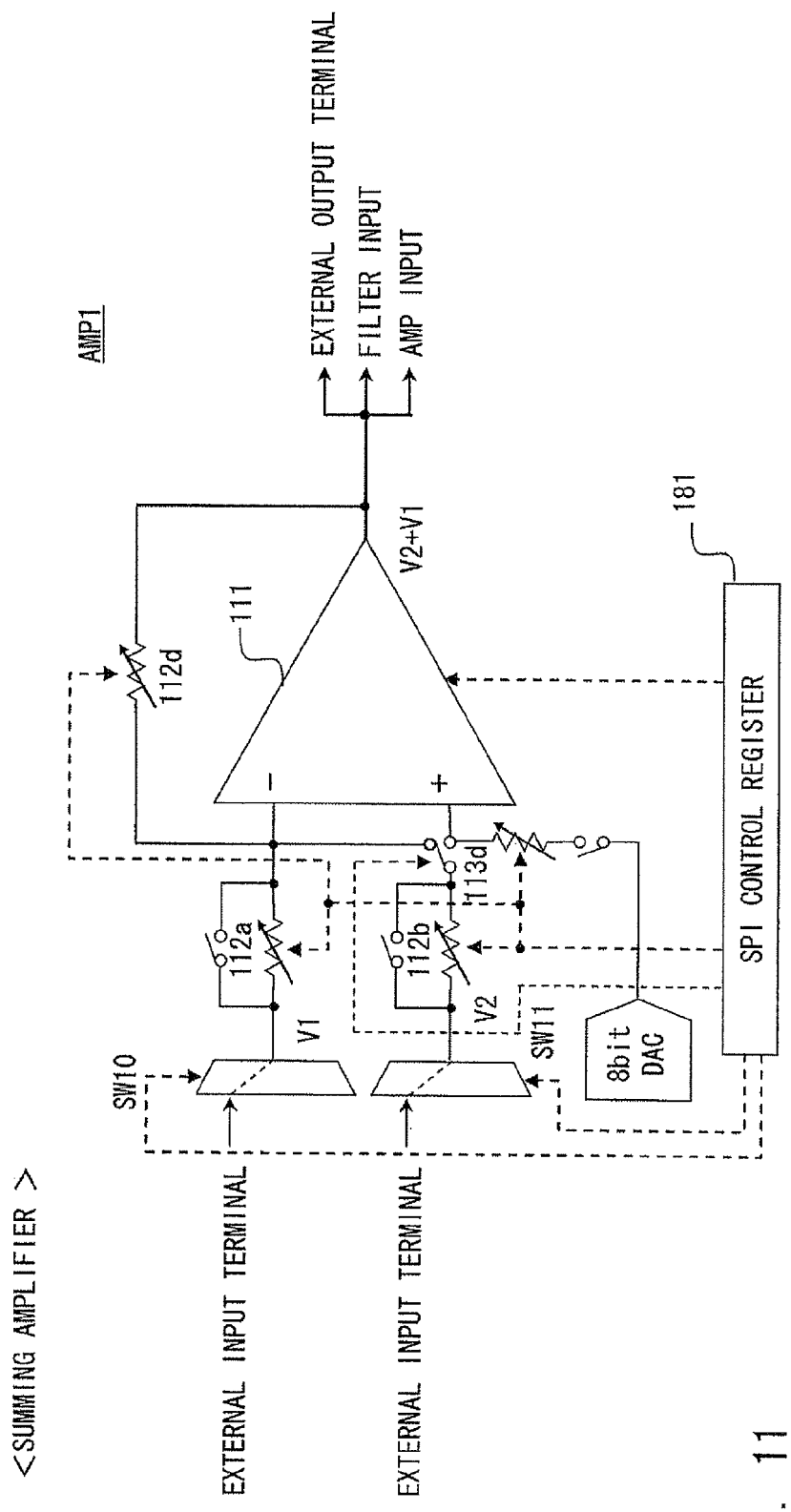
FIG. 11 is a circuit diagram showing an example of configuration change of the semiconductor device according to the first embodiment of the invention.

FIG. 11 shows an example of forming a summing amplifier. It is assumed that a switch 113d is placed between the variable resistor 112b and the inverting input terminal. According to the setting of the register 181, the multiplexers SW10 and SW11 and the switch 113d are switched to connect the external input terminal (MPXIN10) and the external input terminal (MPXIN20) to the inverting input terminal. In such connections, a summing amplifier is formed. Further, by the setting of the register 181, the resistance values of the variable resistors 112a, 112b and 112d are changed to set the gain of the amplifier. When two signals (V1, V2) are input from the external input terminals, the summing amplifier outputs a voltage (V1+V2) obtained by summing one input voltage and the other input voltage.

Figure 12:
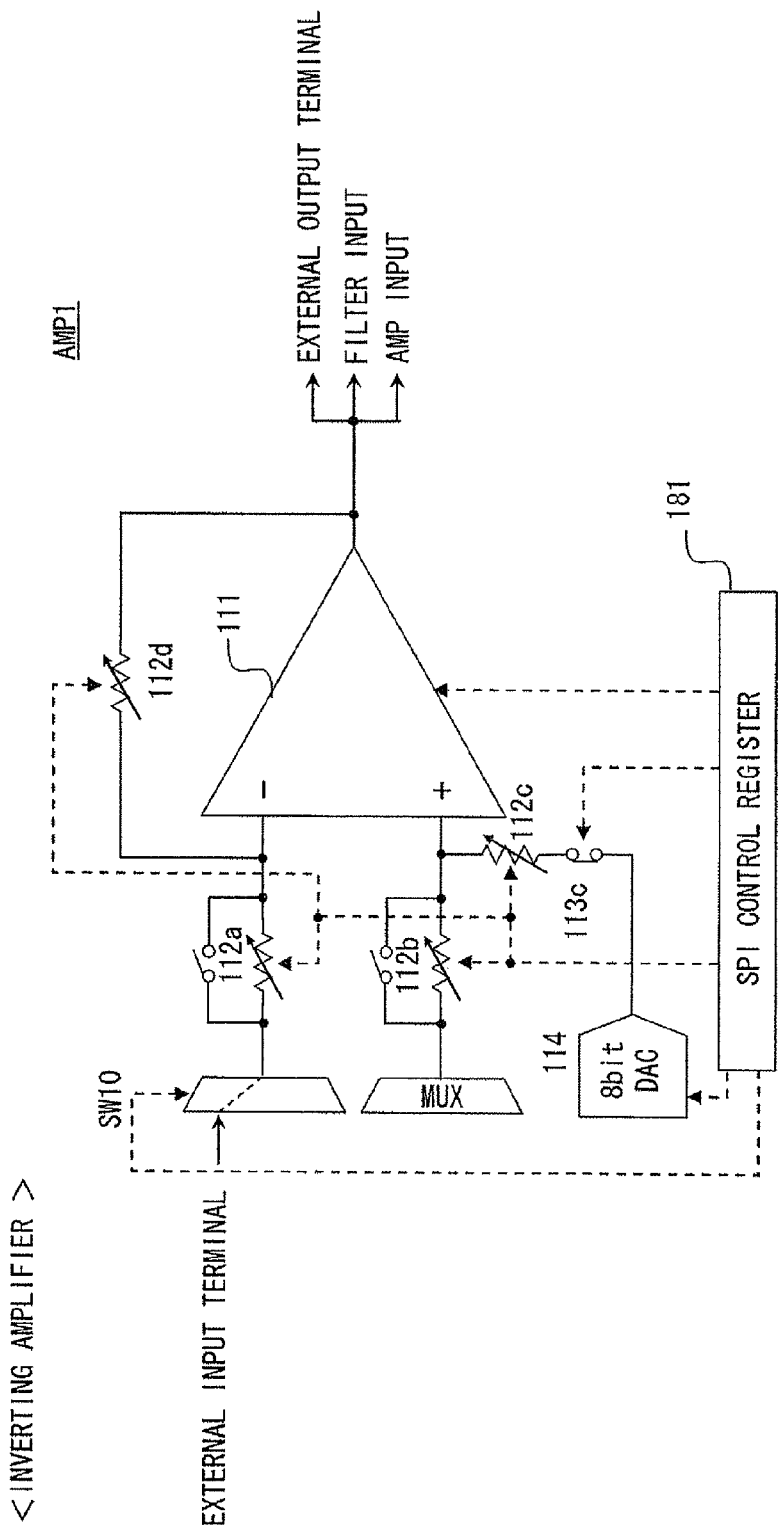
FIG. 12 is a circuit diagram showing an example of configuration change of the semiconductor device according to the first embodiment of the invention.

FIG. 12 shows an example of forming an inverting amplifier. According to the setting of the register, the multiplexer SW10 is switched to connect the external input terminal (MPXIN10) to the inverting input terminal, the switch 113c is turned on to connect the output of the DAC 114 to the non-inverting input terminal. In such connections, an inverting amplifier is formed. Further, by the setting of the register 181, the resistance values of the variable resistors 112a, 112c and 112d are changed to set the gain of the amplifier, and the output voltage of the DAC is changed to adjust the operating point and offset of the amplifier. When a signal of a voltage-type sensor is input from the external input terminal, the inverting amplifier outputs a voltage generated by inverting amplification of the input voltage.

Figure 13:
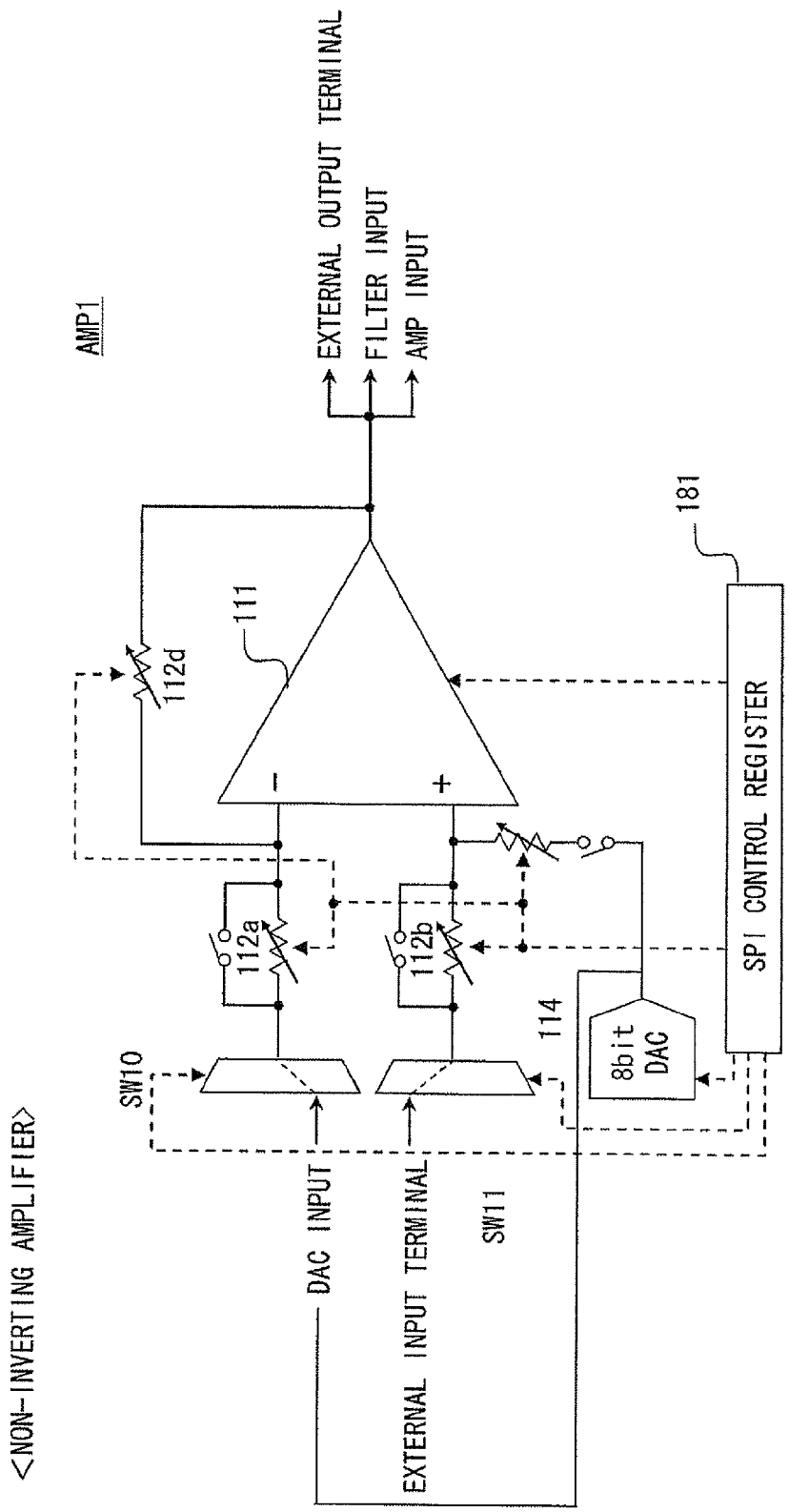
FIG. 13 is a circuit diagram showing an example of configuration change of the semiconductor device according to the first embodiment of the invention.

FIG. 13 shows an example of forming a non-inverting amplifier. According to the setting of the register, the multiplexer SW10 is switched to connect the output of the DAC 114 to the inverting input terminal, and the multiplexer SW11 is switched to connect the external input terminal (MPXIN20) to the non-inverting input terminal. In such connections, a non-inverting amplifier is formed. Further, by the setting of the register 181, the resistance values of the variable resistors 112a, 112b and 112d are changed to set the gain of the amplifier, and the output voltage of the DAC is changed to adjust the operating point and offset of the amplifier. When a signal of a voltage-type sensor is input from the external input terminal, the non-inverting amplifier outputs a voltage generated by non-inverting amplification of the input voltage (which is in-phase with the input).

Figure 14:
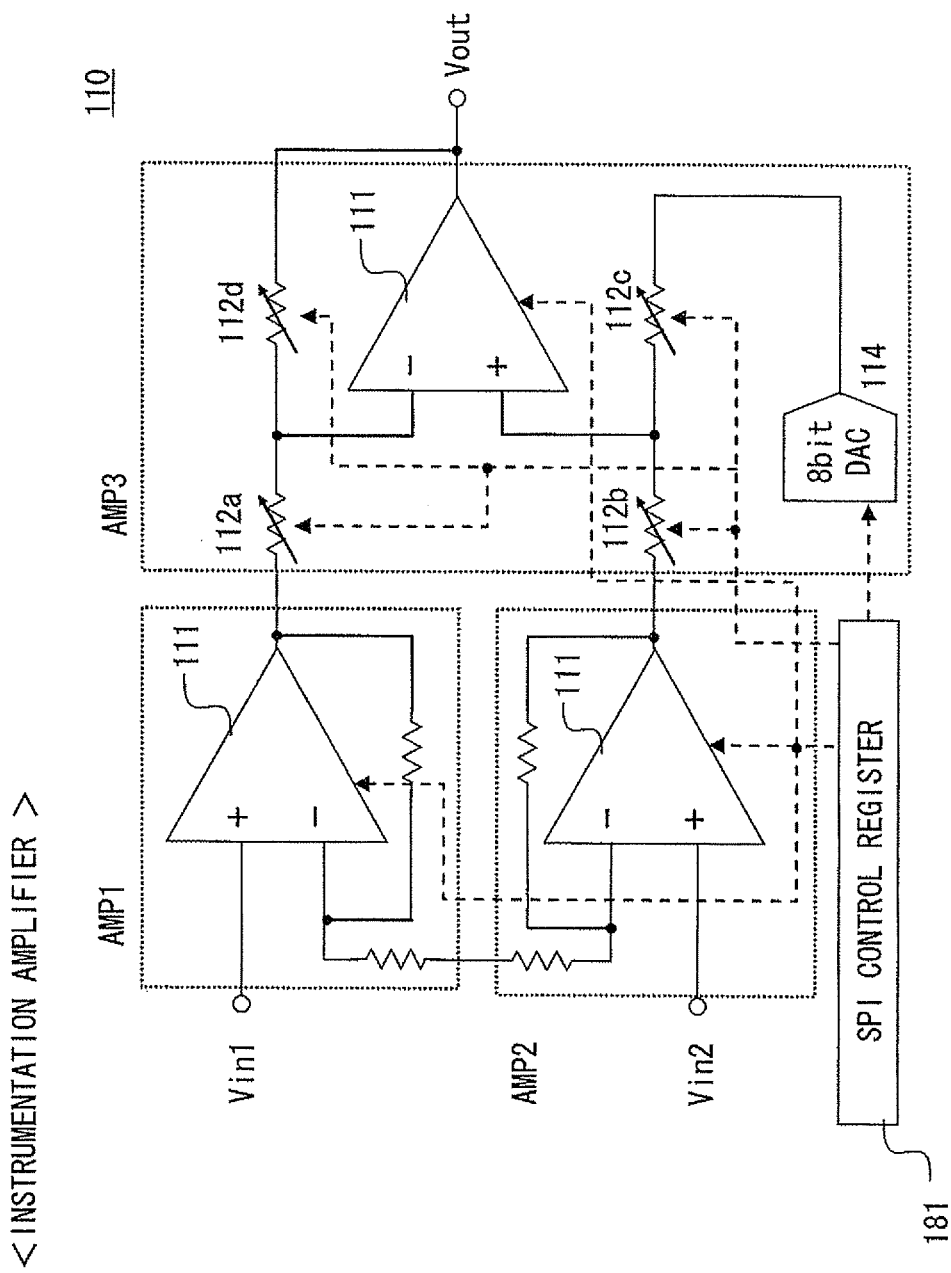
FIG. 14 is a circuit diagram showing an example of configuration change of the semiconductor device according to the first embodiment of the invention.

FIG. 14 shows an example of forming an instrumentation amplifier using the AMP1 to AMP3. As shown in FIG. 5, according to the setting of the register 181, the AMP1 to AMP3 are connected by the multiplexers (switches) SW10 and SW15, and thereby the instrumentation amplifier of FIG. 14 can be formed. Note that, although the switches are not illustrated, the switch 113b is turned on and the variable resistor 112b is short-circuited in the AMP1, the switch 113b is turned on and the variable resistor 112b is short-circuited in the AMP2, and the switch 113c is turned on and the DAC 114 is connected to the non-inverting input terminal in the AMP3.

Further, by the setting of the register 181, the resistance values of the variable resistors 112a and 112d of the AMP3 are changed to set the gain of the instrumentation amplifier, and the output voltage of the DAC 114 is changed to adjust the operating point and offset of the instrumentation amplifier. When a faint differential signal is input from the external input terminal, the instrumentation amplifier outputs a voltage generated by non-inverting amplification in the AMP1 and AMP2 and differential amplification in the AMP3 on the differential signal.

Specific circuit configurations of other circuits in the AFE unit 100 and the SPI interface are described hereinafter with reference to FIGS. 15 to 21.

Figure 15:
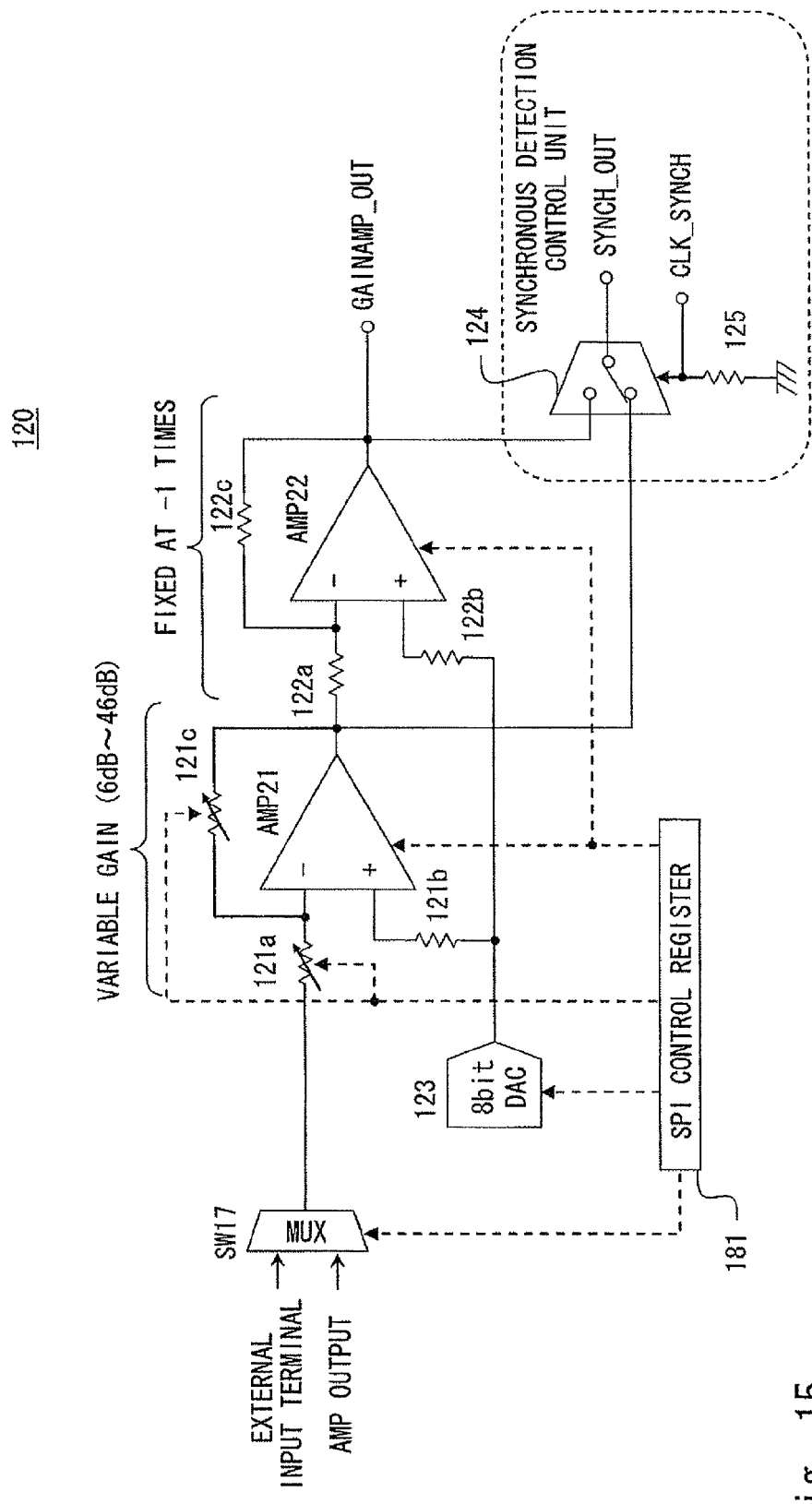
FIG. 15 is a circuit diagram showing a circuit configuration of the semiconductor device according to the first embodiment of the invention.

FIG. 15 shows a circuit configuration of the gain amplifier 120. The gain amplifier 120 supports the synchronous detection function and performs the amplification and synchronous detection of input signals. As a change in characteristics, the gain amplifier 120 can set the gain to be variable. For example, the gain can be set in units of 2 dB from 6 dB to 46 dB. Further, the power on/off can be switched by power-off mode.

As shown in FIG. 15, the gain amplifier 120 includes operational amplifiers AMP21 and AMP22 and further includes variable resistors 121a and 121c, fixed resistors 121b, 122a, 122b and 122c, and a DAC 123 that are connected to terminals of the operational amplifiers AMP21 and AMP22. Further, a multiplexer (switch) SW17 is connected to the variable resistor 121a as shown in FIG. 3. The gain amplifier 120 further includes a synchronous detection switch 124 and a fixed resistor 125 as a synchronous detection control unit for performing synchronous detection.

According to the set value of the register 181, the multiplexer SW17 is controlled to switch the input of the gain amplifier 120. Further, by changing the resistance values of the variable resistors 121a and 121c and the setting of the DAC 123 according to the set value of the register 181, the gain of the AMP21, the operating point and offset of the AMP21 and AMP22 and the like can be changed. Further, the power on/off of the operational amplifiers AMP21 and AMP22 can be controlled according to the set value of the register 181.

In the gain amplifier 120, when a signal is input from the AMP1 to AMP3 or the external input terminal, a signal generated by inverting amplification in the AMP21 and inverting amplification in the AMP22 is output to GAINAMP_OUT.

Further, a synchronous clock CLK_SYNCH is input from the MCU unit 200, the connection of the synchronous detection switch 124 is switched at the timing of the synchronous clock CLK_SYNCH, and the output signal of any of the AMP21 and the AMP22 is output to SYNCH_OUT.

Figure 16:
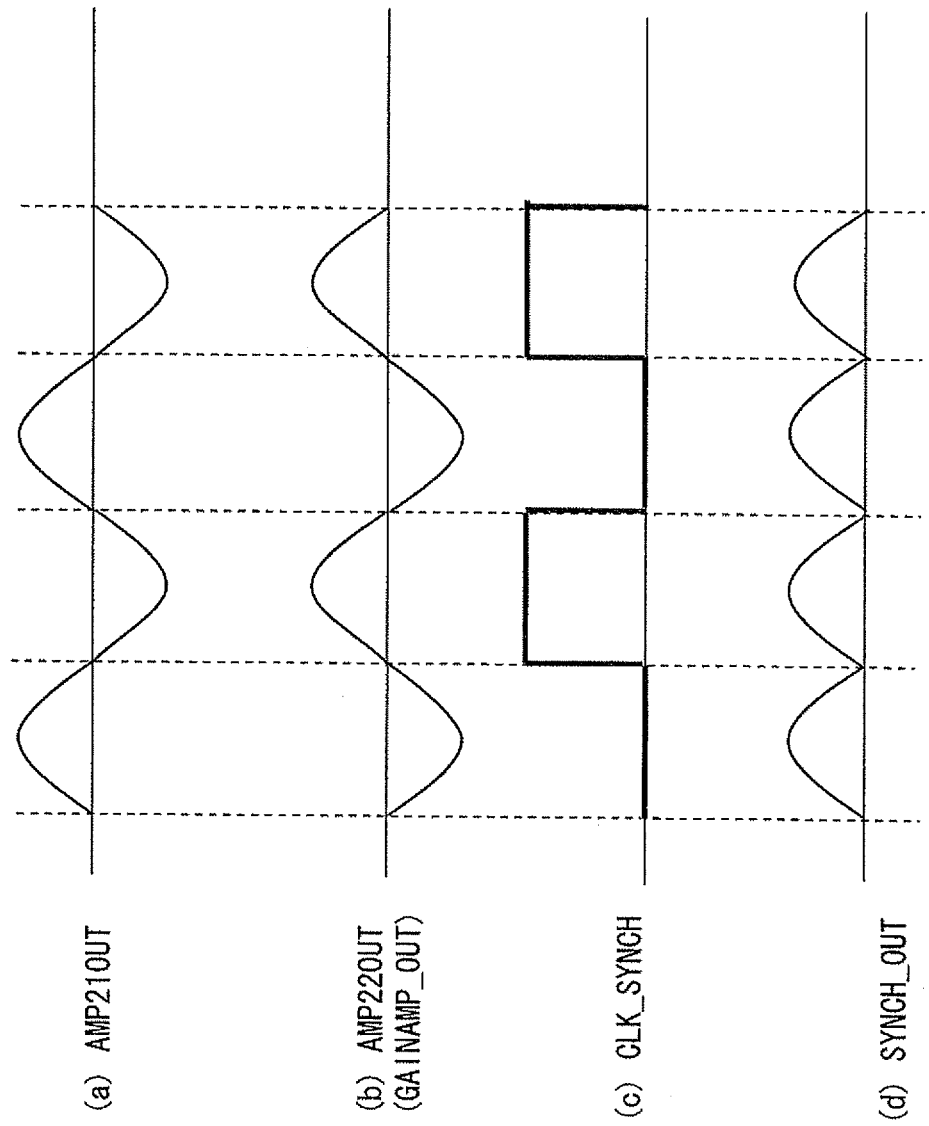
FIG. 16 is a timing chart showing operation of circuits in the semiconductor device according to the first embodiment of the invention.

FIG. 16 is a timing chart showing the output operation of the gain amplifier 120. As shown in part (a) of FIG. 16, the AMP21 outputs the inverting signal of the input signal and, as shown in part (b) of FIG. 16, the AMP22 outputs the further inverting signal. The output signal of the AMP22 is output as the output of the gain amplifier 120 to GAINAMP_OUT.

The MCU unit 200 is connected to GAINAMP_OUT and generates a clock according to a signal of GAINAMP_OUT. In this example, as shown in part (c) of FIG. 16, when GAINAMP_OUT is Higher level than a reference value, CLK_SYNCH at High level is generated. Then, the synchronous clock CLK_SYNCH is supplied to the gain amplifier 120.

The synchronous detection switch 124 switches over a connecting of SYNCH_OUT between the AMP21 and AMP22 according to CLK_SYNCK. When the clock CLK_SYNCK is at Low level, a connection is made to the AMP21 to output the output of the AMP21 to SYNCH_OUT, and when the clock CLK_SYNCK is at High level, a connection is made to the AMP22 to output the output of the AMP22 to SYNCH_OUT. Then, as shown in part (d) of FIG. 16, synchronous detection is made and a full-wave rectified signal is output from SYNCH_OUT.

Figure 17:
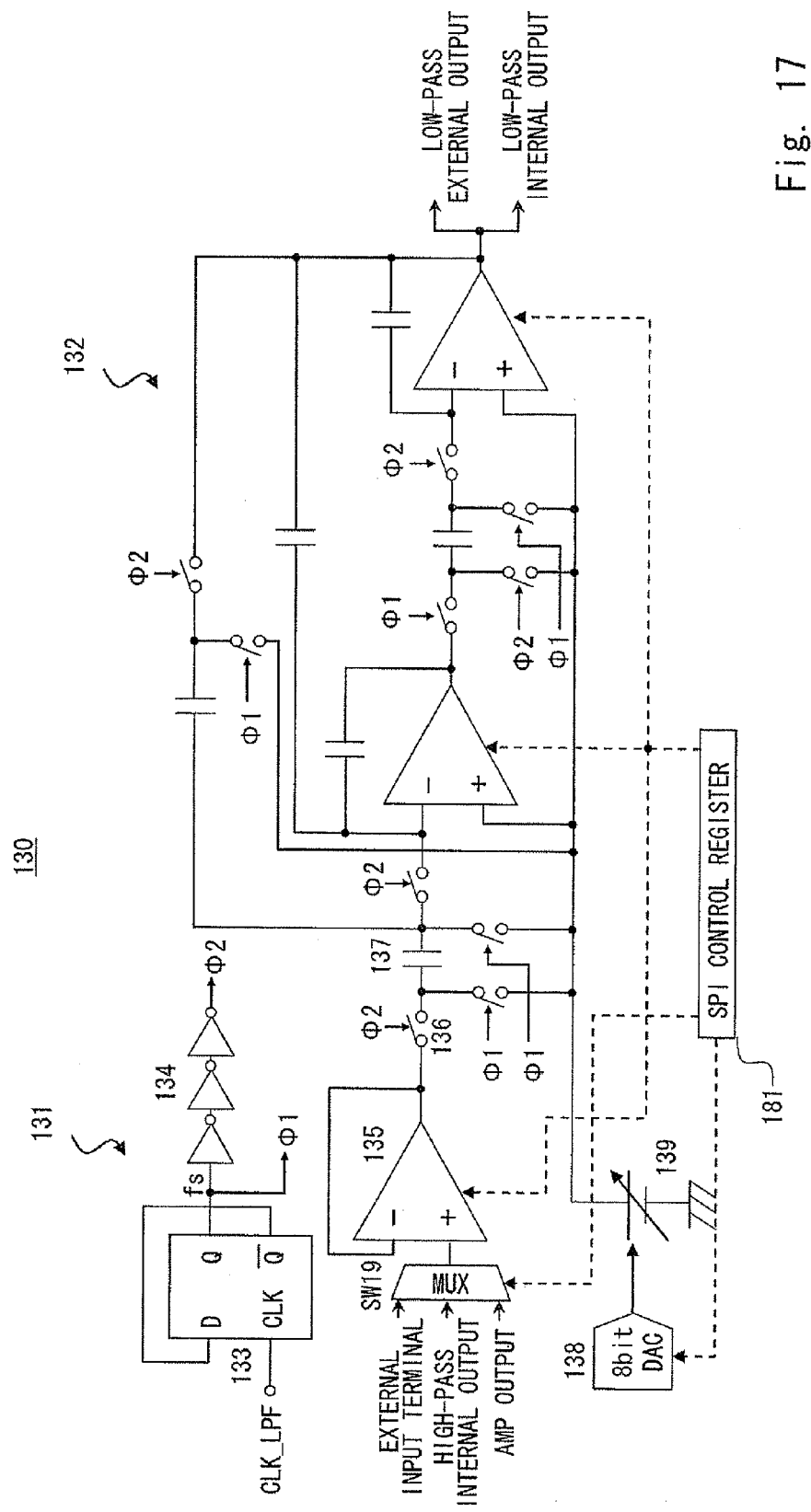
FIG. 17 is a circuit diagram showing a circuit configuration of the semiconductor device according to the first embodiment of the invention.

FIG. 17 shows a circuit configuration of the low-pass filter 130. The low-pass filter 130 is a SC (Switched Capacitor) low-pass filter with a variable cutoff frequency and used for filtering of an input signal.

The characteristics of the low-pass filter 130 are that a Q value is a fixed value, which is 0.702, for example. As a change in characteristics, the cutoff frequency fc can be set to be variable. For example, it can be set from 9 Hz to 900 Hz. Further, the power on/off can be switched by power-off mode.

As shown in FIG. 17, the low-pass filter 130 includes a switching signal generation unit 131 that generates a switching signal and a filtering unit 132 that filters an input signal according to the switching signal.

The switching signal generation unit 131 includes a flip-flop 133 and a plurality of inverters 134. The filtering unit 132 includes a plurality of operational amplifiers 135 and further includes a plurality of switches 136 connected to the plurality of operational amplifiers 135, a capacitor 137, and a variable power supply 139 that is controlled by a DAC 138. Further, a multiplexer (switch) SW19 is connected as shown in FIG. 3.

According to the set value of the register 181, the multiplexer SW19 is controlled to switch the input of the low-pass filter 130. Further, according to the set value of the register 181, the setting of the DAC 138 is changed to control the variable power supply 139 to thereby change the operating point, offset and the like of the amplifier. Further, according to the set value of the register 181, the on/off of the power supply of the low-pass filter 130 can be controlled.

In the low-pass filter 130, the clock CLK_LPF is input to the switching signal generation unit 131 from the outside, and switching signals Φ1 and Φ2 are generated by the flip-flop 133 and the inverters 134. In the filtering unit 132, when a signal is input from the external input terminal, the gain amplifier 120 or the like, the signal is output through three operational amplifiers 135 and, at that time, the switches 136 are turned on/off by the switching signals Φ1 and Φ2, and a connection of the capacitor 137 is switched. Consequently, a signal after removing higher frequency components than the cutoff frequency of the input signal is output.

The cutoff frequency can be changed by the clock CLK_LPF that is input from the outside by the MCU unit 200. To be specific, the cutoff frequency is fc=0.009×fs. In this formula, fs=(½)×f (f is the frequency of CLK_LPF).

Figure 18:
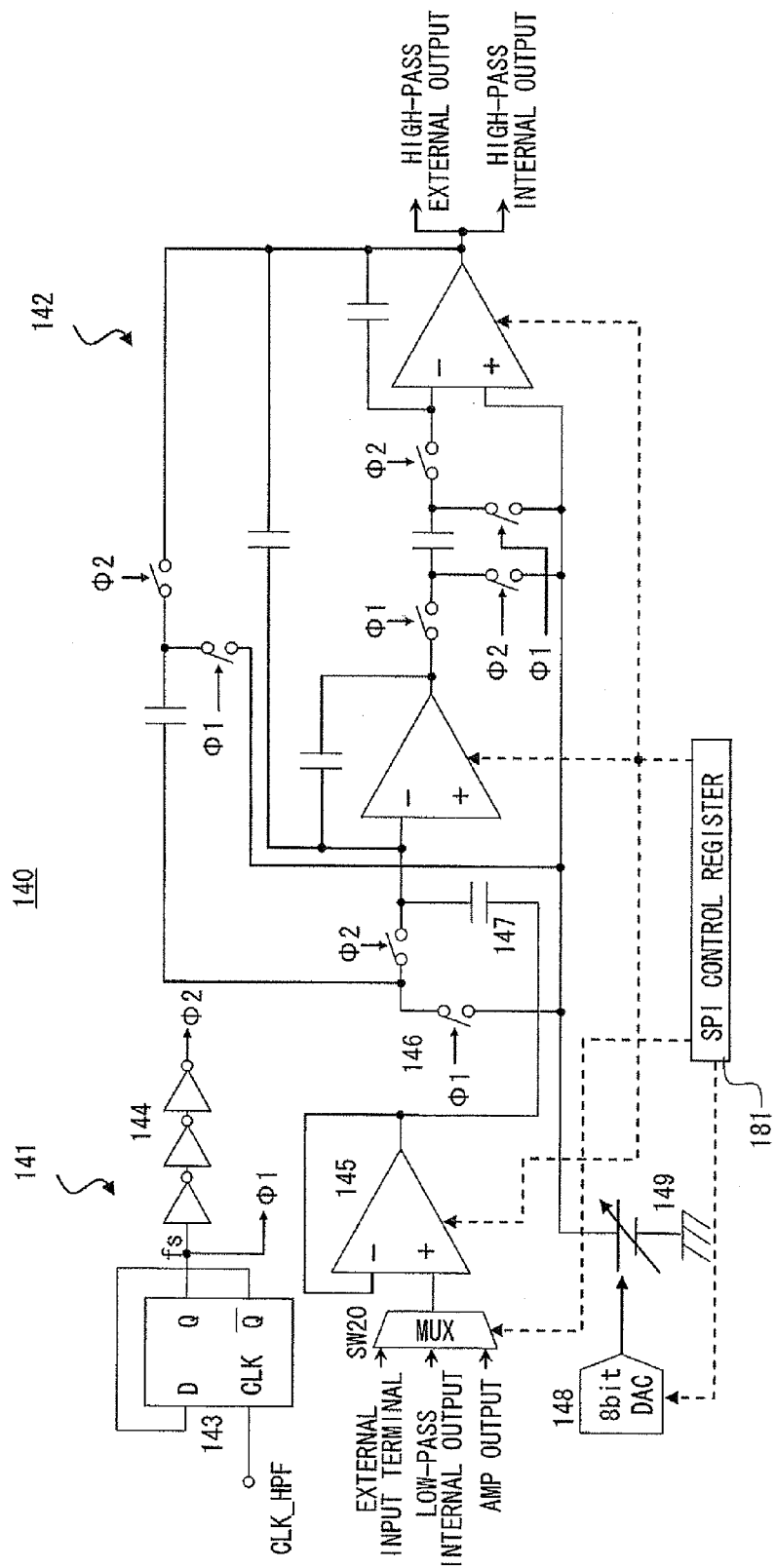
FIG. 18 is a circuit diagram showing a circuit configuration of the semiconductor device according to the first embodiment of the invention.

FIG. 18 shows a circuit configuration of the high-pass filter 140. The high-pass filter 140 is a SC high-pass filter with a variable cutoff frequency and used for filtering of an input signal.

The characteristics of the high-pass filter 140 are that a Q value is a fixed value, which is 0.702, for example. As a change in characteristics, the cutoff frequency fc can be set to be variable. For example, it can be set from 8 Hz to 800 Hz. Further, the power on/off can be switched by power-off mode.

As shown in FIG. 18, the high-pass filter 140 includes a switching signal generation unit 141 that generates a switching signal and a filtering unit 142 that filters an input signal according to the switching signal.

The switching signal generation unit 141 includes a flip-flop 143 and a plurality of inverters 144. The filtering unit 142 includes a plurality of operational amplifiers 145 and further includes a plurality of switches 146 connected to the plurality of operational amplifiers 145, a capacitor 147, and a variable power supply 149 that is controlled by a DAC 148. Further, a multiplexer (switch) SW20 is connected as shown in FIG. 3.

According to the set value of the register 181, the multiplexer SW20 is controlled to switch the input of the high-pass filter 140. Further, according to the set value of the register 181, the setting of the DAC 148 is changed to control the variable power supply 149 to thereby change the operating point, offset and the like of the amplifier. Further, according to the set value of the register 181, the on/off of the power supply of the high-pass filter 140 can be controlled.

In the high-pass filter 140, the clock CLK_HPF is input to the switching signal generation unit 141 from the outside, and switching signals $\Phi 1$ and $\Phi 2$ are generated by the flip-flop 143 and the inverters 144. In the filtering unit 142, when a signal is input from the external input terminal, the gain amplifier 120 or the like, the signal is output through three operational amplifiers 145 and, at that time, the switches 146 are turned on/off by the switching signals $\Phi 1$ and $\Phi 2$, and a connection of the capacitor 147 is switched. Consequently, a signal after removing lower frequency components than the cutoff frequency of the input signal is output.

The cutoff frequency can be changed by the clock CLK_HPF that is input from the outside by the MCU unit 200. To be specific, the cutoff frequency is fc=0.008×fs. In this formula, fs=(½)×f (f is the frequency of CLK_HPF).

Figure 19:
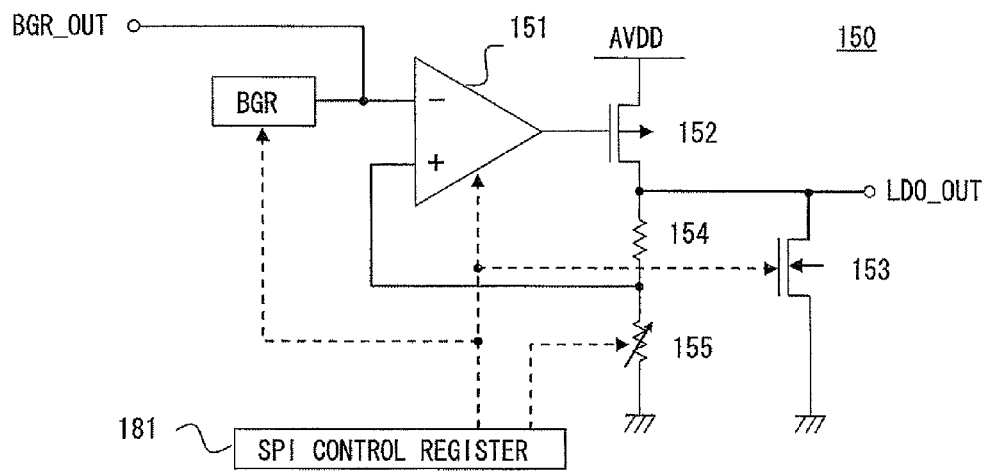
FIG. 19 is a circuit diagram showing a circuit configuration of the semiconductor device according to the first embodiment of the invention.

FIG. 19 shows a circuit configuration of the variable regulator 150. The variable regulator 150 is a regulator that makes the output voltage variable, and it is a reference power supply generation circuit of the A/D converter 260 of the MCU unit 200. As a change in characteristics, the variable regulator 150 can set the output voltage in units of 0.1V from 2.0V to 3.3V with an accuracy of ±5%. For example, as the characteristics of the variable regulator 150, the output current is 15 mA. Further, the variable regulator 150 can control on/off of the output power supply.

As shown in FIG. 19, the variable regulator 150 includes an operational amplifier 151 and further includes a band gap reference BGR that is connected to the input side of the operational amplifier 151, and transistors 152 and 153, a fixed resistor 154, and a variable resistor 155 that are connected to the output side of the operational amplifier 151.

According to the set value of the register 181, the voltage of the BGR is set, and the output voltage can be changed by changing resistance value of the variable resistor 155. Further, according to the set value of the register 181, the power on/off of the operational amplifier 151 and the on/off of the transistor 153 are switched, and the start and stop of output of the output voltage are controlled.

In the variable regulator 150, the voltage of the BGR is output from BGR_OUT. The operational amplifier 151 operates in accordance with the voltage of the BGR and the voltage of the variable resistor 155 to control the transistor 152, and the voltage corresponding to the ratio of the fixed resistor 154 and the variable resistor 155 is output.

Figure 20:
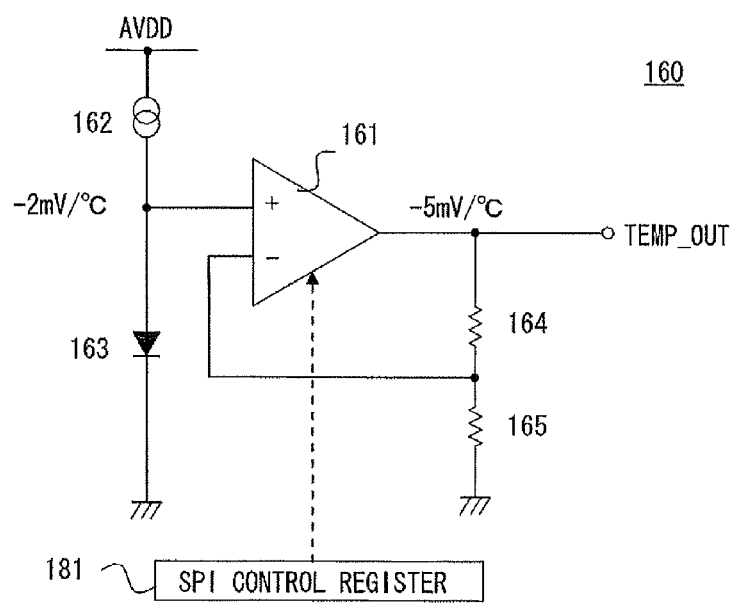
FIG. 20 is a circuit diagram showing a circuit configuration of the semiconductor device according to the first embodiment of the invention.

FIG. 20 shows a circuit configuration of the temperature sensor 160. The temperature sensor 160 is a sensor that measures the temperature of the semiconductor device 1, and it can be used for the MCU unit 200 to make correction of the temperature characteristics or the like based on the measurement result. For example, as the characteristics of the temperature sensor 160, the output temperature coefficient is −5 mV/° C. Further, the power on/off can be switched by power-off mode.

As shown in FIG. 20, the temperature sensor 160 includes an operational amplifier 161 and further includes a current source 162 and a diode 163 that are connected to the input side of the operational amplifier 161, and fixed resistors 164 and 165 that are connected to the output side of the operational amplifier 161. The power supply of the operational amplifier 161 can be turned on/off according to the set value of the register 181.

In the temperature sensor 160, the voltage of the diode 163 changes at −2 mV/° C. according to the temperature, and the operational amplifier 161 makes non-inverting amplification of the voltage and outputs it as −5 mV/° C.

Figure 21:
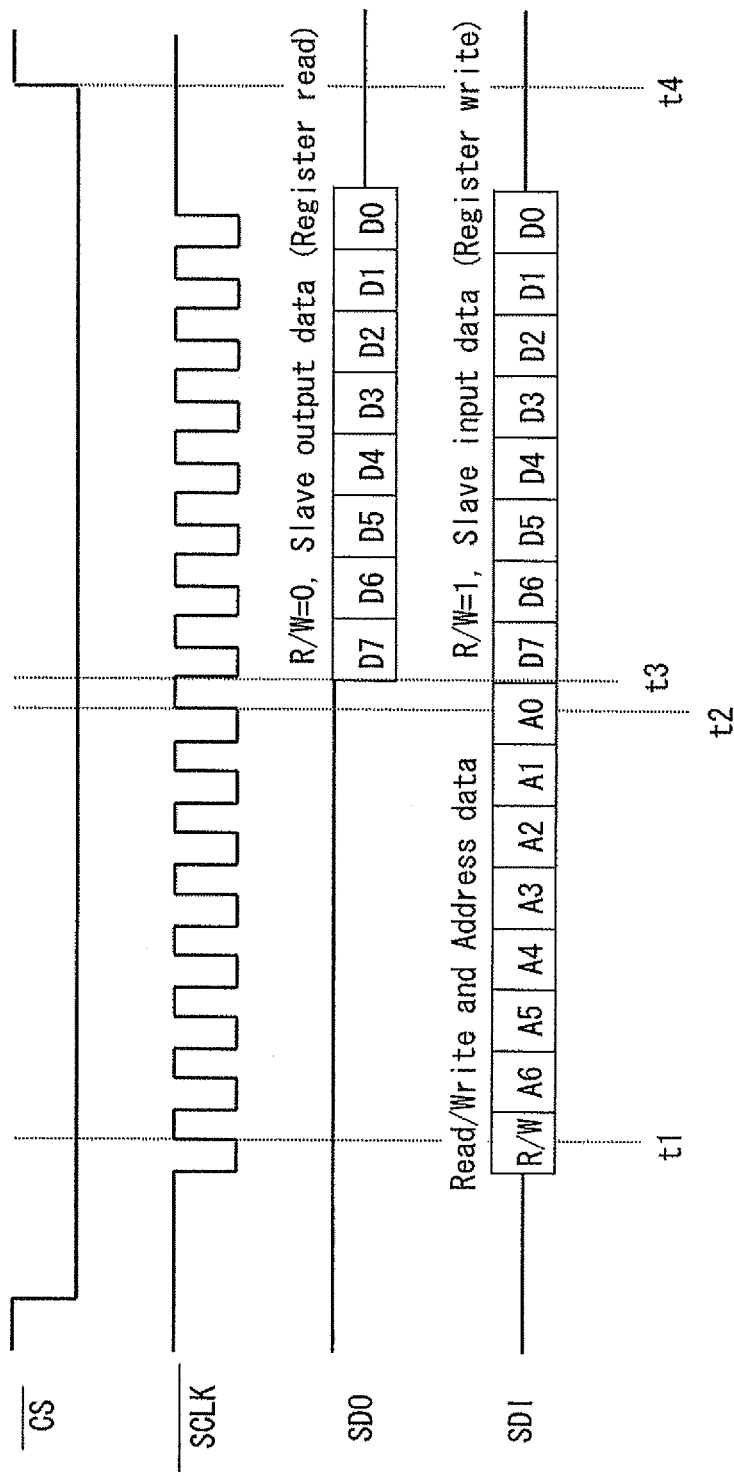
FIG. 21 is a timing chart showing communication timing of the semiconductor device according to the first embodiment of the invention.

FIG. 21 shows a communication timing of the SPI interface 180. The SPI interface 180 is an interface between the MCU unit 200 and the AFE unit 100 and performs setting of the AFE unit 100, which is writing and reading of the register 181. In this example, the SPI clock frequency is 10 MHz, the amount of communication data is 16 bits, and the direction of communication is MSB.

As shown in FIG. 21, a chip select CS (inverting signal), a serial clock SCLK (inverting signal), and serial data input SDI are input from the MCU unit 200 to the AFE unit 100, and serial data output SDO is output from the AFE unit 100 to the MCU unit 200.

The chip select CS becomes Low level, and each bit is input/output in synchronization with the serial clock SCLK. The MCU unit 200 sets a bit indicating reading/writing of the register 181 to R/W, and sets the address of the register 181 to be read/written to A1 to A6.

When R/W is writing, the MCU unit 200 sets data to be written into the register 181 to D0 to D7. When R/W is reading, the AFE unit 100 sets data read from the register 181 to D0 to D7.

When R/W and A1 to A6 are input at SDI, the AFE unit 100 samples the data in timing (t1) at the rising edge of the clock SCLK, and latches R/W and address in timing (t2) of A0. After A0, the transmission data is set with one bit shift in timing (t3) at the falling edge of the clock SCLK of D7 to D0. Further, it latches the data in timing (t4) of the chip select CS.

As described above, the semiconductor device 1 according to this embodiment can set the circuit configuration and characteristics of the AFE unit 100 inside the semiconductor device 1 to be variable. Therefore, one semiconductor allows connection with various sensors and thus can be used for many application systems (applications).

For example, when the circuit configuration of the configurable amplifier 110 is set as a non-inverting amplifier, it allows connection with a voltage output sensor and thus can be used for an application system using an infrared sensor, a temperature sensor, a magnetic sensor or the like. As an example, it can be used for a digital camera with an infrared sensor, a printer with a temperature sensor, a tablet terminal with a magnetic sensor, an air conditioner with an infrared sensor and the like.

Further, when the circuit configuration of the configurable amplifier 110 is set as an instrumentation amplifier, it allows connection with a faint differential output and thus can be used for an application system using a pressure sensor, a gyro sensor, a shock sensor or the like. As an example, it can be used for a blood-pressure meter with a pressure sensor, a scale with a pressure sensor, a mobile phone with a gyro sensor, a liquid crystal television with a shock sensor and the like.

Further, when the circuit configuration of the configurable amplifier 110 is set as an I/V amplifier, it allows connection with a current output sensor and thus can be used for an application system using a photodiode, a presence sensor, an infrared sensor or the like. As an example, it can be used for a digital camera with a photodiode, a monitoring camera with a presence sensor, a toilet seat with a presence sensor, a barcode reader with an infrared sensor and the like.

Figure 22:
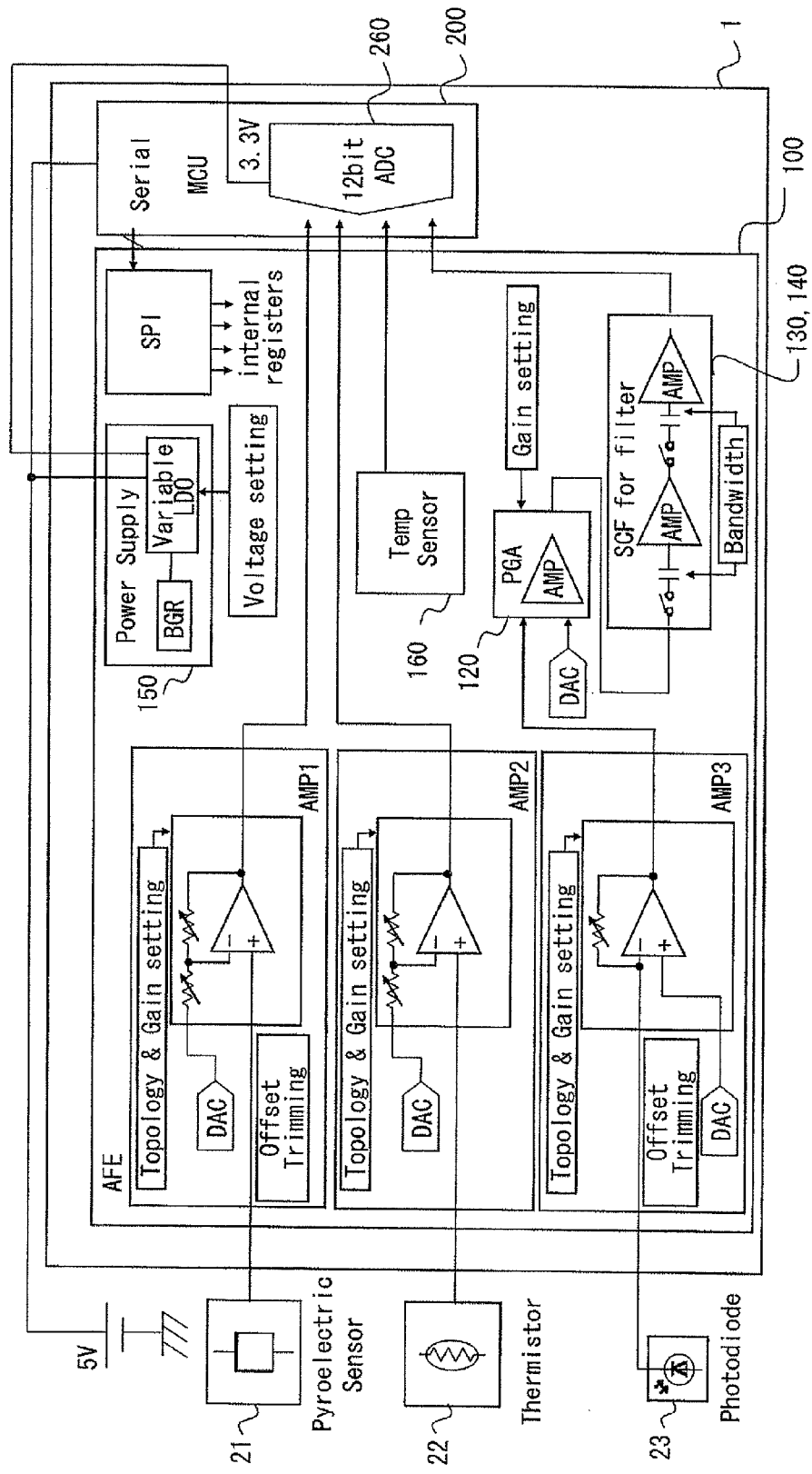
FIG. 22 is a system configuration diagram showing an application example of the semiconductor device according to the first embodiment of the invention.

An example of a system in which sensors are connected to the semiconductor device 1 is described hereinafter with reference to FIGS. 22 to 24. FIG. 22 is an example in which three types of sensors are connected to the semiconductor device 1. In this example, the configurable amplifier 110 is set as 3ch separate amplifiers AMP1 to AMP3 independent of one another, and different sensors are connected to the respective amplifiers.

A pyroelectric sensor 21 (infrared sensor) 21 is connected to the AMP1. Thus, the AMP1 is set to the configuration and characteristics suitable for the pyroelectric sensor 21. The circuit configuration of the AMP1 is set as a non-inverting amplifier, and its input is connected to the external input terminal to which the pyroelectric sensor 21 is connected, and its output is connected to the external input terminal to which the MCU unit 200 is connected. Further, the gain, offset and the like are set in accordance with the pyroelectric sensor 21. The output signal of the pyroelectric sensor 21 is thereby non-inverting amplified by the AMP1 and output to the MCU unit 200, and then A/D converted by the A/D converter 260 of the MCU unit 200, and processing according to the detection of the pyroelectric sensor 21 is executed.

A thermistor (temperature sensor) 22 is connected to the AMP2. Thus, the AMP2 is set to the configuration and characteristics suitable for the thermistor 22. The circuit configuration of the AMP2 is set as a non-inverting amplifier, and its input is connected to the external input terminal to which the thermistor 22 is connected, and its output is connected to the external input terminal to which the MCU unit 200 is connected. Further, the gain, offset and the like are set in accordance with the thermistor 22. The output signal of the thermistor 22 is thereby non-inverting amplified by the AMP2 and output to the MCU unit 200, and then A/D converted by the A/D converter 260 of the MCU unit 200, and processing according to the detection of the thermistor 22 is executed.

A photodiode 23 is connected to the AMP3. Thus, the AMP3 is set to the configuration and characteristics suitable for the photodiode 23. The circuit configuration of the AMP3 is set as a non-inverting amplifier, and its input is connected to the external input terminal to which the photodiode 23 is connected. The output of the AMP3 is connected to the input of the gain amplifier 120, and the output of the gain amplifier 120 is connected to the input of the filters (including the low-pass filter 130 and the high-pass filter 140), and the output of the filter is connected to the external input terminal to which the MCU unit 200 is connected. Further, the gain and offset of the AMP3, the gain of the gain amplifier 120, and the cutoff frequency of the filters (130 and 140) are set in accordance with the photodiode 23. The output signal of the photodiode 23 is thereby non-inverting amplified by the AMP3 and further amplified by the gain amplifier 120, and then noise is removed by the filters (130 and 140), and the signal is output to the MCU unit 200. In the MCU unit 200, the signal is A/D converted by the A/D converter 260, and processing according to the detection of the photodiode 23 is executed.

Note that the output of the temperature sensor 160 is connected to the A/D converter 260 of the MCU unit 200, and the output voltage (3.3V) of the variable regulator 150 is supplied to the A/D converter 260.

Figure 23:
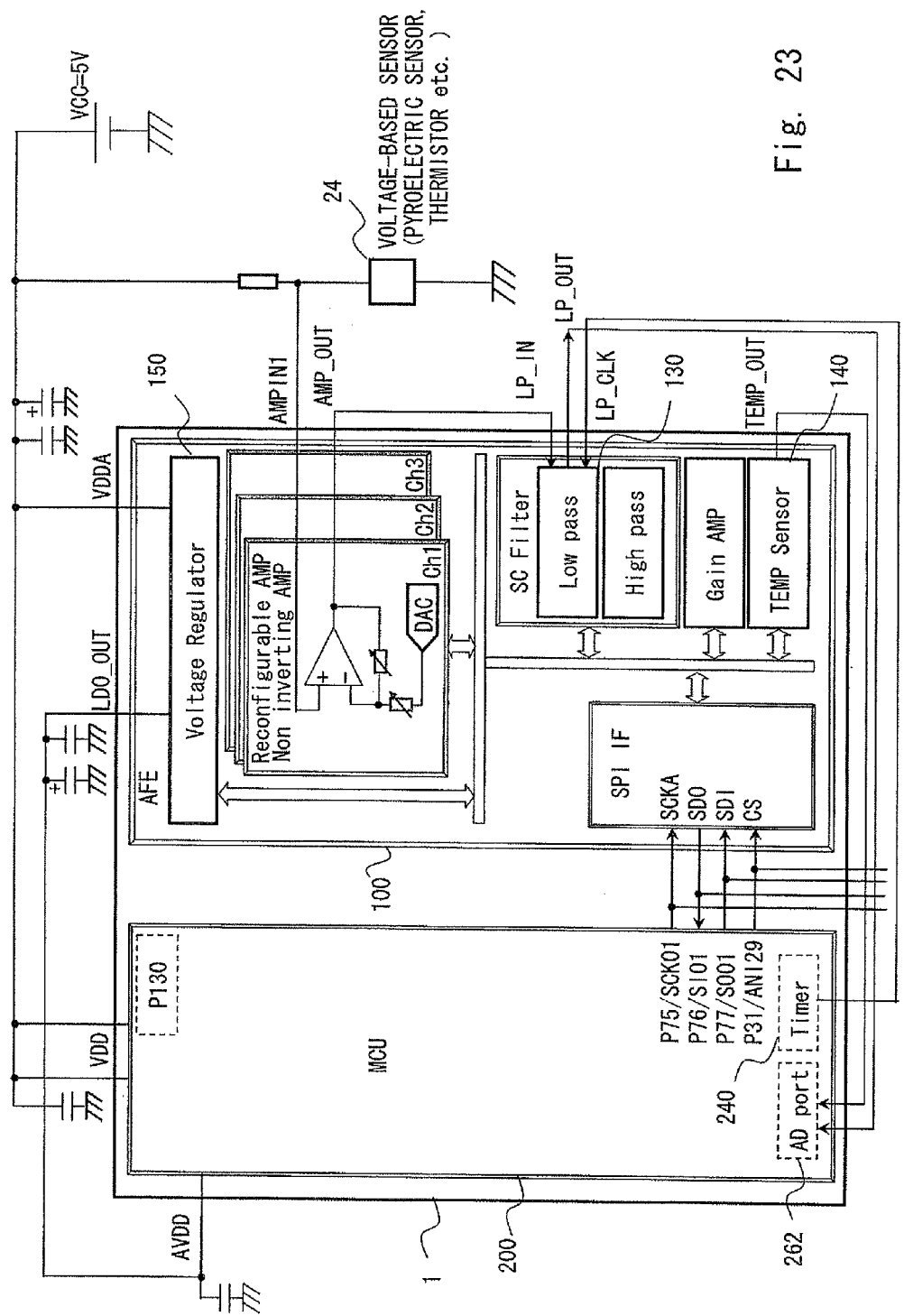
FIG. 23 is a system configuration diagram showing an application example of the semiconductor device according to the first embodiment of the invention.

FIG. 23 is an example of connecting a voltage-type sensor 24 such as a pyroelectric sensor or a thermistor to the semiconductor device 1. This is applicable to an application system such as a digital camera, a printer, a tablet terminal or air conditioner having the voltage-type sensor 24, for example.

In the configurable amplifier 110 which is set as 3ch separate amplifiers independent of one another, AMP1 is used. To process the output signal of the voltage-type sensor 24, the circuit configuration of the AMP1 is set as a non-inverting amplifier. In this example, the output signal of the voltage-type sensor 24 is amplified by the AMP1, transmitted through the low-pass filter 130, and A/D converted by the MCU unit 200.

Thus, the input of the AMP1 is connected to the external input terminal to which the voltage-type sensor 24 is connected, and the output of the AMP1 is connected to the input of the low-pass filter 130. In this example, the output of the AMP1 and the input of the low-pass filter 130 are connected through the external terminal. The output of the low-pass filter 130 is connected to an AD port 262 (input port of the A/D converter) of the MCU unit 200. The clock of the low-pass filter 130 is supplied by the timer 240 of the MCU unit 200.

By setting the cutoff frequency of the low-pass filter 130 and setting the gain, offset and the like of the AMP1 in accordance with the characteristics of the voltage-type sensor 24, a circuit most suitable for the voltage-type sensor 24 can be formed.

Note that the output of the temperature sensor 160 is connected to the AD port 262 of the MCU unit 200. The VCC power supply is supplied to the MCU unit 200 and the AFE unit 100, and the output of the variable regulator 150 is connected to the power supply input of the A/D converter 260.

Figure 24:
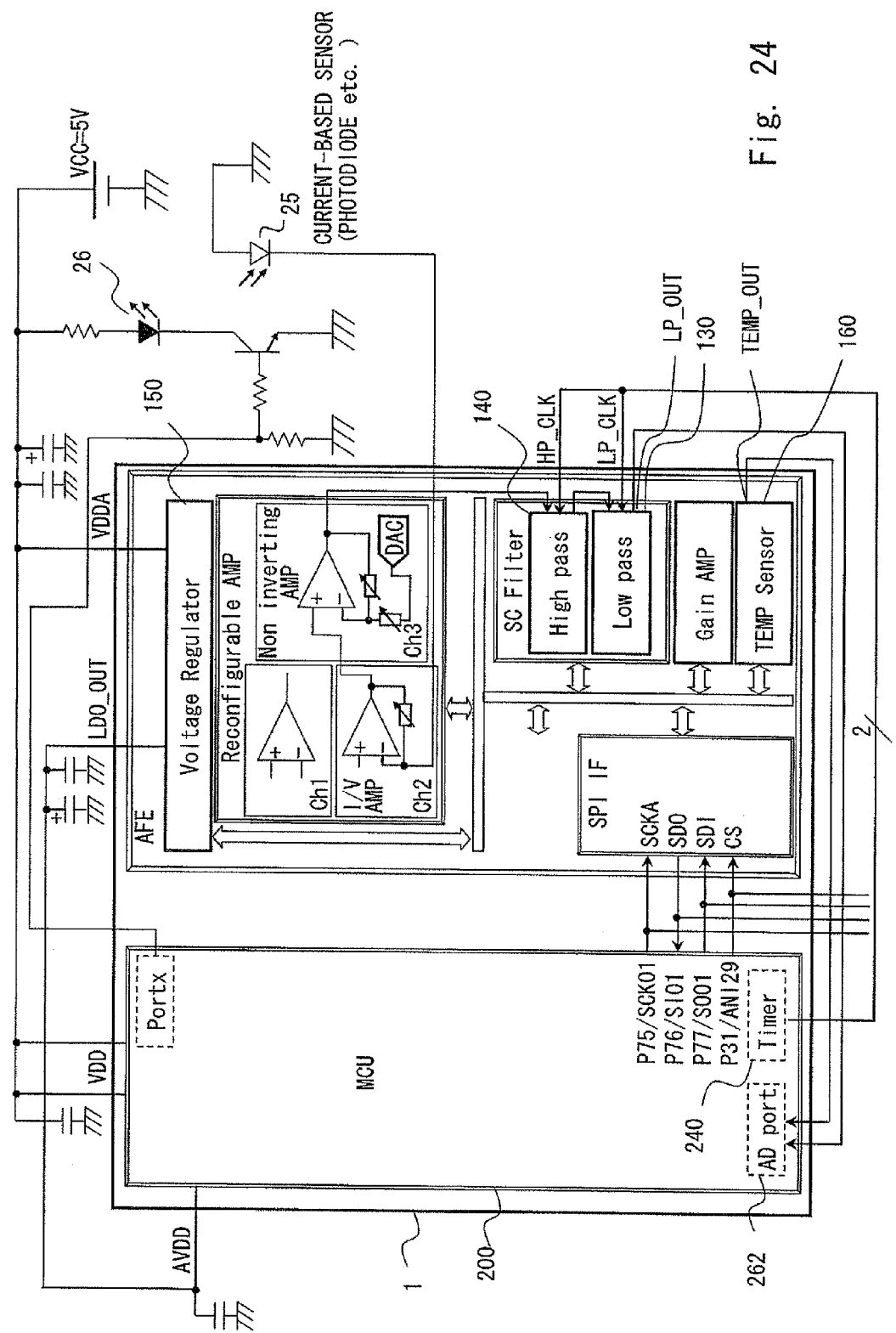
FIG. 24 is a system configuration diagram showing an application example of the semiconductor device according to the first embodiment of the invention.

FIG. 24 is an example of connecting a current-type sensor 25 such as a photodiode to the semiconductor device 1. This is applicable to an application system such as a fire alarm, a surveillance camera, a toilet seat or a barcode reader having the current-type sensor, for example.

In the configurable amplifier 110 which is set as 3ch separate amplifiers independent of one another, AMP2 and AMP3 are used. To process the output signal of the current-type sensor 25, the circuit configuration of the AMP1 is set as an I/V amplifier, and the circuit configuration of the AMP3 is set as a non-inverting amplifier. In this manner, two amplifiers among the AMP1 to AMP3 may be arbitrarily connected.

In this example, the output signal of the current-type sensor 25 is amplified by the AMP2 and AMP3, transmitted through the high-pass filter 140 and the low-pass filter 130, and then A/D converted by the MCU unit 200.

Thus, the input of the AMP2 is connected to the external input terminal to which the current-type sensor 25 is connected, the output of the AMP2 is connected to the input of the AMP3, and the output of AMP3 is connected to the input of the high-pass filter 140. Further, the output of the high-pass filter 140 is connected to the input of the low-pass filter 130, and the output of the low-pass filter 130 is connected to the AD port 262 of the MCU unit 200. The clock of the high-pass filter 140 and the low-pass filter 130 is supplied by the timer 240 of the MCU unit 200.

By setting the gain, offset and the like of the AMP2 and AMP3 and setting the cutoff frequency of the high-pass filter 140 and the low-pass filter 130 in accordance with the characteristics of the current-type sensor 25, a circuit most suitable for the current-type sensor 25 can be formed.

Note that the temperature sensor 160 and the variable regulator 150 are connected to the MCU unit 200 in the same manner as shown in FIG. 23.

In the example of FIG. 24, a light emitting diode 26 is connected to the MCU unit 200, and the light emitting diode 26 emits light under control of the MCU unit 200. Then, the light that is output from the light emitting diode 26 is detected by the current-type sensor 25, and a signal in accordance with the detection is processed by the AFE unit 100 and the MCU unit 200.

Next, the configuration of the MCU unit 200 in the semiconductor device 1 according to this embodiment is described. In this embodiment, the configuration and characteristics of the AFE unit 100 are set and changed by control from the MCU unit 200 as described above. In the MCU unit 200, the CPU core 210 executes a program stored in the memory 220, thereby implementing the control to make configuration change (configuration setting) of the AFE unit 100.

Figure 25:
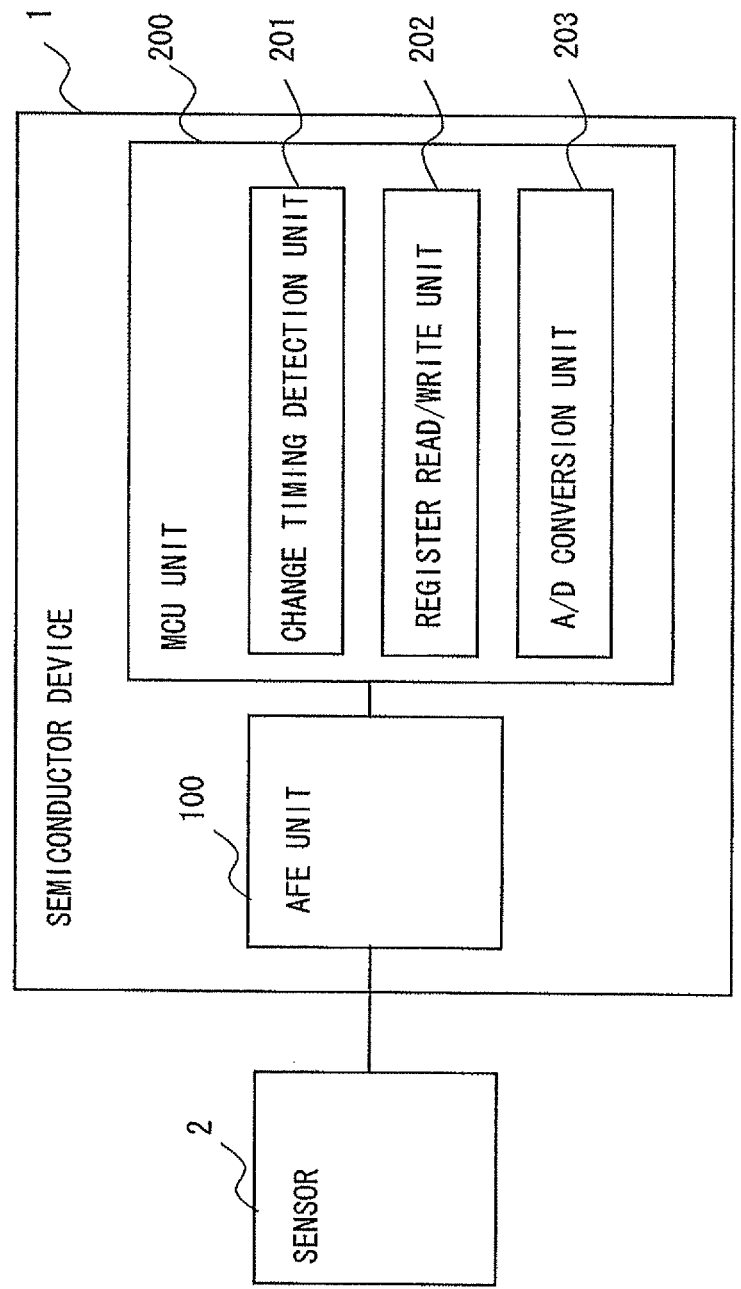
FIG. 25 is a functional block diagram of the semiconductor device according to the first embodiment of the invention.

FIG. 25 shows an example of the functional configuration of the MCU unit 200 to make configuration change of the AFE unit 100. As shown in FIG. 25, the MCU unit 200 includes a change timing detection unit 201, a register read/write unit (configuration setting unit) 202, and an A/D conversion unit 203. The change timing detection unit 201 and the register read/write unit 202 are implemented by execution of a program on the CPU core 210, and the A/D conversion unit 203 is implemented by the A/D converter 260, for example.

The change (setting) timing detection unit 201 notifies the timing to change the setting of the configuration and characteristics of the AFE unit 100 to the register read/write unit 202. As the timing of change, an instruction from a computer device outside the semiconductor device, the timer 240 of the MCU unit 200, a signal from the AFE unit 100 or the like can be used. Further, when setting information of the register 181 is already written into the memory 220, the timing of initialization at the startup of the semiconductor device 1 is the timing of setting.

The register read/write unit (setting unit) 202 performs writing of configuration information into the register 181 of the AFE unit 100 in accordance with the detection of the change timing detection unit 201 and thereby changes the configuration and characteristics of the AFE unit 100. The configuration information (setting information) to be written may be information that is input from an external computer device, information that is prestored in the memory 220 by the MCU unit 200, or information that is generated by execution of a program on the CPU core 210.

The register read/write unit 202 further performs reading of information from the register 181 of the AFE unit 100 in accordance with an instruction from an external computer device. Note that the register read/write unit 202 performs writing/reading by designating the address of the register 181 to the AFE unit 100 as described above.

The A/D conversion unit 203 converts an analog signal that is output from the AFE unit 100 into a digital signal. Further, the A/D conversion unit 203 switches on and off of A/D conversion operation according to the operation of the register read/write unit 202.

In this configuration, the configuration and characteristics of the AFE unit 100 can be switched from the MCU unit 200 during operation of the semiconductor device 1.

For example, in a fire alarm, an automatic faucet device and the like, the gain of the amplifier may be set high in June or with the lapse of each year. Even when the sensitivity of the sensor decreases due to dust or aged deterioration, it is possible to maintain the sensitivity of the sensor at a constant level by increasing the gain on a regular basis, which allows the device to operate normally for a long term.

Further, the power-off mode of the AFE unit 100 can be controlled in accordance with the operating time. For example, the power on/off of each circuit in the AFE unit 100 can be switched at specified intervals for intermittent operation, and a circuit to operate intermittently can be selected freely. This reduces the power consumption of the semiconductor device 1

Furthermore, the characteristics of the sensor 2 that is connected to the semiconductor device 1 may be detected, and the configuration and characteristics of the AFE unit 100 may be changed automatically in accordance with the characteristics of the sensor 2. For example, it is possible to perform trimming to absorb variations in accordance with variations in the characteristics of the sensor 2

Figure 26:
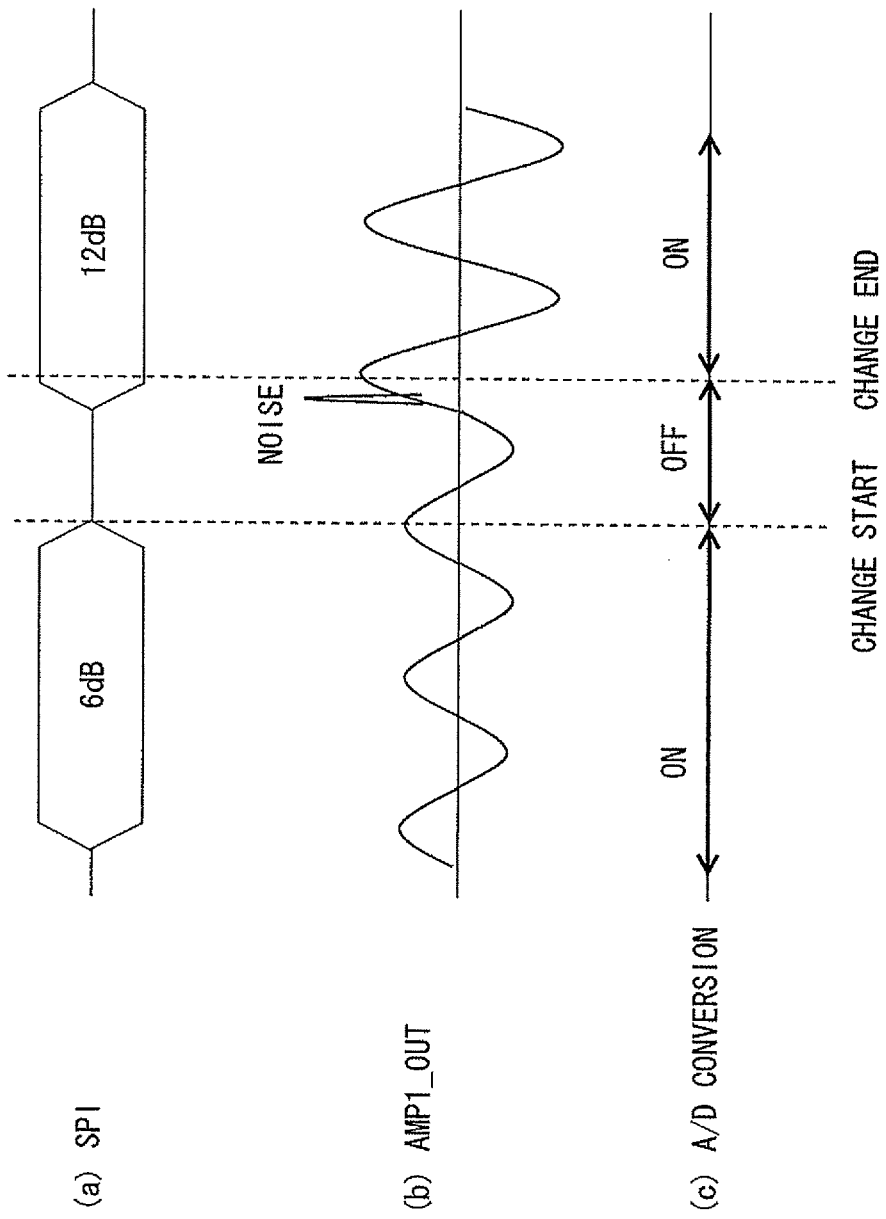
FIG. 26 is a timing chart showing operation of the semiconductor device according to the first embodiment of the invention.

Because the configuration and characteristics of circuits are changed during the operation of the AFE unit 100 under control of the MCU unit 200, noise can occur in the output signal of the AFE unit 100. FIG. 26 shows an example of the output signal of the AFE unit 100 at the time of configuration change.

As shown in part (a) of FIG. 26, the register 181 of the AFE unit 100 is rewritten from the MCU unit 200 through the SPI interface so that the gain of the AMP1 is switched from 6 dB to 12 dB. Then, as shown in part (b) of FIG. 26, the resistance value of the variable resistor shown in FIG. 8 is changed at the time of switching the gain, which causes noise to occur in the output signal that is output from the operational amplifier of the AMP1.

With this view, in the embodiment, on/off of the A/D conversion unit 203 is switched as shown in part (c) of FIG. 26. First, during operation at 6 dB, the A/D conversion unit 203 is on. When the change timing detection unit 201 detects the timing of configuration change and thereby the register read/write unit 202 starts writing into the register 181 of the AFE unit 100, the A/D conversion unit 203 is turned off to stop A/D conversion. Then, when the writing into the register 181 ends, the A/D conversion unit 203 is turned on to start A/D conversion. By such control, noise that occurs upon configuration change is not A/D converted, thereby preventing malfunction due to noise.

Note that noise of the amplifier may be removed by methods other than turning on/off of A/D conversion. For example, at the time of configuration change, noise may be filtered by connecting the amplifier and the filter. Further, the connection with the MCU unit 200 may be temporarily disabled by switching a switch to select the output destination of the amplifier.

In the semiconductor device 1 according to the embodiment described above, it is necessary to determine the configuration and characteristics of the AFE unit 100 in accordance with a sensor to be connected, and therefore the evaluation of a register set value is made using the semiconductor device 1 in the design development of the semiconductor device 1 (sensor system) suitable for the sensor. The setting evaluation performed in the development process of the semiconductor device 1 is described hereinafter.

Figure 27:
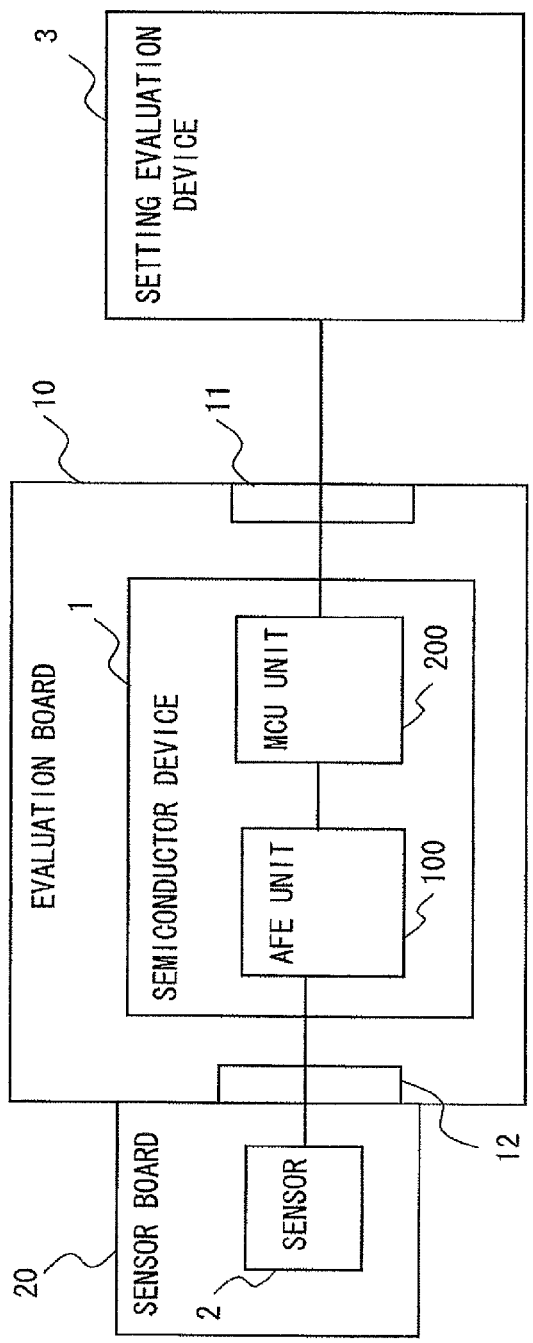
FIG. 27 is a configuration diagram of a setting evaluation system including the semiconductor device according to the first embodiment of the invention.

FIG. 27 shows the configuration of a setting evaluation system (development support system) of the semiconductor device 1 according to this embodiment. As shown in FIG. 27, the setting evaluation system includes a setting evaluation device 3, an evaluation board 10 on which the semiconductor device 1 is mounted, and a sensor board 20 on which the sensor 2 is mounted.

The evaluation board 10 includes an USB interface 11 and a sensor interface 12. The setting evaluation device 3 is connected with the USB interface 11 through a USB cable so that input and output can be performed between the setting evaluation device 3 and the semiconductor device 1 via the USB interface 11. The sensor board 20 is connected with the sensor interface 12 so that input and output can be performed between the sensor 2 and the semiconductor device 1 via the sensor interface 12.

The setting evaluation device (development support system) 3 sets the register 181 of the AFE unit 100 to the semiconductor device 1 by using GUI, which is described later. The semiconductor device 1 rewrites the register 181 according to an instruction of the setting evaluation device 3 and performs amplification, A/D conversion and the like of the output signal of the sensor 2. The setting evaluation device 3 acquires the A/D conversion result of the semiconductor device 1 and checks the operation of the semiconductor device 1, and thereby evaluates the set value of the register 181.

Figure 28:
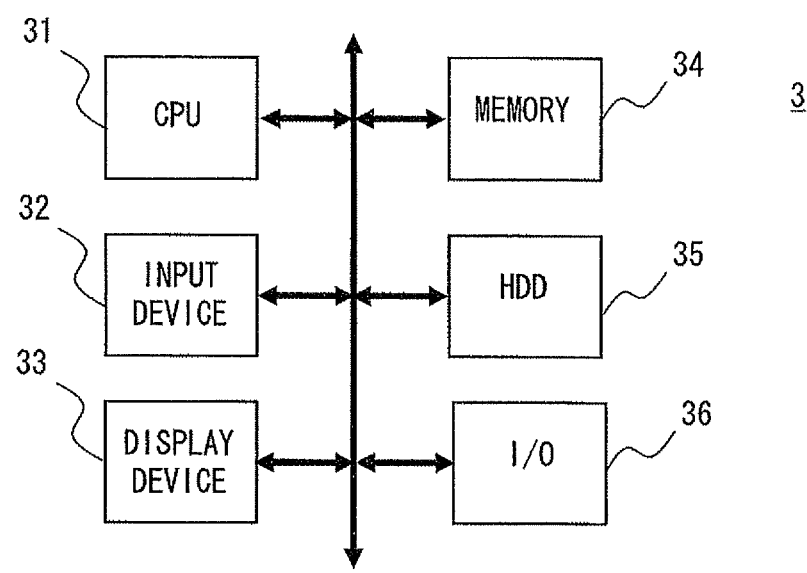
FIG. 28 is a hardware configuration diagram of a setting evaluation device in the semiconductor device according to the first embodiment of the invention.

FIG. 28 shows an example of a hardware configuration for implementing the setting evaluation device 3. As shown in FIG. 28, the setting evaluation device 3 is a computer device such as a personal computer or a work station, and includes a central processing unit (CPU) 31 and a memory 34. The CPU 31 and the memory 34 are connected to a hard disk device (HDD) 35 as an auxiliary storage device through a bus. The setting evaluation device 3 includes an input device 32, such as a pointing device (mouse, joy stick etc.) and a keyboard, for user input, and a display device 33, such as a CRT or a liquid crystal display, for presenting visual data like GUI to a user, for example, as user interface hardware. In a storage medium such as the HDD 35, a program for giving instructions to the CPU 31 or the like and implementing the functions of the setting evaluation device 3 in cooperation with the operation system can be stored. The program is executed by being loaded to the memory 34. Further, the setting evaluation device 3 includes an input/output interface (I/O) 36 such as USB that is connected to the evaluation board 10 or the like. Note that the setting evaluation device 3 may be formed by a plurality of computers, not limited to a single computer.

Figure 29:
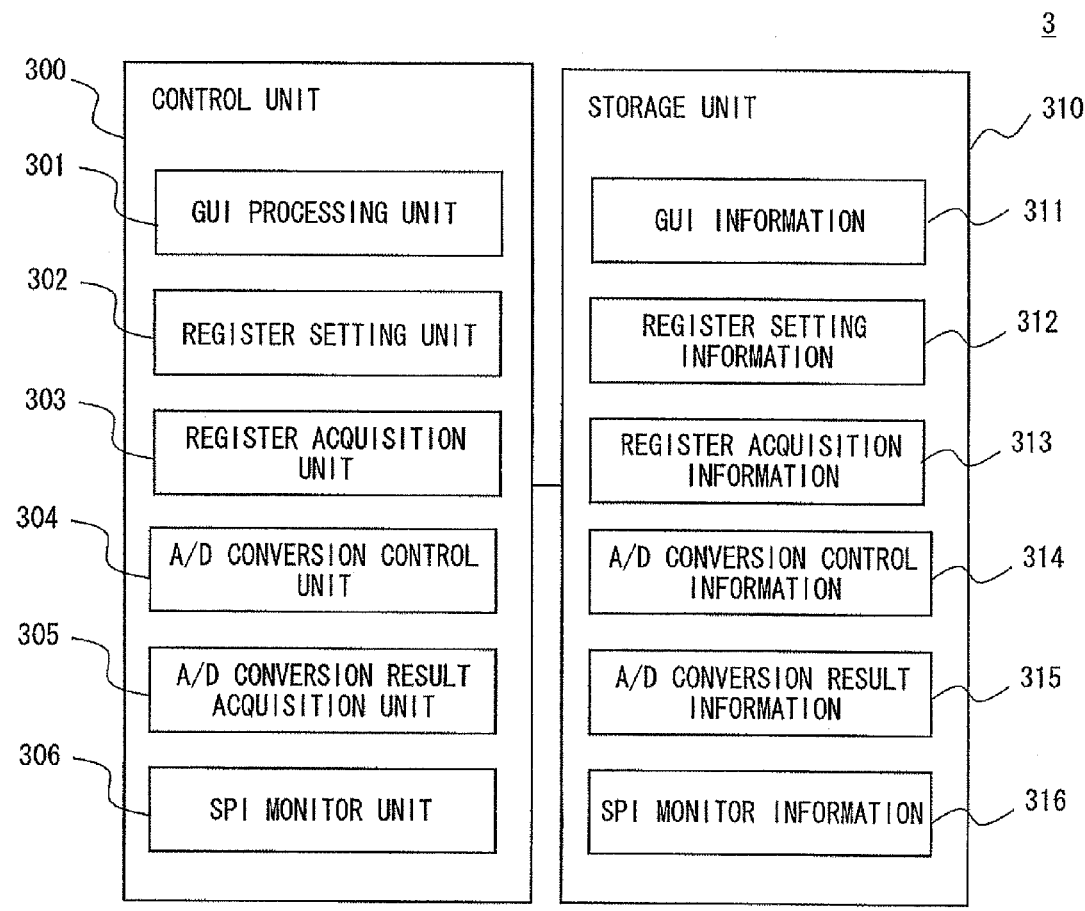
FIG. 29 is a functional block diagram of a setting evaluation device in the semiconductor device according to the first embodiment of the invention.

FIG. 29 shows a functional block of the setting evaluation device 3. As shown in FIG. 29, the setting evaluation device 3 includes a control unit 300 and a storage unit 310.

The functions of the control unit 300 are implemented by execution of a program by the CPU 31. The control unit 300 includes a GUI processing unit 301, a register setting unit 302, a register acquisition unit 303, an A/D conversion control unit 304, an A/D conversion result acquisition unit 305 and an SPI monitor unit 306.

The storage unit 310 is implemented by the HDD 35 or the memory 34. In the storage unit 310, GUI information 311, register setting information 312, register acquisition information 313, A/D conversion control information 314, A/D conversion result information 315, and SPI monitor information 316 are stored.

The GUI information 311 is information to display GUI composed of a window or the like for setting evaluation of the semiconductor device 1 as described later. The GUI processing unit (GUI display unit) 301 displays GUI on the display device 33 based on the GUI information 311 and further accepts a user's input operation on the GUI.

The register setting information 312 is setting information (configuration information) that is set to the register 181 of the semiconductor device 1. The register setting unit (setting information generation unit and setting unit) 302 generates the register setting information 312 in accordance with an input operation on the GUI, outputs the generated register setting information 312 to the semiconductor device 1 and gives an instruction for configuration change (setting).

The register acquisition information 313 is information of the register 181 that is acquired from the semiconductor device 1, and it is information written in the current register 181. The register acquisition unit 303 gives an instruction to the semiconductor device 1 to acquire the register acquisition information 313 and outputs the register acquisition information 313 to a user through the GUI.

The A/D conversion control information 314 is information such as a parameter for A/D conversion in the MCU unit 200 of the semiconductor device 1. The A/D conversion control unit 304 generates the A/D conversion control information 314 in accordance with an input operation on the GUI, outputs the generated A/D conversion control information 314 to the semiconductor device 1 and thereby controls the A/D conversion operation of the MCU unit 200.

The A/D conversion result information 315 is information indicating a result of A/D conversion in the MCU unit 200 of the semiconductor device 1. The A/D conversion result acquisition unit 305 gives an instruction to the semiconductor device 1 to acquire the A/D conversion result information 315 and outputs the A/D conversion result information 315 to a user through the GUI.

The SPI monitor information 316 is communication information of the SPI interface between the MCU unit 200 and the AFE unit 100 in the semiconductor device 1. The SPI monitor unit 306 gives an instruction to the semiconductor device 1 to acquire the SPI monitor information 316 and outputs the SPI monitor information 316 to a user through the GUI.

Figure 30:
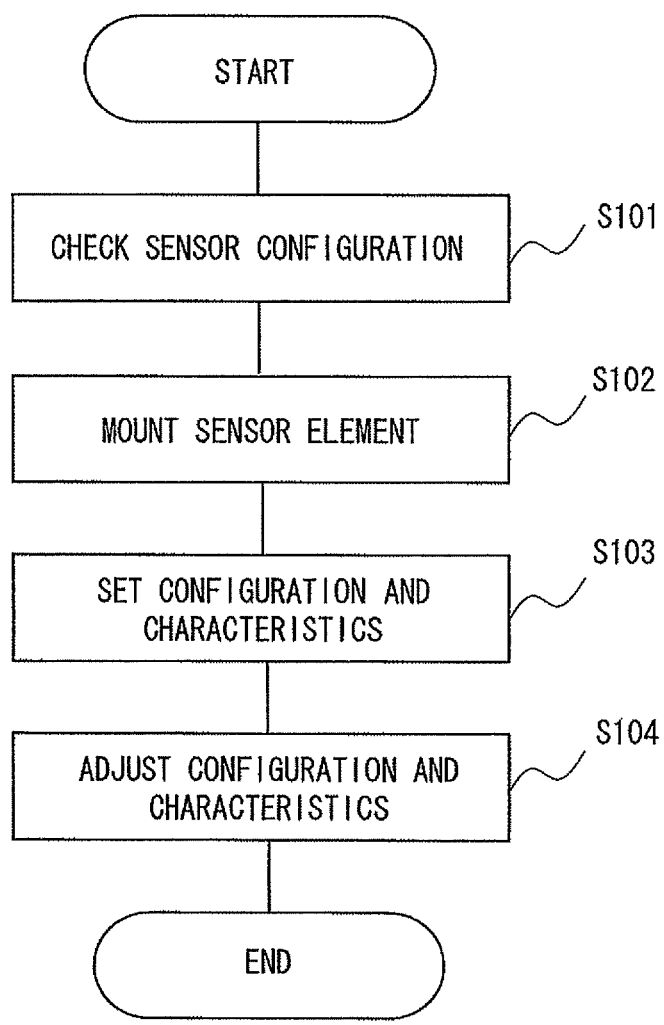
FIG. 30 is a flowchart showing a setting evaluation method of the semiconductor device according to the first embodiment of the invention.

A setting evaluation method (development method) of the semiconductor device 1 in the setting evaluation system shown in FIG. 27 is described hereinafter with reference to FIG. 30.

First, the configuration of the sensor 2 that is connected to the semiconductor device 1 is checked (S101). Specifically, the circuit configuration, characteristics and output signal of the sensor 2 are checked. For example, when the sensor 2 is a hole element, it is a sensor configuration with a bridge resistor, and the output signal is output as a differential voltage.

Next, the sensor 2 is attached to the semiconductor device 1 (S102). Specifically, the sensor 2 is attached to the sensor board 20, and the sensor board 20 is connected to the sensor interface 12 of the evaluation board 10 on which the semiconductor device 1 is mounted.

Then, the configuration and characteristics of the semiconductor device 1 are set by the setting evaluation device 3 (S103). Specifically, the setting evaluation device 3 is connected to the evaluation board 10, a user operates the GUI of the setting evaluation device 3 to set the circuit configuration, input terminal, gain, bias and the like of the AFE unit 100 in the semiconductor device 1.

Then, the configuration and characteristics of the semiconductor device 1 are adjusted by the setting evaluation device 3 (S104). Specifically, the output signal of the sensor 2 is A/D converted by the semiconductor device 1, and a user operates the GUI of the setting evaluation device 3 in accordance with a result of the A/D conversion to set the configuration and characteristics of the semiconductor device 1 again. For example, a user adjusts the DAC bias of the AFE unit 100 with reference to the A/D conversion result through the GUI and thereby sets an intermediate potential of the amplifier.

Figure 31:
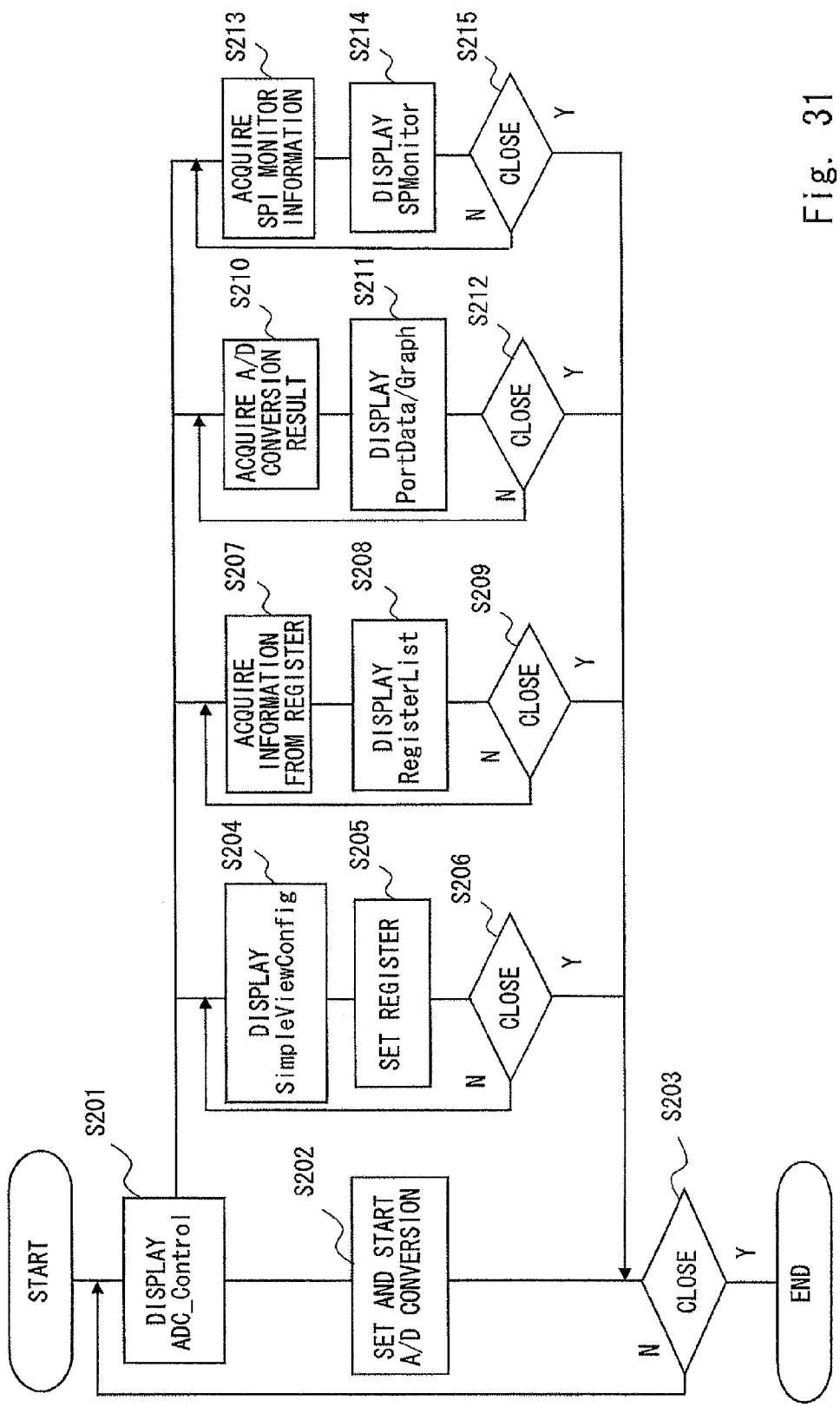
FIG. 31 is a flowchart showing a setting evaluation method of the semiconductor device according to the first embodiment of the invention.

A setting evaluation process that is executed in the setting evaluation device 3 is described hereinafter with reference to FIG. 31. The setting evaluation is performed in S103 and S104 in FIG. 30. A setting evaluation program for performing the setting evaluation process of FIG. 31 is stored in the setting evaluation device 3, and the following process starts when a user runs the setting evaluation program.

The program can be stored and provided to a computer using any type of non-transitory computer readable media. Non-transitory computer readable media include any type of tangible storage media. Examples of non-transitory computer readable media include magnetic storage media (such as floppy disks, magnetic tapes, hard disk drives, etc.), optical magnetic storage media (e.g. magneto-optical disks), CD-ROM (compact disc read only memory), CD-R (compact disc recordable), CD-R/W (compact disc rewritable), and semiconductor memories (such as mask ROM, PROM (programmable ROM), EPROM (erasable PROM), flash ROM, RAM (random access memory), etc.). The program may be provided to a computer using any type of transitory computer readable media. Examples of transitory computer readable media include electric signals, optical signals, and electromagnetic waves. Transitory computer readable media can provide the program to a computer via a wired communication line (e.g. electric wires, and optical fibers) or a wireless communication line.

First, the GUI processing unit 301 displays an ADC_Control window (S201). Specifically, when the setting evaluation program runs, the GUI processing unit 301 displays the ADC_Control window as the first window. The ADC_Control window is a window for controlling A/D conversion of the semiconductor device 1 and also a window for starting display of another window.

Then, the A/D conversion control unit 304 sets the A/D conversion operation to the semiconductor device 1 to start A/D conversion (S202). Specifically, the A/D conversion control unit 304 generates the A/D conversion control information 314, which is a parameter for A/D conversion, according to an operation input to the ADC_Control window by a user and sets the parameter for A/D conversion to the MCU unit 200 of the semiconductor device 1. Then, according to the operation on the ADC_Control window, the A/D conversion control unit 304 gives the MCU unit 200 an instruction to start A/D conversion, and the MCU unit 200 starts A/D conversion on the signal from the AFE unit 100.

After that, the GUI processing unit 301 determines whether to close the ADC_Control window (S203) and repeats S201 and S202 until the user performs Close operation.

Further, the GUI processing unit 301 displays a SimpleViewConfig window (S204). Specifically, when a user performs an operation to display the SimpleViewConfig window on the ADC_Control window of S201, the GUI processing unit 301 displays that window. The SimpleViewConfig window is a window for setting the configuration and characteristics of the AFE unit 100 of the semiconductor device 1.

Next, the register setting unit 302 sets the register 181 of the semiconductor device 1 (S205). Specifically, the register setting unit 302 generates the register setting information 312, which is configuration information of the AFE unit 100, according to an operation input to the SimpleViewConfig window by a user, outputs the register setting information 312 to the MCU unit 200 to perform writing from the MCU unit 200 to the register 181 of the AFE unit 100.

After that, the GUI processing unit 301 determines whether to close the SimpleViewConfig window (S206) and repeats S204 and S205 until the user performs Close operation.

Further, the register acquisition unit 303 acquires the current configuration information from the register 181 of the semiconductor device 1 (S207). Specifically, when a user performs an operation to display the setting information of the register 181 on the ADC_Control window of S201, the register acquisition unit 303 gives an instruction to the MCU unit 200 and reads information from the register 181 of the AFE unit 100 through the MCU unit 200, and acquires the read register acquisition information 313.

Then, the GUI processing unit 301 displays a RegisterList window (S208). Specifically, when the register acquisition information 313 is acquired from the semiconductor device 1, the GUI processing unit 301 displays the RegisterList window and further displays the acquired register acquisition information 313 in the window. The contents of the register 181 set to the AFE unit 100 can be checked by the RegisterList window.

After that, the GUI processing unit 301 determines whether to close the RegisterList window (S209) and repeats S207 and S208 until the user performs Close operation.

Further, the A/D conversion result acquisition unit 305 acquires a result of A/D conversion from the MCU unit 200 of the semiconductor device 1 (S210). Specifically, when a user performs an operation to display the A/D conversion result on the ADC_Control window of S201, the A/D conversion result acquisition unit 305 gives an instruction to the MCU unit 200 and acquires the A/D conversion result information 315.

Then, the GUI processing unit 301 displays a PortData window or a Graph window (S211). Specifically, when the A/D conversion result information 315 is acquired from the semiconductor device 1, the GUI processing unit 301 displays the PortData window or the Graph window according to a user's operation and further displays the acquired A/D conversion result information 315 in the window. The PortData window displays the A/D conversion result information 315 by numerical values, and the Graph window displays the A/D conversion result information 315 by graph.

After that, the GUI processing unit 301 determines whether to close the PortData window or the Graph window (S212) and repeats S210 and S211 until the user performs Close operation.

Further, the SPI monitor unit 306 acquires the SPI monitor information 316 from the MCU unit 200 of the semiconductor device 1 (S213). Specifically, when a user performs an operation to display the SPI monitor information 316 on the ADC_Control window of S201, the SPI monitor unit 306 gives an instruction to the MCU unit 200 and acquires the SPI monitor information 316.

Then, the GUI processing unit 301 displays an SPMonitor window (S214). Specifically, when the SPI monitor information 316 is acquired from the semiconductor device 1, the GUI processing unit 301 displays the SPMonitor window and further displays the acquired SPI monitor information 316 in the window.

After that, the GUI processing unit 301 determines whether to close the SPMonitor window (S215) and repeats S213 and S214 until the user performs Close operation.

Display examples of the GUI that is displayed on the setting evaluation device 3 in each process of FIG. 31 are described hereinafter with reference to FIGS. 32 to 42.

Figure 32:
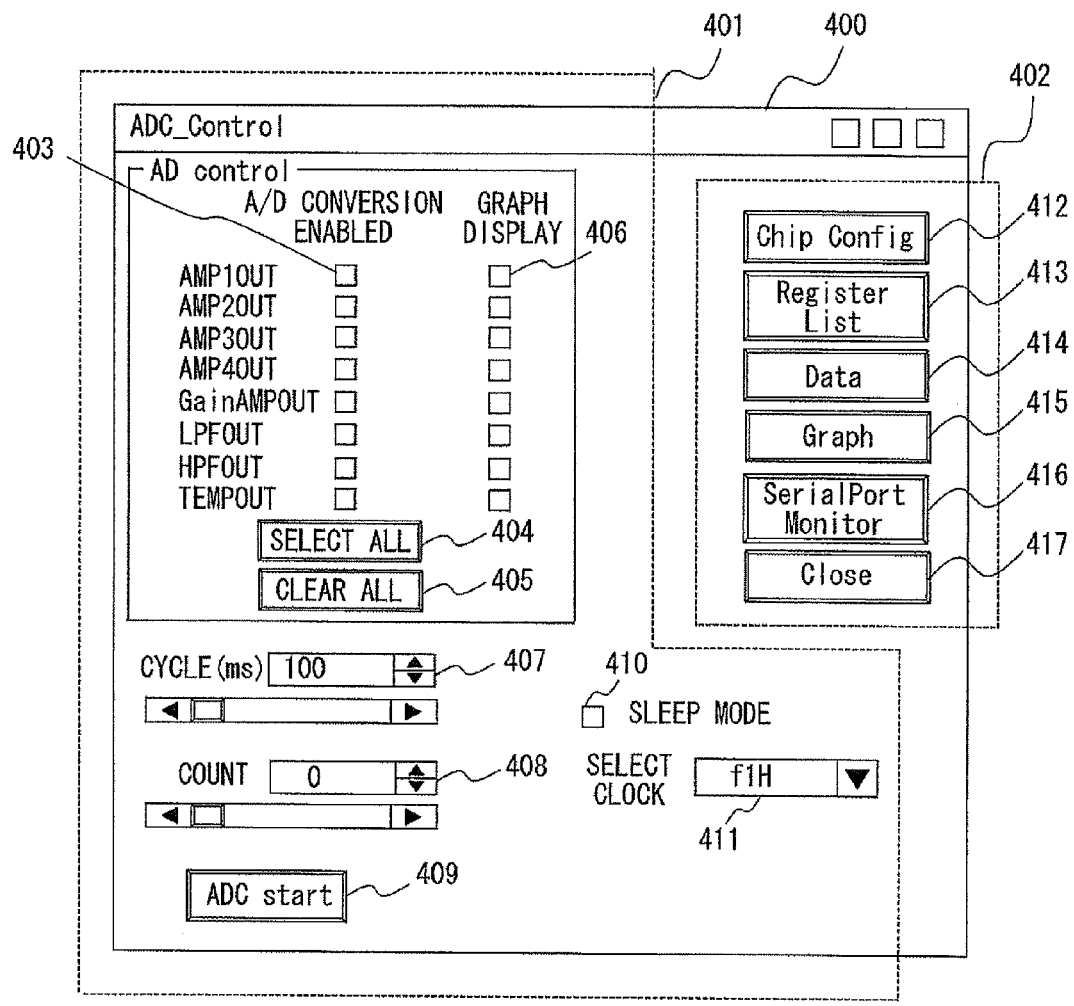
FIG. 32 is a display image diagram of GUI used in setting evaluation of the semiconductor device according to the first embodiment of the invention.

FIG. 32 is a display example of the ADC_Control window that is displayed in S201 of FIG. 31. As shown in FIG. 32, the ADC_Control window 400 includes an A/D conversion control area 401 for setting a parameter of A/D conversion and a window start area 402 for starting display of another window. In the A/D conversion control area 401, when each parameter is input, the parameter is output to the MCU unit 200 upon every input.

In the A/D conversion control area 401, "A/D Conversion Enabled" checkbox 403 sets the enable of A/D conversion when checked. The MCU unit 200 of the semiconductor device 1 sets whether or not to perform A/D conversion for each output signal of the AFE unit 100. "Select All" button 404 allows all checkboxes to be checked all at once, and "Clear All" button 405 allows all checkboxes to be cleared all at once.

"Graph Display" checkbox 406 selects an output terminal for graph display when checked. It sets for which output signal of the AFE unit 100 the A/D conversion result is to be output on the Graph window for graph display.

"Cycle" input box 407 sets the sampling cycle of A/D conversion in the MCU unit 200 in units of ms. The value can be changed by a spin button of an input box, and the value can be changed also by a scroll bar below the input box.

"Count" input box 408 sets the number of times to perform A/D conversion in the MCU unit 200. Note that, when "0" is input, no limit is placed on the number of times of measurement, and A/D conversion is repeated until the program ends (until the window is closed). Just like "Cycle", the value can be set by a spin button or a scroll bar.

"ADC Start" button 409 sets the start of execution of A/D conversion to the MCU unit 200. When the "ADC start" button 409 is clicked, A/D conversion is started on the signal of the output terminal for which A/D conversion is enabled in the MCU unit 200.

"Sleep Mode" checkbox 410 sets on/off of the sleep mode of the semiconductor device 1. When the "Sleep Mode" checkbox 410 is checked, the sleep mode is set on. For example, in the semiconductor device 1, the MCU unit 200 turns off the power supply of each circuit of the AFE unit 100 and enters the sleep mode.

"Clock selection" pull-down menu 411 selects and sets the frequency of a clock to be generated in the MCU unit 200. The MCU unit 200 generates the selected clock by the oscillator 230 and operates with the generated clock as the operating clock.

In the window start area 402, each button corresponds to the window to be displayed. "ChipConfig" button 412 is a button for displaying the SimpleViewConfig window. When the button is clicked, the SimpleViewConfig window is displayed, so that the configuration and characteristics of the AFE unit 100 of the semiconductor device 1 can be set to the register 181 through the GUI.

"RegisterList" button 413 is a button for displaying the RegisterList window. When the button is clicked, the RegisterList window is displayed, so that the set value of the register 181 of the AFE unit 100 can be displayed.

"Data" button 414 is a button for displaying the PortData window. When the button is clicked, the PortData window is displayed, so that data of the A/D conversion result in the MCU unit 200 can be displayed in numerals.

"Graph" button 415 is a button for displaying the Graph window. When the button is clicked, the Graph window is displayed, so that the A/D conversion result in the MCU unit 200 can be displayed in graph.

"SerialPortMonitor" button 416 is a button for displaying the SPMonitor window. When the button is clicked, the SPMonitor window is displayed, so that the communication status of the SPI interfaces between the MCU unit 200 and the AFE unit 100 can be displayed.

"Close" button 417 is a button for closing the ADC_Control window 400 to end the program. The button corresponds to S203 of FIG. 31.

Figure 33:
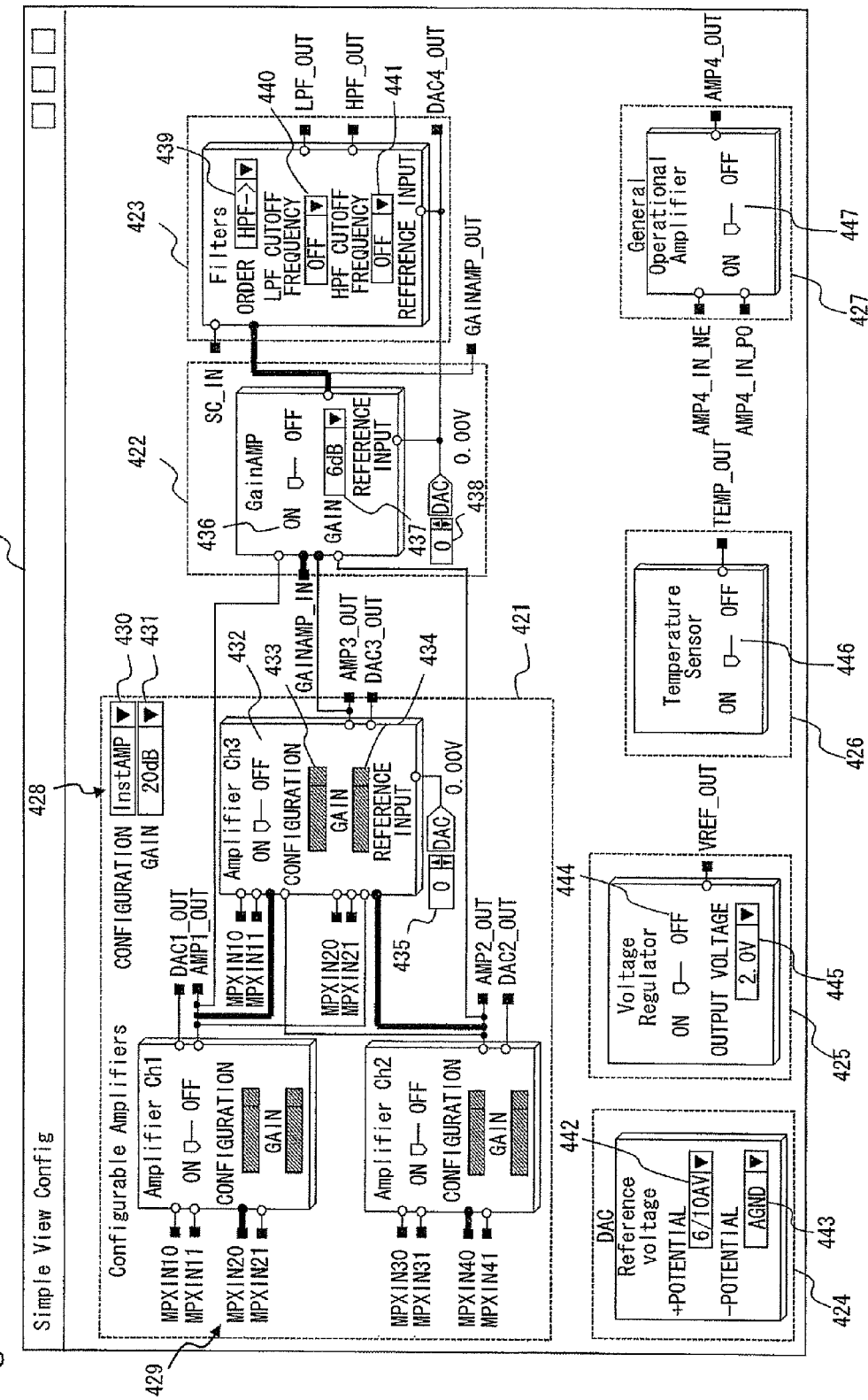
FIG. 33 is a display image diagram of GUI used in setting evaluation of the semiconductor device according to the first embodiment of the invention.

FIG. 33 is a display example of the SimpleViewConfig window that is displayed in S204 of FIG. 31. As shown in FIG. 33, the SimpleViewConfig window 420 includes a configurable amplifier setting area 421 for setting the configurable amplifier 110, an gain amplifier setting area 422 for setting the gain amplifier 120, a filter circuit setting area 423 for setting the low-pass filter 130 and the high-pass filter 140, a DAC reference voltage setting area 424 for setting the reference voltage of the DAC connected to each operational amplifier, a variable regulator setting area 425 for setting the variable regulator 150, a temperature sensor setting area 426 for setting the temperature sensor 160, and a general-purpose amplifier setting area 427 for setting the general-purpose amplifier 170.

The configurable amplifier setting area 421 includes an overall setting area 428 for setting the configurable amplifier as a whole, and a separate setting area 429 for separately setting the AMP1, AMP2 and AMP3 of Ch1, Ch2 and Ch3. In the separate setting area 429, the areas of the respective amplifiers are displayed for setting the AMP1, AMP2 and AMP3.

In the overall setting area 428, "Configuration" pull-down menu (overall configuration setting part) 430 is to select and set the overall circuit configuration of the configurable amplifier 110. When "InstAMP" is selected, an instrumentation amplifier in which the amplifiers Ch1 to Ch3 are connected is formed. Only when "InstAMP" is set, the gain of the instrumentation amplifier can be selected and set by "Gain" pull-down menu (overall characteristics setting part) 431.

Figure 34:
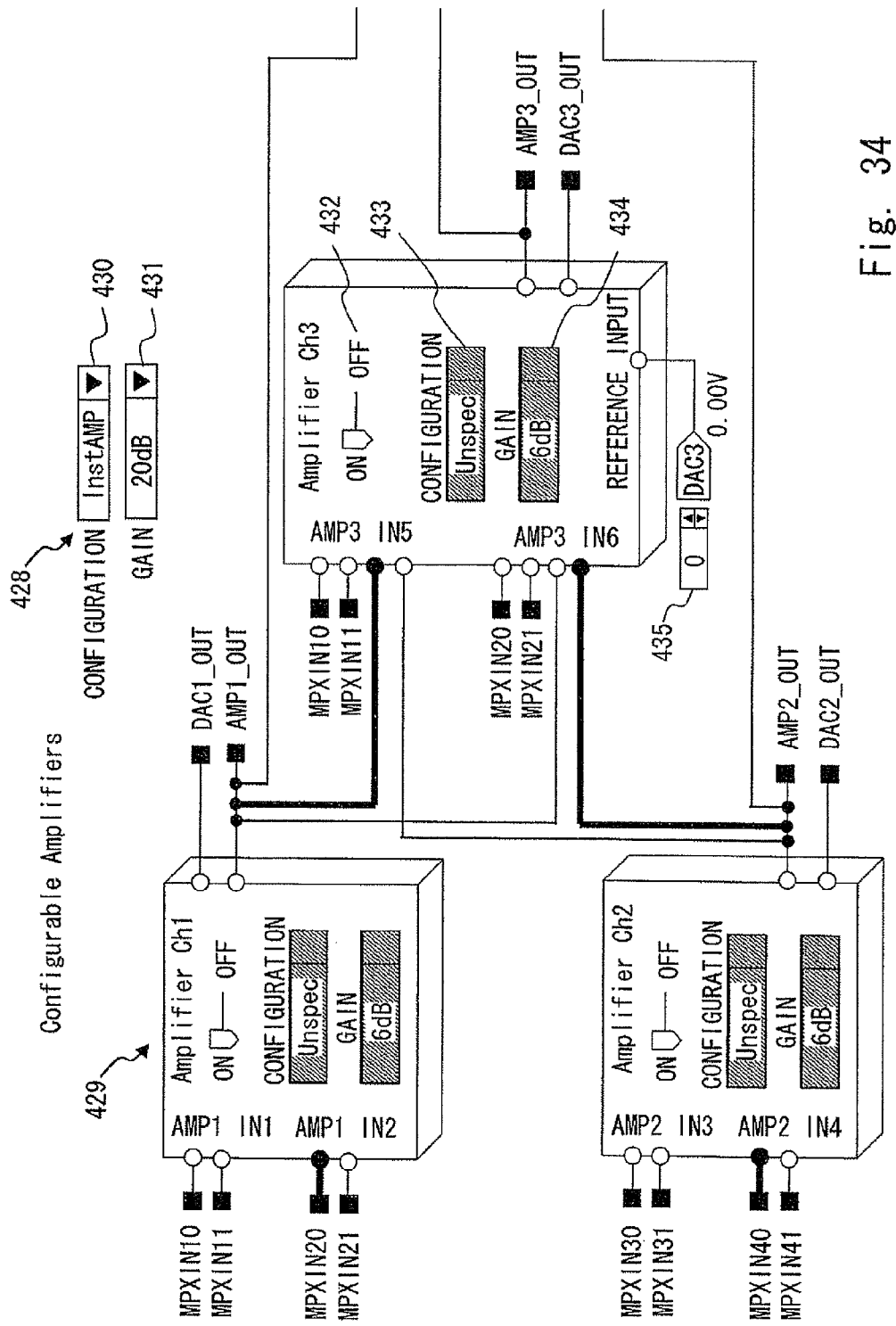
FIG. 34 is a display image diagram of GUI used in setting evaluation of the semiconductor device according to the first embodiment of the invention.

FIG. 34 is a display example in the case where "InstAMP" is selected by the "Configuration" pull-down menu 430. As shown in FIG. 34, in this case, the amplifiers Ch1 to Ch3 are connected automatically, and each of the amplifiers Ch1 to Ch3 cannot be set. In other words, only the gain of the instrumentation amplifier as a whole and the DAC of the AMP3 can be set.

Figure 35:
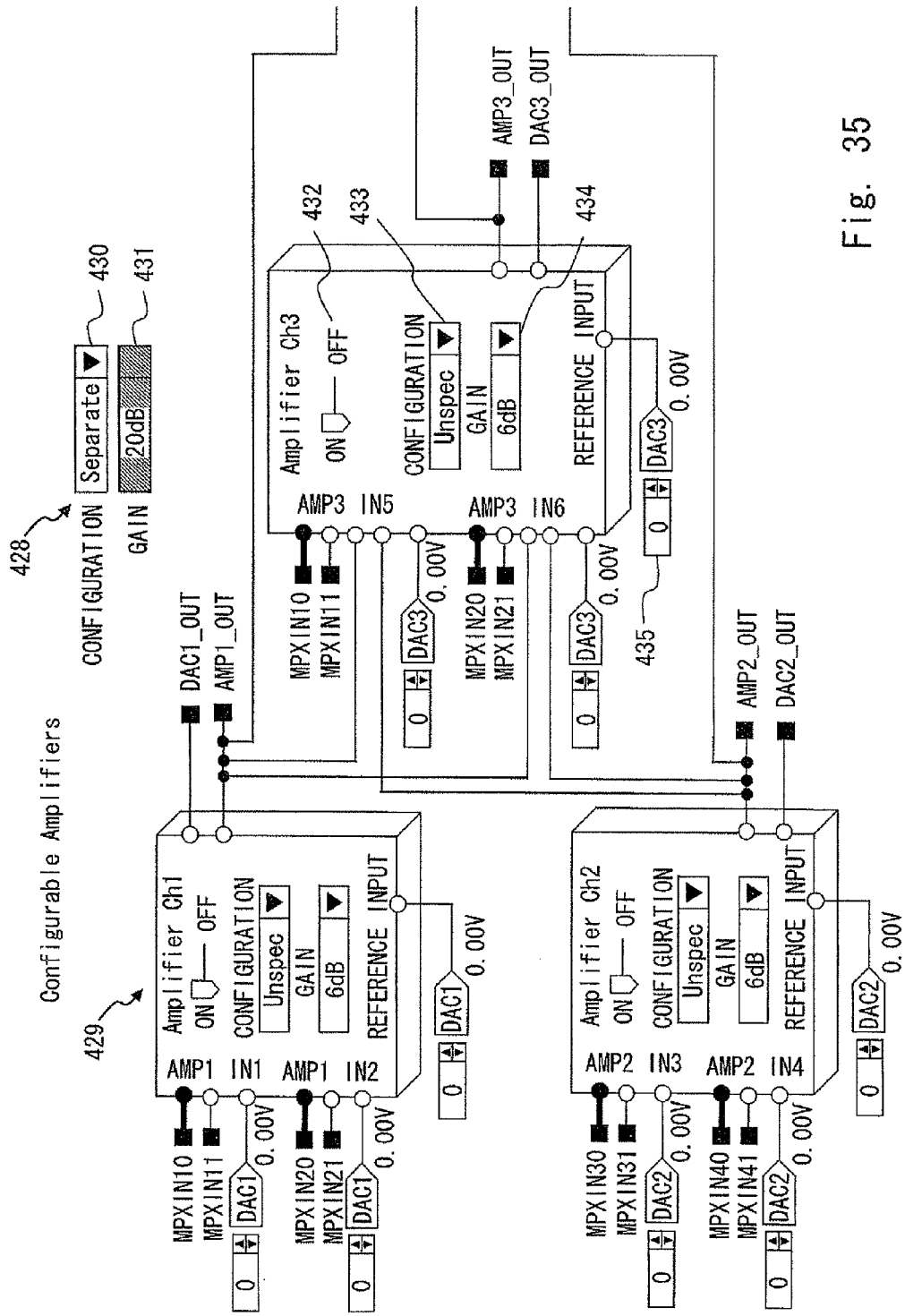
FIG. 35 is a display image diagram of GUI used in setting evaluation of the semiconductor device according to the first embodiment of the invention.

When "Separate" is selected by the "Configuration" pull-down menu 430, the Ch1 to Ch3 of the configurable amplifier can be set separately. FIG. 35 is a display example in the case where "Separate" is selected. As shown in FIG. 35, in this case, the amplifiers Ch1 to Ch3 are not connected and independent of one another, and the configuration and characteristics of each amplifier can be set separately. In other words, the configuration, gain, DAC and the like of each amplifier can be set, and the overall gain cannot be set.

As shown in FIG. 35, in the separate setting area 429, the name of the amplifier to be set is displayed at the top, and "Amplifier Ch1", "Amplifier Ch2" and "Amplifier Ch3" are displayed, respectively.

"On/Off" slide switch 432 is to set the power on/off of the separate amplifier. On/off is set by dragging and dropping the slide switch knob.

"Configuration" pull-down menu (overall configuration setting part) 433 is to select and set the circuit configuration of the separate amplifier. When "Inverter" is selected, the configuration of the separate amplifier is set to the inverting amplifier, when "Forward" is selected, the configuration of the separate amplifier is set to the non-inverting amplifier, when "Diff" is selected, the configuration of the separate amplifier is set to the differential amplifier, and when "I/V" is selected, the configuration of the separate amplifier is set to the I/V amplifier, and each circuit configuration is automatically set.

Further, when "Custom" is selected by the "Configuration" pull-down menu 433, the inside of the separate amplifier can be set in detail. The detailed setting can be made also when the icon of each of the amplifiers Ch1 to Ch3 is clicked.

Figure 36:
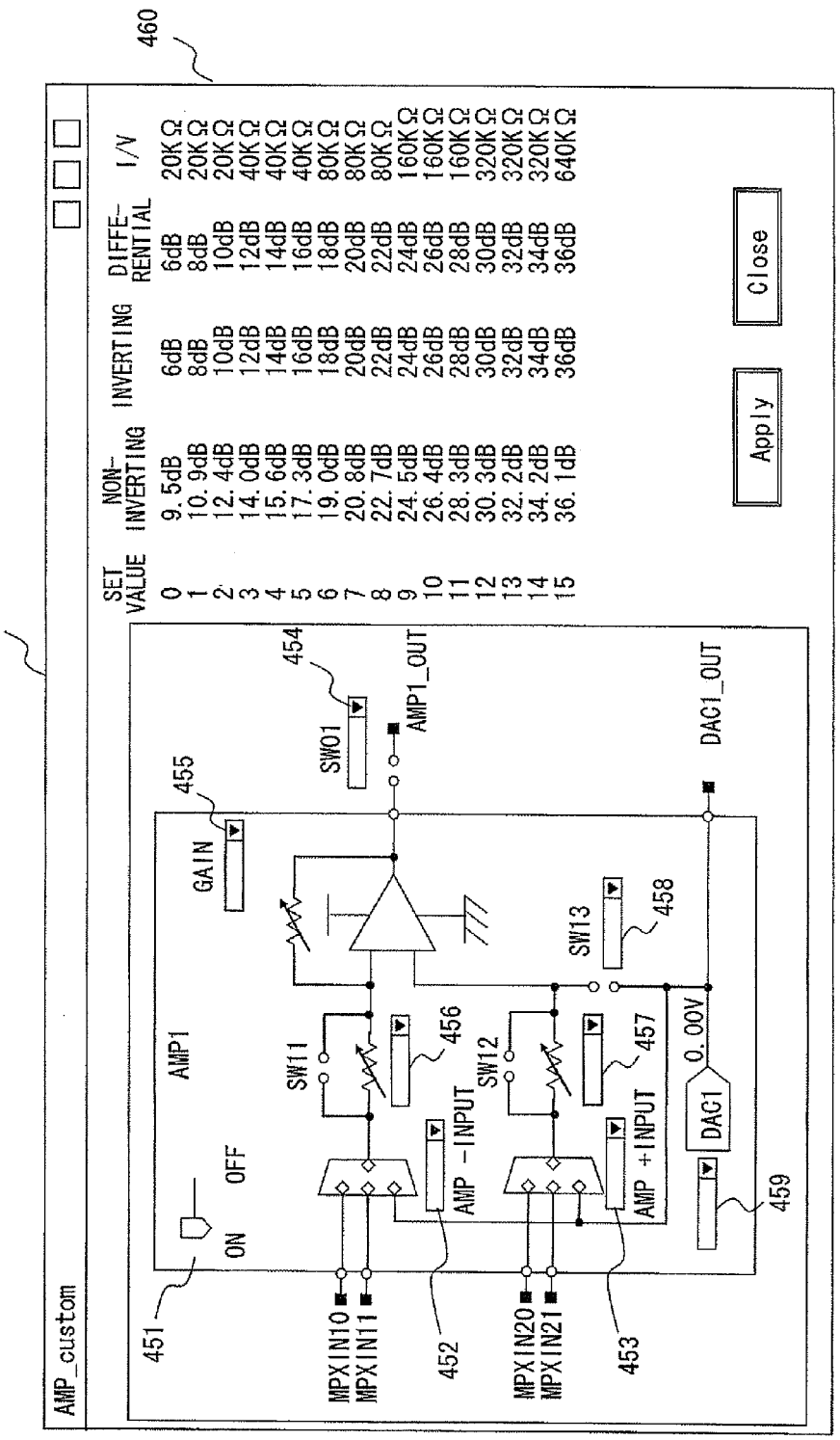
FIG. 36 is a display image diagram of GUI used in setting evaluation of the semiconductor device according to the first embodiment of the invention.

To be specific, an AMP_Custom window is displayed and set as shown in FIG. 36. In the AMP_Custom window 450, the same circuit image as the actual circuit configuration of the separate amplifier is displayed.

The power on/off of the amplifier is set by a slide switch 451, elements to which the input terminal and the output terminal of the amplifier are connected are set by pull-down menus 452 to 454, the gain of the amplifier is set by a pull-down menu 455, the input resistance and the connection of the DAC are set by pull-down menus 456 to 458, and the output voltage of the DAC is set by a pull-down menu 459. Note that, because the setting of the gain differs depending on the configuration of the amplifier, the set value displayed in a set value display area 460 is set.

Further, as shown in FIG. 35, "Gain" pull-down menu (separate characteristics setting part) 434 is to select and set the gain of the separate amplifier. When the circuit configuration is set to "I/V", the display of the pull-down menu is a feedback resistance value. For example, the display may be made to change the range of selection according to the circuit configuration.

"DAC" input box (separate characteristics setting part) 435 is to set the output voltage of 8-bit DAC. Note that the set values of a plurality of DAC may be set in conjunction. The input box allows input of numbers 0 to 255, and the set value can be incremented or decremented in units of "1" by a spin button of the input box. When a number is input to the input box, the actual DAC output voltage value is displayed at the lower right of the DAC icon.

Other areas in FIG. 33 are described hereinafter. As shown in FIG. 33, in the gain amplifier setting area 422, "GainAMP" is displayed at its top as the name of the circuit to be set.

In the gain amplifier setting area 422, the power on/off is set by a slide switch 436, the gain is set by a pull-down menu 437, and the output of the DAC is set by an input box 438, just like for the configurable amplifier. The DAC setting is common to the filters.

In the filter circuit setting area 423, "Filters" is displayed at its top as the name of the circuit to be set.

"Order" pull-down menu 439 is to select and set the order of passing through the filter circuits. When "LPF" is selected, the configuration is automatically set to pass through the low-pass filter 130 only, when "HPF" is selected, the configuration is automatically set to pass through the high-pass filter 140 only, when "LPF→HPF" is selected, the configuration is automatically set to pass through the low-pass filter 130 and the high-pass filter 140 in this order, and when "HPF→LPF" is selected, the configuration is automatically set to pass through the high-pass filter 140 and the low-pass filter 130 in this order.

"LPF Cutoff Frequency" pull-down menu 440 is to select and set the cutoff frequency of the low-pass filter 130, and "HPF Cutoff Frequency" pull-down menu 441 is to select and set the cutoff frequency of the high-pass filter 140. Note that the power on/off of the low-pass filter 130 and the high-pass filter 140 may be settable.

In the DAC reference voltage setting area 424, "DAC Reference voltage" is displayed at its top as the name of the circuit to be set.

"+Potential" pull-down menu 442 is to set the set voltage upper limit of each 8-bit DAC (DAC1 to DAC4). When "AVDD" is selected, the set voltage upper limit of each 8-bit DAC (DAC1 to DAC4) is set to AVDD. When "⅘AVDD" is selected, the set voltage upper limit of each 8-bit DAC (DAC1 to DAC4) is set to (⅘)×AVDD. When "⅗AVDD" is selected, the set voltage upper limit of each 8-bit DAC (DAC1 to DAC4) is set to (⅗)×AVDD.

"−Potential" pull-down menu 443 is to set the set voltage lower limit of each 8-bit DAC (DAC1 to DAC4). When "AGND" is selected, the set voltage lower limit of each 8-bit DAC (DAC1 to DAC4) is set to AGND. When "⅕AVDD" is selected, the set voltage lower limit of each 8-bit DAC (DAC1 to DAC4) is set to (⅕)×AVDD. When "⅖AVDD" is selected, the set voltage lower limit of each 8-bit DAC (DAC1 to DAC4) is set to (⅖)×AVDD.

In the variable regulator setting area 425, "Voltage Regulator" is displayed at its top as the name of the circuit to be set.

In this example, the power on/off is set by a slide switch 444 just like the case of the configurable amplifier.

"Output Voltage" pull-down menu 425 is to select and set the output voltage of the variable regulator 150.

In the temperature sensor setting area 426, "Temperature Sensor" is displayed at its top as the name of the circuit to be set. In this example, the power on/off is set by a slide switch 446 just like the case of the configurable amplifier.

In the general-purpose amplifier setting area 427, "General Operational Amplifier" is displayed at its top as the name of the circuit to be set. In this example, the power on/off is set by a slide switch 447 just like the case of the configurable amplifier.

Figure 37:
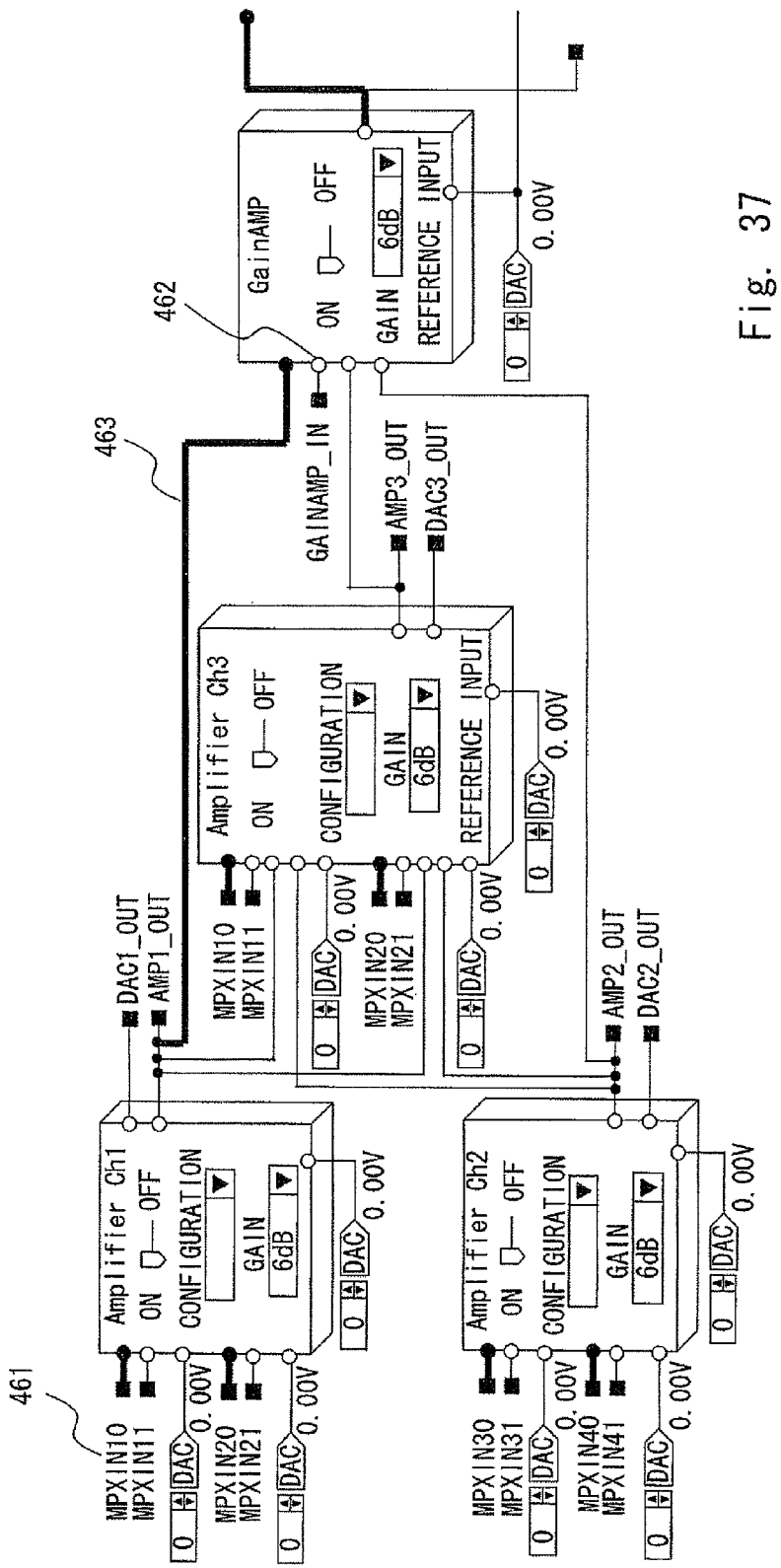
FIG. 37 is a display image diagram of GUI used in setting evaluation of the semiconductor device according to the first embodiment of the invention.

Further, in the SimpleViewConfig window, the connection of each connection terminal can be set. FIG. 37 shows a display example of connections of terminals. As indicated by the reference numeral 461, external terminals of the AFE unit 100 are displayed as square-shaped graphics, and the name of an external terminal is displayed next to each square.

Internal terminals of each circuit in the AFE unit 100 are displayed as circle-shaped graphics. A white-circle internal terminal is a terminal in the non-connected state, and a black-circle internal terminal is a terminal in the connected state. For example, a white circle denoted by the reference numeral 462 becomes a black circle, which is the connected state, when clicked.

Among lines, a thin line indicates a line in the non-connected state, and a heavy line, as indicated by the reference numeral 463, indicates a line in the connected state. The thin line may change into the heavy line, which is the connected state, when clicked.

Note that, although detailed circuit settings are described above with reference to FIG. 36, it is possible to make detailed settings also for the circuits other than the configurable amplifier by displaying the actual circuit configuration as shown in FIG. 36.

Figure 38:
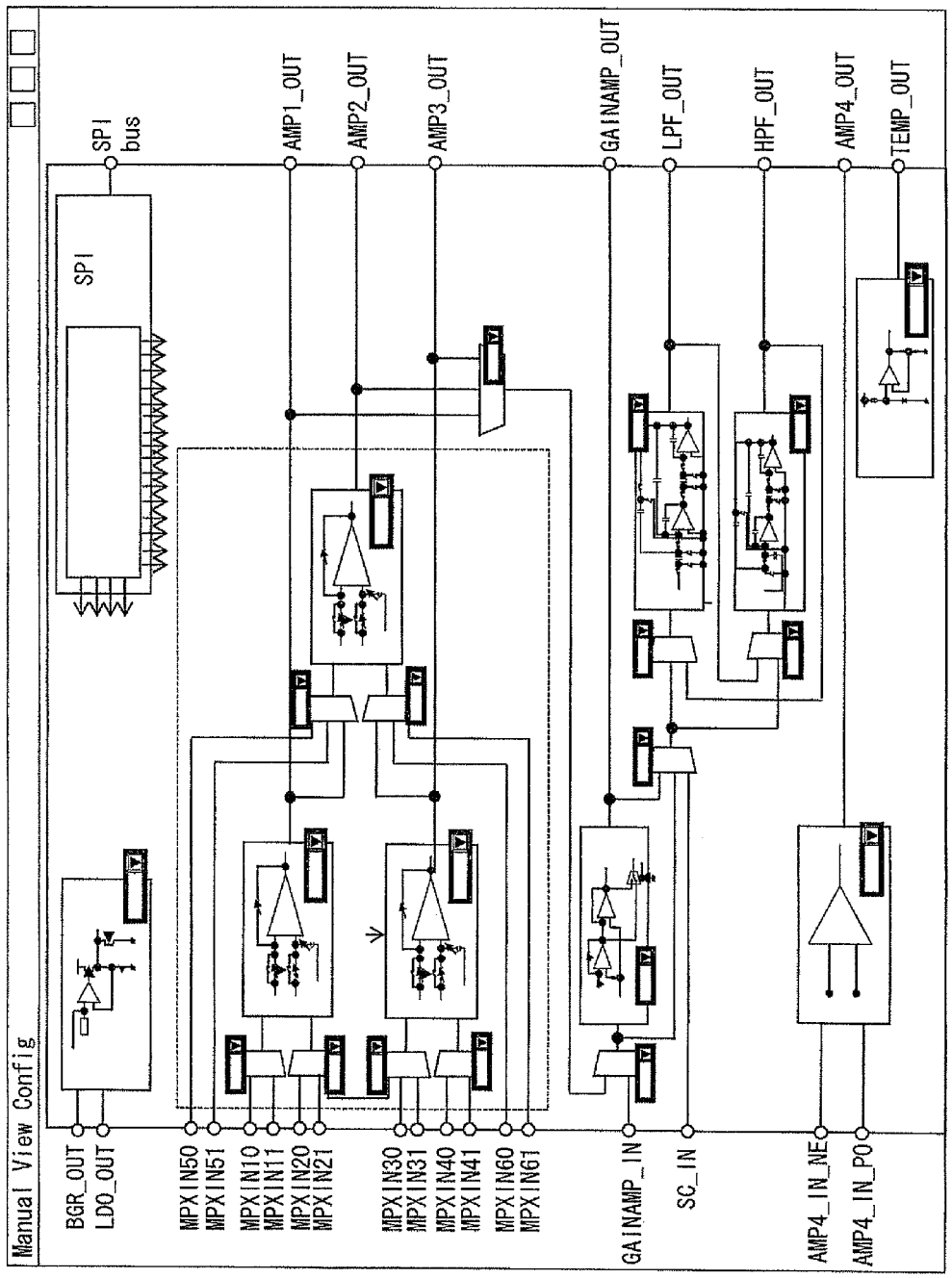
FIG. 38 is a display image diagram of GUI used in setting evaluation of the semiconductor device according to the first embodiment of the invention.

Further, the respective circuits may be set in detail with one window. For example, as shown in FIG. 38, all circuit images may be displayed to allow setting. FIG. 38 shows a display window of a ManualViewConfig window that can display the circuit image corresponding to the circuit configuration of FIG. 3 and make detailed settings. In FIG. 38, the respective circuits of the AFE unit 100 are displayed, and pull-down menus for setting the circuits are displayed. Note that the method of setting and the details of setting are the same as those described above and thus not redundantly described.

FIG. 39 is a display example of the RegisterList window that is displayed in S208 of FIG. 31. In the RegisterList window 500, a list of register set values is displayed in a register display area 501.

In the register display area 501, the items of address, register name, register attribute, register data bit display and HEX display are displayed as a list for each address of the register. By displaying the register name, it is possible to recognize at a glance what is set by the register. Further, by displaying the meaning of each bit of data, it is possible to recognize what is set by each data.

"Font" pull-down menu 502 is to select and designate the font size of the register display area 501. "RegisterReload" button 503 is to acquire the set value of the register 181 from the semiconductor device 1 again when clicked.

FIG. 40 is a display example of the PortData window that is displayed in S211 of FIG. 31. As shown in FIG. 40, in the PortData window 510, A/D conversion results are displayed in a data display area 511. In the data display area 511, data is displayed in cells arranged in matrix (rows and columns). The count number of A/D conversion is displayed in Count field, and the values of A/D conversion results are displayed in each Ch field. In this example, only the output signal for which A/D conversion has been enabled in the ADC_Control window is displayed. Note that the output terminal of the AFE unit 100 may be displayed.

Further, as shown in FIG. 41, in the PortData window 510, "File" menu 512, "Edit" menu 513, and "Display" menu 514 are displayed. For example, in the "File" menu 512, A/D conversion results can be output to a file by selecting "Save As (A)". In the "Edit" menu 513, a part or the whole of the data can be copied and pasted into another file by selecting "Copy (C)".

In the "Display" menu 514, the format of data display can be selected. When "Decimal" is selected, A/D conversion results are displayed in decimal number and, when "Hexadecimal" is selected, A/D conversion results are displayed in hexadecimal number. Further, when "Automatic Scroll" is selected, A/D conversion results are displayed sequentially by automatic scrolling when A/D conversion is performed repeatedly.

Figure 42:
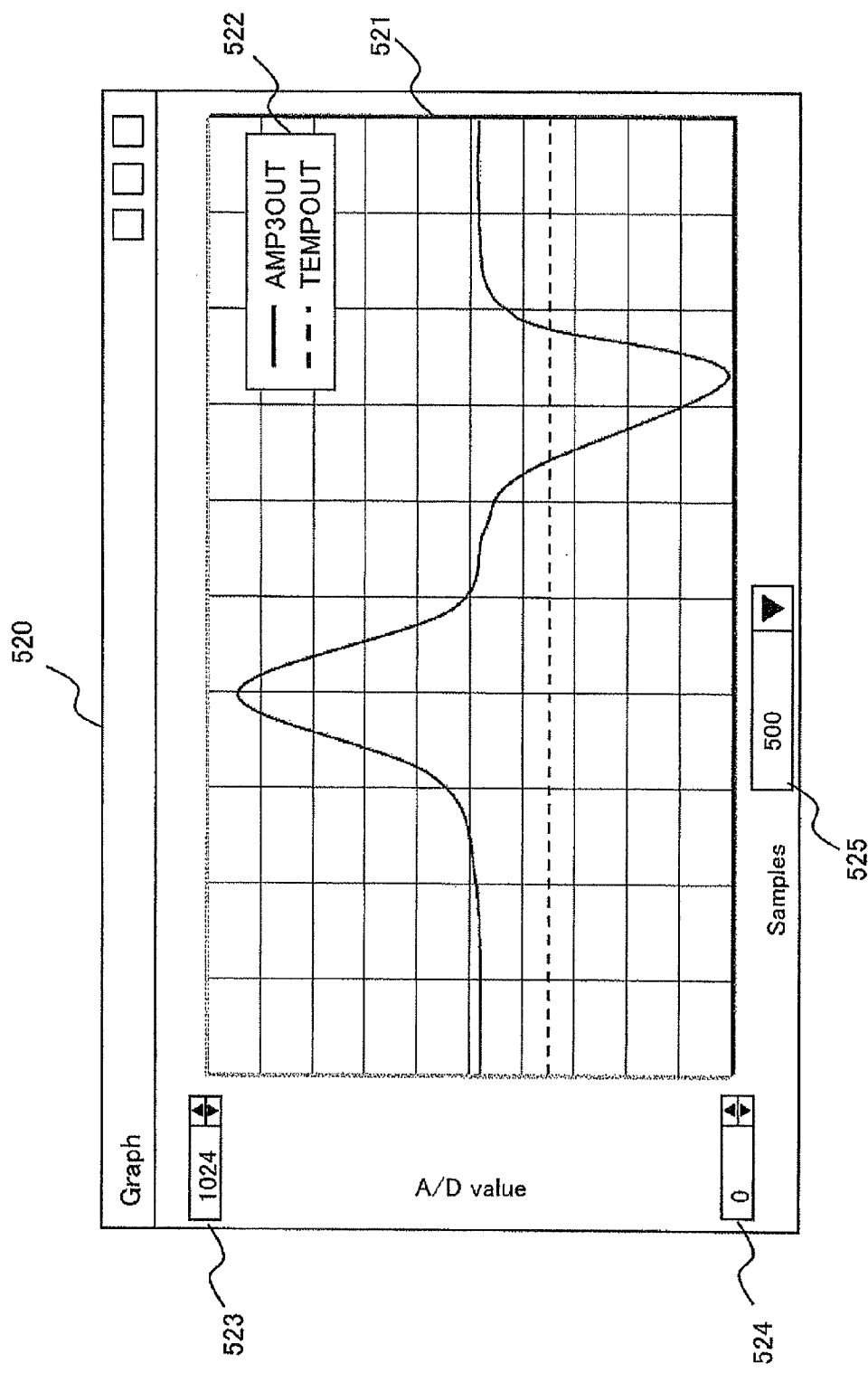
FIG. 42 is a display image diagram of GUI used in setting evaluation of the semiconductor device according to the first embodiment of the invention.

FIG. 42 is a display example of the Graph window that is displayed in S211 of FIG. 31. As shown in FIG. 42, in the Graph window 520, A/D conversion results are displayed in a graph display area 521. In the graph display area 521, the horizontal axis indicates time, and the vertical axis indicates A/D conversion results.

In a legend display area 22, the legends of the graph are displayed. In this example, the output for which Graph display has been checked in the ADC_Control window is displayed.

In a maximum value input box 523, the maximum value of the vertical axis of the graph can be set. The default is 1024, for example. Further, in a minimum value input box 524, the minimum value of the vertical axis of the graph can be set. The default is 0, for example.

"Sample" pull-down menu 525 is to select the number of Samples to be displayed in the horizontal axis of the graph. For example, the scale of the horizontal axis is fixed to 50[Sample/div], for example.

Figure 43:
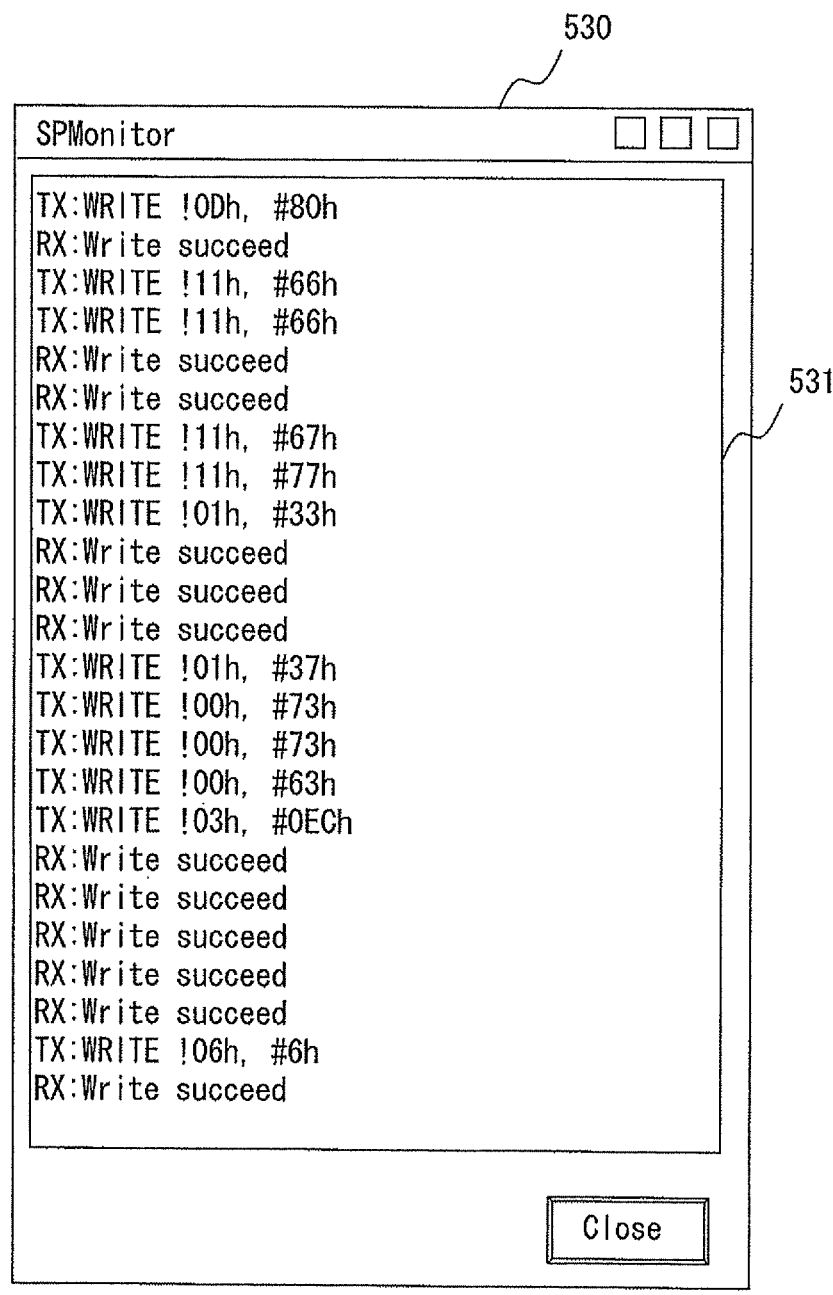
FIG. 43 is a display image diagram of GUI used in setting evaluation of the semiconductor device according to the first embodiment of the invention.

FIG. 43 is a display example of the SPMonitor window that is displayed in S214 of FIG. 31. As shown in FIG. 43, in the SPMonitor window 530, SPI monitor information is displayed in a monitor display area 531.

In the monitor display area 531, transmission (TX) data and received (RX) data are displayed as SPI communication data. As the transmission data, write (WRITE), register address and register data are displayed, for example. As the received data, write success/failure is displayed. Further, the read register data or the like is also displayed. In the monitor display area 531, monitor data is displayed sequentially each time communication is performed through the SPI interface.

The following effects are obtained by the embodiment described above. First, reduction in size and power consumption is achieved. In this embodiment, because the MCU and AFE circuits are included inside the semiconductor device, the size can be reduced compared to the case where a plurality of analog circuit ICs are mounted on a mounting board. Further, because the power of the AFE unit is turned off to enter the sleep mode of the MCU unit in the low power consumption mode, the power consumption can be reduced.

Further, the development process of the analog IC can be reduced. To develop the analog circuit suitable for a sensor, the process of circuit design, mask design, mask production and sample production is typically required, which can take three to eight months. In this embodiment, the analog circuit compatible with a sensor can be formed simply by changing the setting of the semiconductor device, and therefore the semiconductor device can be developed without performing the development process from circuit design to sample production. It is thus possible to develop a sensor system in a short period of time and make timely entry into the market.

Furthermore, the semiconductor device can be developed easily. Because the configuration and characteristics of the analog circuit in accordance with a sensor are set through GUI in this embodiment, the setting and evaluation (system verification) can be performed easily. The configuration and characteristics can be set through intuition through the GUI, and the setting and evaluation can be made at the same time, and it is thus possible to make development in a shorter period of time.

In addition, one semiconductor device can be used for a plurality of application systems. Because the circuit configuration is freely changeable in this embodiment, various sensors such as a current-type sensor and a voltage-type sensor can be connected with one semiconductor device. There is thus no need to develop different semiconductor devices for different sensors, which enables the reduction of the development period.

Second Embodiment of the Present Invention

Figure 44:
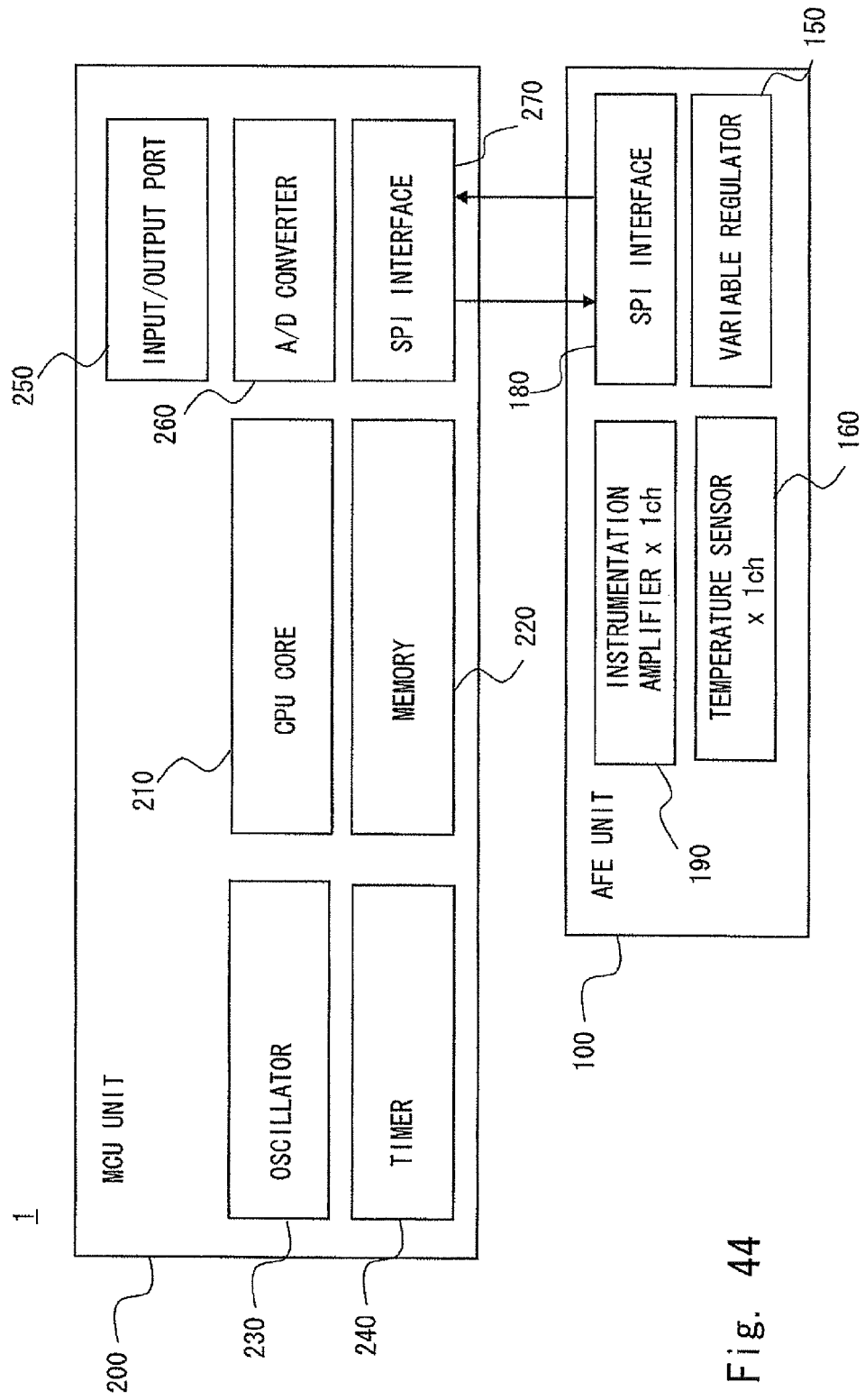
FIG. 44 is a circuit block diagram of a semiconductor device according to a second embodiment of the invention.

A second embodiment of the present invention is described hereinafter with reference to the drawings. FIG. 44 shows a circuit block of the semiconductor device 1 according to this embodiment.

The semiconductor device according to the first embodiment is intended for use in a general-purpose system, and a complete AFE circuit that is required for many sensors is included. On the other hand, the semiconductor device according to this embodiment is intended for use in a common measuring instrument, and an AFE circuit that is required only for a sensor of a common measuring instrument is included.

As shown in FIG. 44, in the semiconductor device 1 according to this embodiment, the configuration of the MCU unit 200 is the same as that of the first embodiment shown in FIG. 2, and the AFE unit 100 includes an instrumentation amplifier 190, the variable regulator 150, the temperature sensor 160, and the SPI interface 180. Compared with the semiconductor device 1 according to the first embodiment, the AFE unit 100 of this embodiment does not include the configurable amplifier, the gain amplifier supporting synchronous detection, the SC low-pass filter, the SC high-pass filter, and the general-purpose amplifier and includes the instrumentation amplifier instead. The variable regulator 150, the temperature sensor 160 and the SPI interface 180 are the same as those of the first embodiment.

The instrumentation amplifier 190 is an amplification circuit that supports a sensor of a common measuring instrument and can amplify a faint differential signal. The instrumentation amplifier 190 is the same circuit as the instrumentation amplifier which can be formed by the configurable amplifier 110 according to the first embodiment. The circuit configuration of the instrumentation amplifier 190 is fixed, and only the characteristics can be changed.

Figure 45:
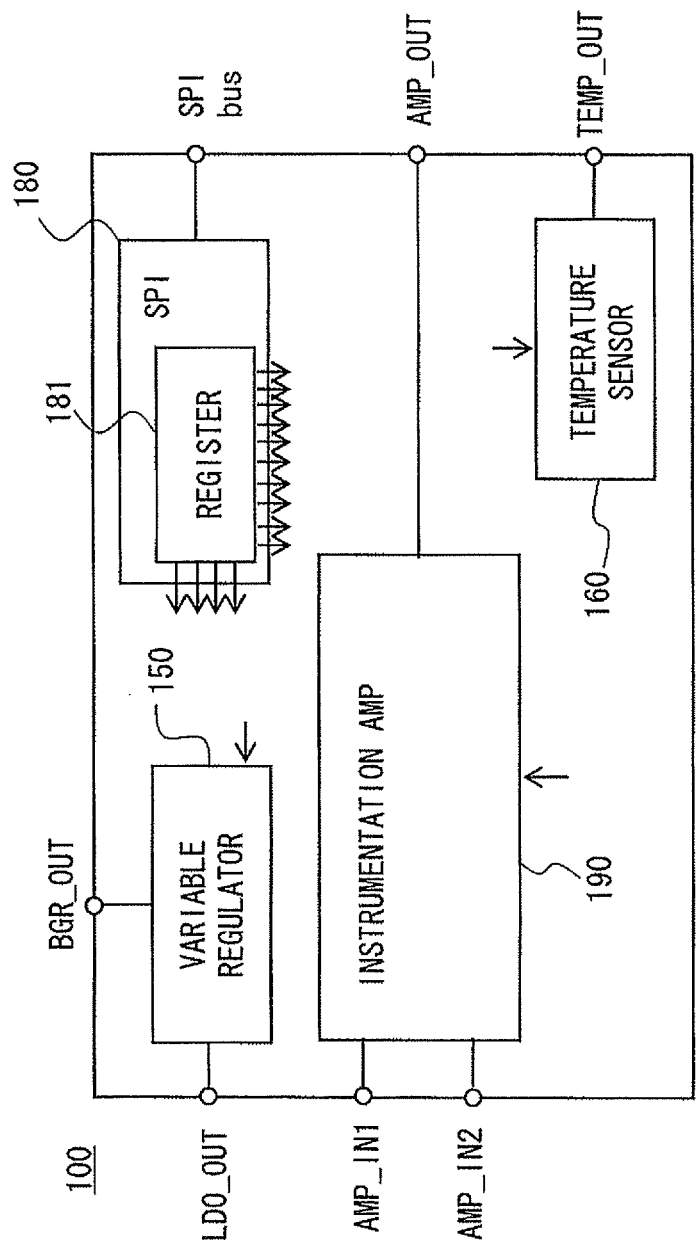
FIG. 45 is a diagram showing connections of circuits in the semiconductor device according to the second embodiment of the invention.

FIG. 45 shows connections of the circuits in the AFE unit 100 according to this embodiment. The variable regulator 150, the temperature sensor 160 and the SPI interface 180 are the same as those shown in FIG. 3 of the first embodiment.

Because the circuit configuration of the instrumentation amplifier 190 is fixed, the instrumentation amplifier 190 does not include a switch (multiplexer) for switching the configuration. In the instrumentation amplifier 190, one input terminal is connected to AMP_IN1, the other input terminal is connected to AMP_IN2, and the output terminal is connected to AMP_OUT. Note that switches for selecting connections with a plurality of external terminals may be included.

A specific circuit configuration of each circuit in the AFE unit 100 according to this embodiment is the same as that of the first embodiment, and thus not redundantly described. Specifically, the circuit configuration of the instrumentation amplifier 190 is the configuration shown in FIG. 14, and the instrumentation amplifier 190 can set the gain by changing the resistance value and can change the operating point, offset and the like by changing the setting of the DAC, as shown in FIG. 14.

As described above, in the semiconductor device 1 according to this embodiment, the circuit configuration of the AFE unit 100 is fixed, and only the characteristics can be set to be variable. Therefore, one semiconductor device can support specific sensors having different characteristics, and it can be used for a specific application system.

For example, the semiconductor device 1 can be used in an application system using a pressure sensor, a gyro sensor, a shock sensor or the like, which is a sensor with a faint differential output, just like the case where the instrumentation amplifier is formed in the first embodiment.

Figure 46:
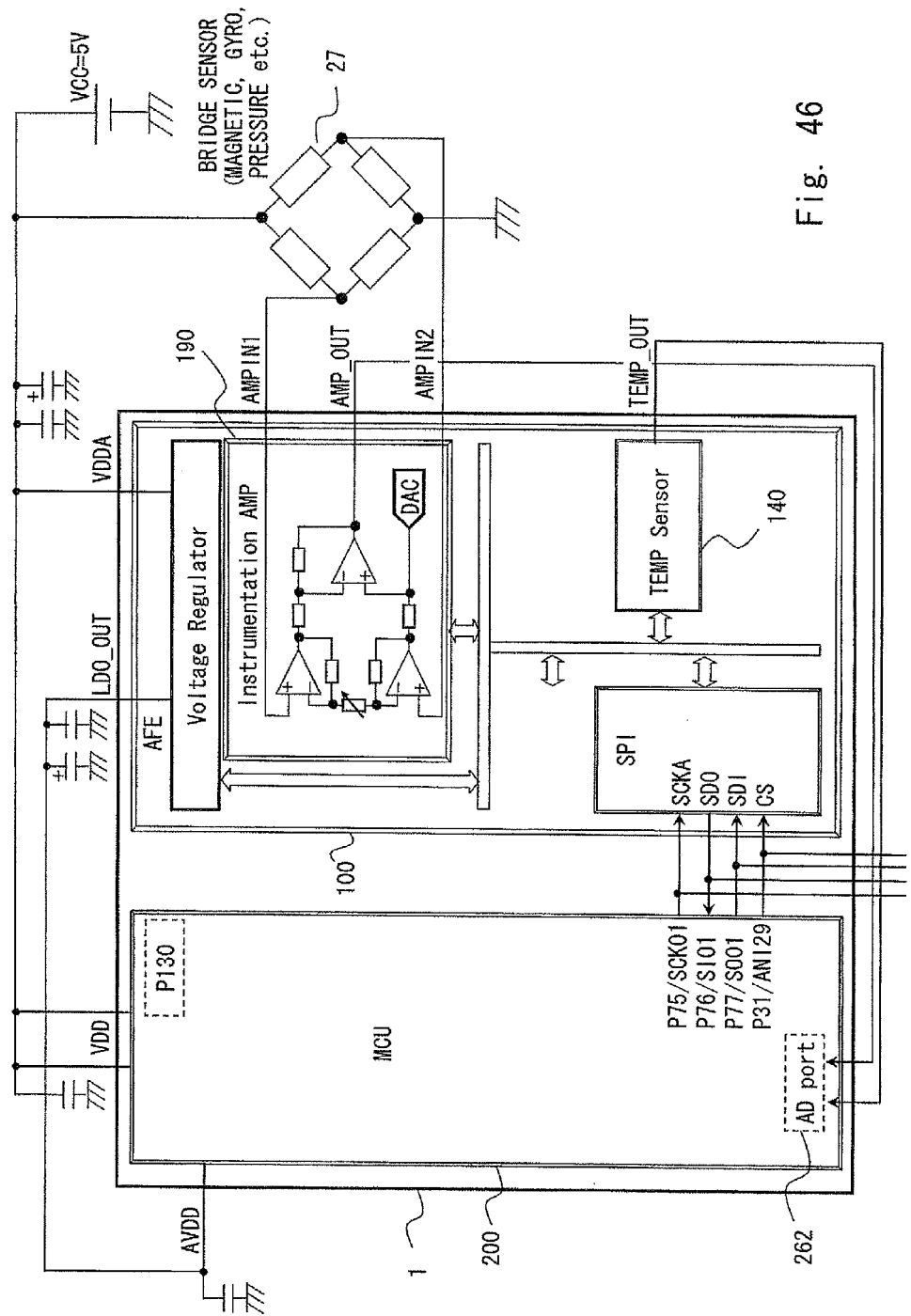
FIG. 46 is a system configuration diagram showing an application example of the semiconductor device according to the second embodiment of the invention.

FIG. 46 is an example of connecting a bridge sensor 27 such as a magnetic sensor, a gyro sensor or a pressure sensor to the semiconductor device 1. This is applicable to an application system such as a blood-pressure meter, a scale, a smartphone, or a liquid crystal television with the bridge sensor 27.

One output terminal of the bridge sensor 27 is connected to one input terminal of the instrumentation amplifier 190, the other output terminal of the bridge sensor 27 is connected to the other input terminal of the instrumentation amplifier 190, and the output terminal of the instrumentation amplifier 190 is connected to the AD port 262 of the MCU unit 200. By setting the gain, offset and the like of the instrumentation amplifier 190 in accordance with the characteristics of the bridge sensor 27, the circuit characteristics most suitable for the bridge sensor 27 can be set.

Note that the output of the temperature sensor 160 is connected to the AD port 262 of the MCU unit 200, and the output of the variable regulator 150 is connected to the power supply input of the A/D converter 260 of the MCU unit 200.

Further, although the configuration and operation of the setting evaluation system of the semiconductor device 1 according to this embodiment are basically the same as those of the first embodiment, only GUI for setting the AFE unit 100 of the semiconductor device 1 is different because the configuration of the semiconductor device 1 is different.

Figure 47:
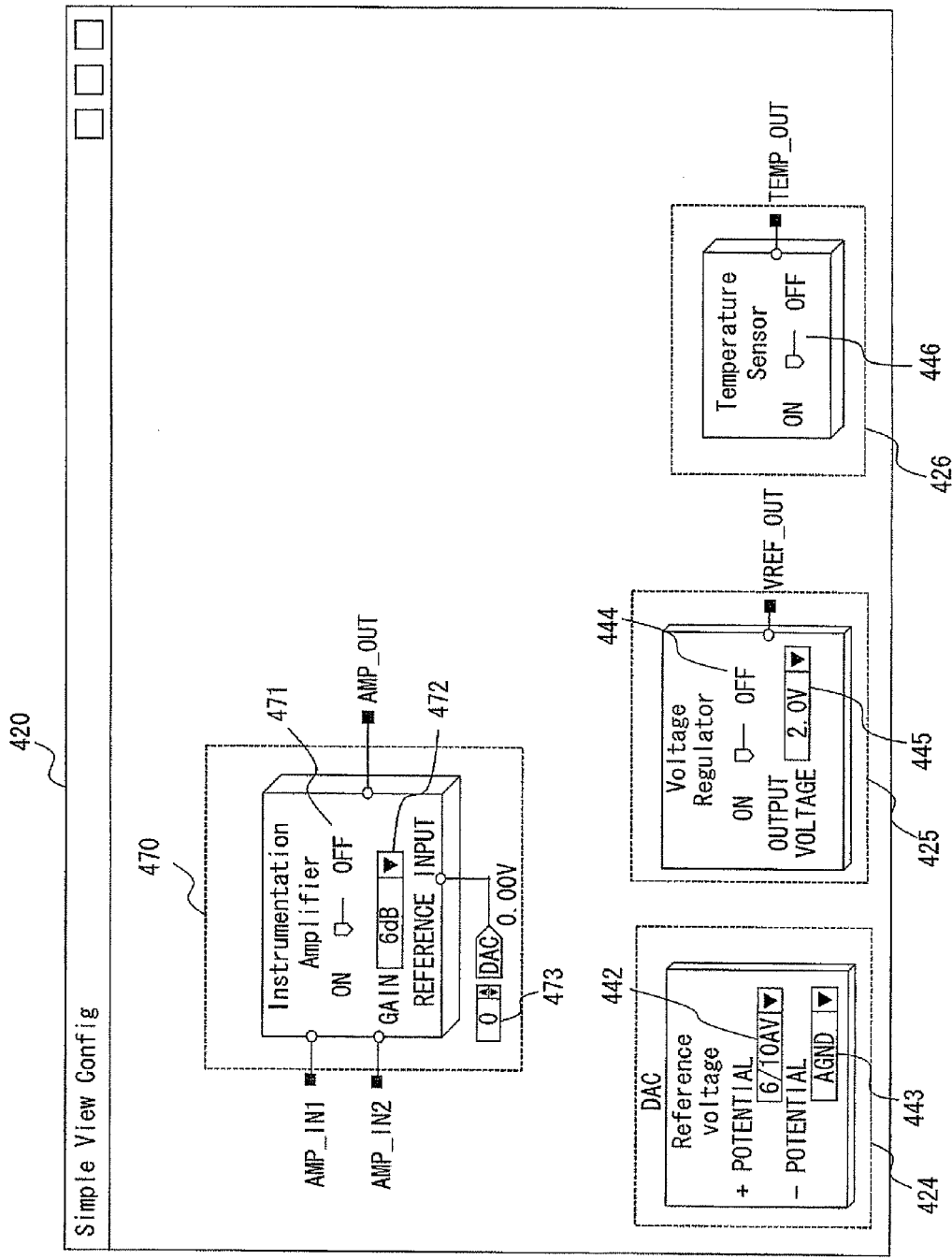
FIG. 47 is a display image diagram of GUI used in setting evaluation of the semiconductor device according to the second embodiment of the invention.

FIG. 47 is a display example of the SimpleViewConfig window, which is GUI according to this embodiment. The SimpleViewConfig window 420 is a window for setting the AFE unit 100 of the semiconductor device 1, and it corresponds to the configuration of the AFE unit 100 just like in FIG. 33 of the first embodiment.

Specifically, the SimpleViewConfig window 420 includes an instrumentation amplifier setting area 470 for setting the instrumentation amplifier 190, a DAC reference voltage setting area 424 for setting the reference voltage of the DAC connected to each operational amplifier, a variable regulator setting area 425 for setting the variable regulator 150, and a temperature sensor setting area 426 for setting the temperature sensor 160, corresponding to the configuration of the AFE unit 100. The DAC reference voltage setting area 424, the variable regulator setting area 425 and the temperature sensor setting area 426 are the same as those of FIG. 33.

In the instrumentation amplifier setting area 470, the same setting as when the instrumentation amplifier is selected in the configurable amplifier according to the first embodiment can be made. Specifically, the power on/off of the instrumentation amplifier is set by "On/Off" slide switch 471, the gain of the instrumentation amplifier is set by "Gain" pull-down menu 472, and the output voltage of 8-bit DAC is set by "DAC" input box 473.

In this embodiment also, it is possible to make detailed settings by displaying the actual circuit configuration as shown in FIG. 36 or 38.

As described above, in this embodiment, the semiconductor device can be developed easily and the development process can be reduced, like the first embodiment. Further, in this embodiment, the semiconductor device is intended for use in a common measuring instrument, and only the instrumentation amplifier or the like, which is required for the common measuring instrument, is included. Because the semiconductor device does not include unnecessary circuits, the semiconductor device has a simple circuit configuration and can be reduced in size and power consumption.

Third Embodiment of the Present Invention

Figure 48:
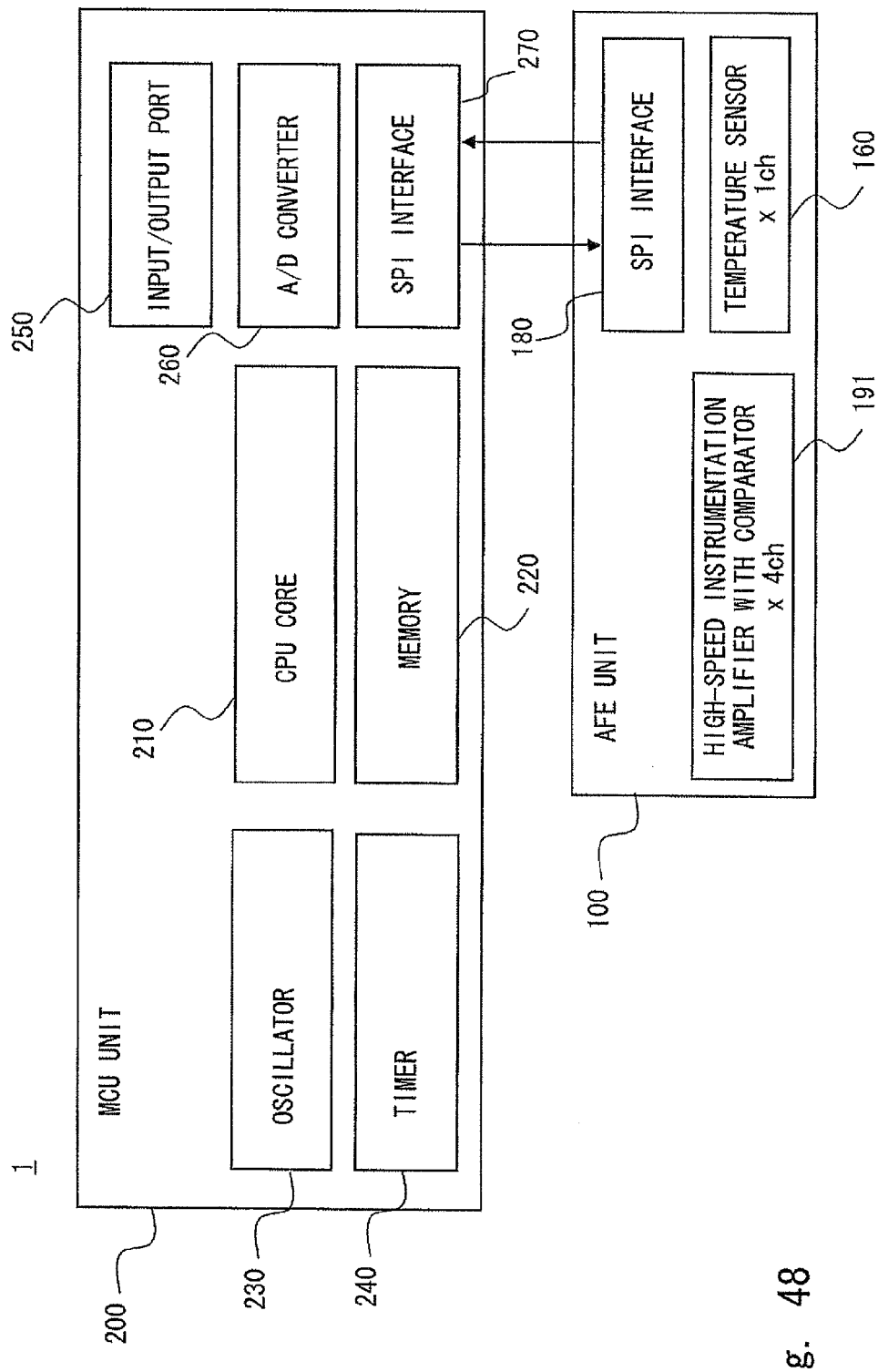
FIG. 48 is a circuit block diagram of a semiconductor device according to a third embodiment of the invention.

A third embodiment of the present invention is described hereinafter with reference to the drawings. FIG. 48 shows a circuit block of the semiconductor device 1 according to this embodiment.

The semiconductor device according to the first embodiment is intended for use in a general-purpose system, and a complete AFE circuit that is required for many sensors is included. On the other hand, the semiconductor device according to this embodiment is intended for use in motor control, and an AFE circuit that is required only for motor control is included.

As shown in FIG. 48, in the semiconductor device 1 according to this embodiment, the configuration of the MCU unit 200 is the same as that of the first embodiment shown in FIG. 2, and the AFE unit 100 includes a high-speed instrumentation amplifier 191 having a comparator, the temperature sensor 160, and the SPI interface 180. Compared with the semiconductor device 1 according to the first embodiment, the AFE unit 100 does not include the configurable amplifier, the gain amplifier supporting synchronous detection, the SC low-pass filter, the SC high-pass filter, the general-purpose amplifier and the variable regulator, and includes the high-speed instrumentation amplifier 191 having a comparator instead. The temperature sensor 160 and the SPI interface 180 are the same as those of the first embodiment.

The high-speed instrumentation amplifier having a comparator (which is referred to hereinafter also as a high-speed instrumentation amplifier) 191 is an amplification circuit that supports motor control and can amplify a faint differential signal at high speed, and further includes a comparator for making comparison of the output voltage. The AFE unit 100 includes a plurality of (multi-ch) high-speed instrumentation amplifiers 191 to enable control of a multi-phase motor, and it includes four (4ch) instrumentation amplifiers in this example. The circuit configuration of the high-speed instrumentation amplifier 191 is fixed, and only the characteristics can be changed.

Figure 49:
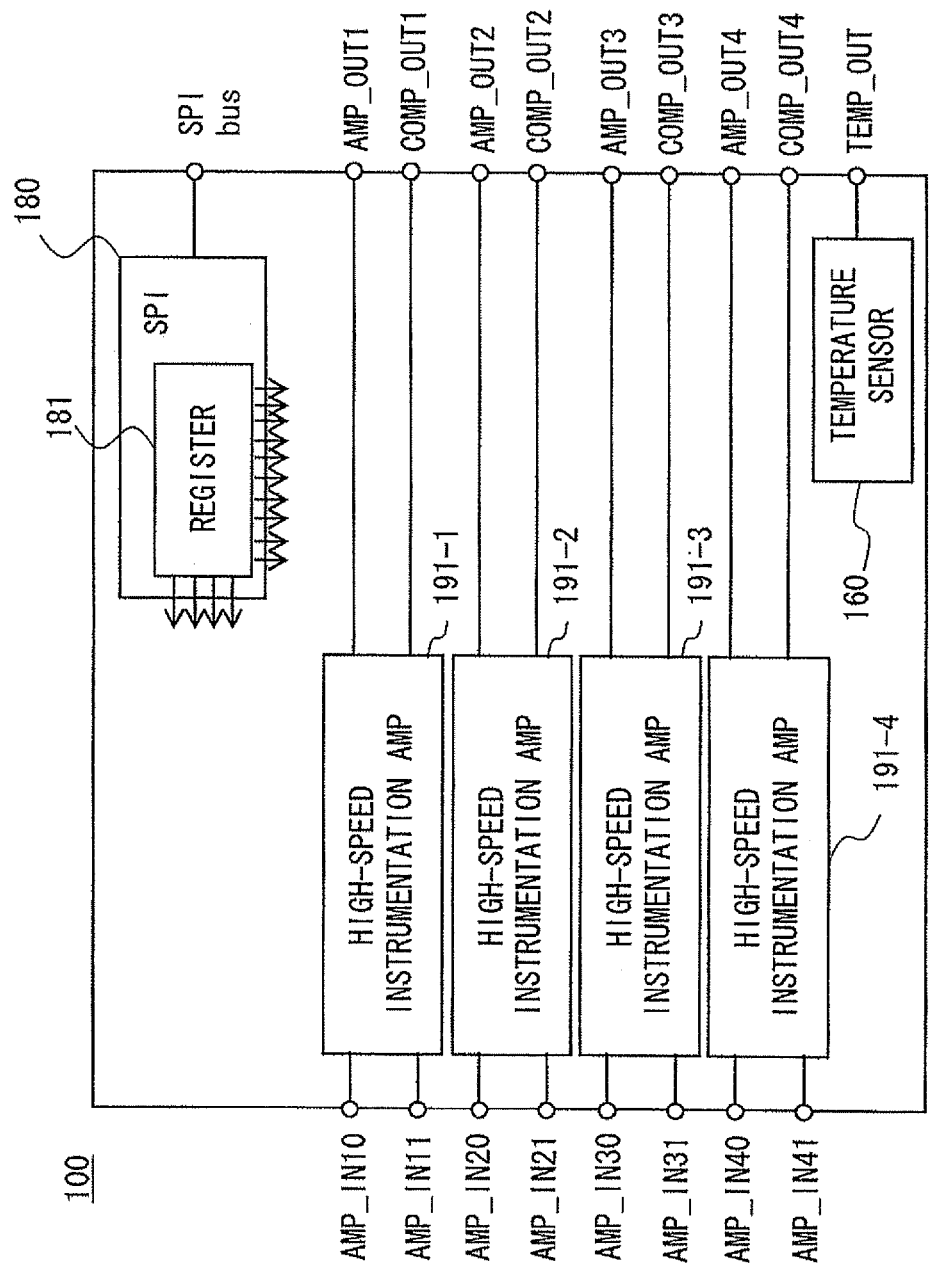
FIG. 49 is a diagram showing connections of circuits in the semiconductor device according to the third embodiment of the invention.

FIG. 49 shows connections of the circuits in the AFE unit 100 according to this embodiment. The temperature sensor 160 and the SPI interface 180 are the same as those shown in FIG. 3 of the first embodiment.

Because the circuit configuration of the high-speed instrumentation amplifier 191 is fixed, the high-speed instrumentation amplifier 191 does not include a switch (multiplexer) for switching the configuration. Four high-speed instrumentation amplifiers 191-1 to 191-4 are independent of one another.

Specifically, in the high-speed instrumentation amplifiers 191-1 to 191-4, one input terminals are connected to AMP_IN10, 20, 30 and 40, other input terminals are connected to AMP_IN11, 21, 31 and 41, the output terminals of amplifiers are connected to AMP_OUT1 to 4, and the output terminals of comparators are connected to COMP_OUT1 to 4, respectively. Note that switches for selecting connections with a plurality of external terminals may be included.

Figure 50:
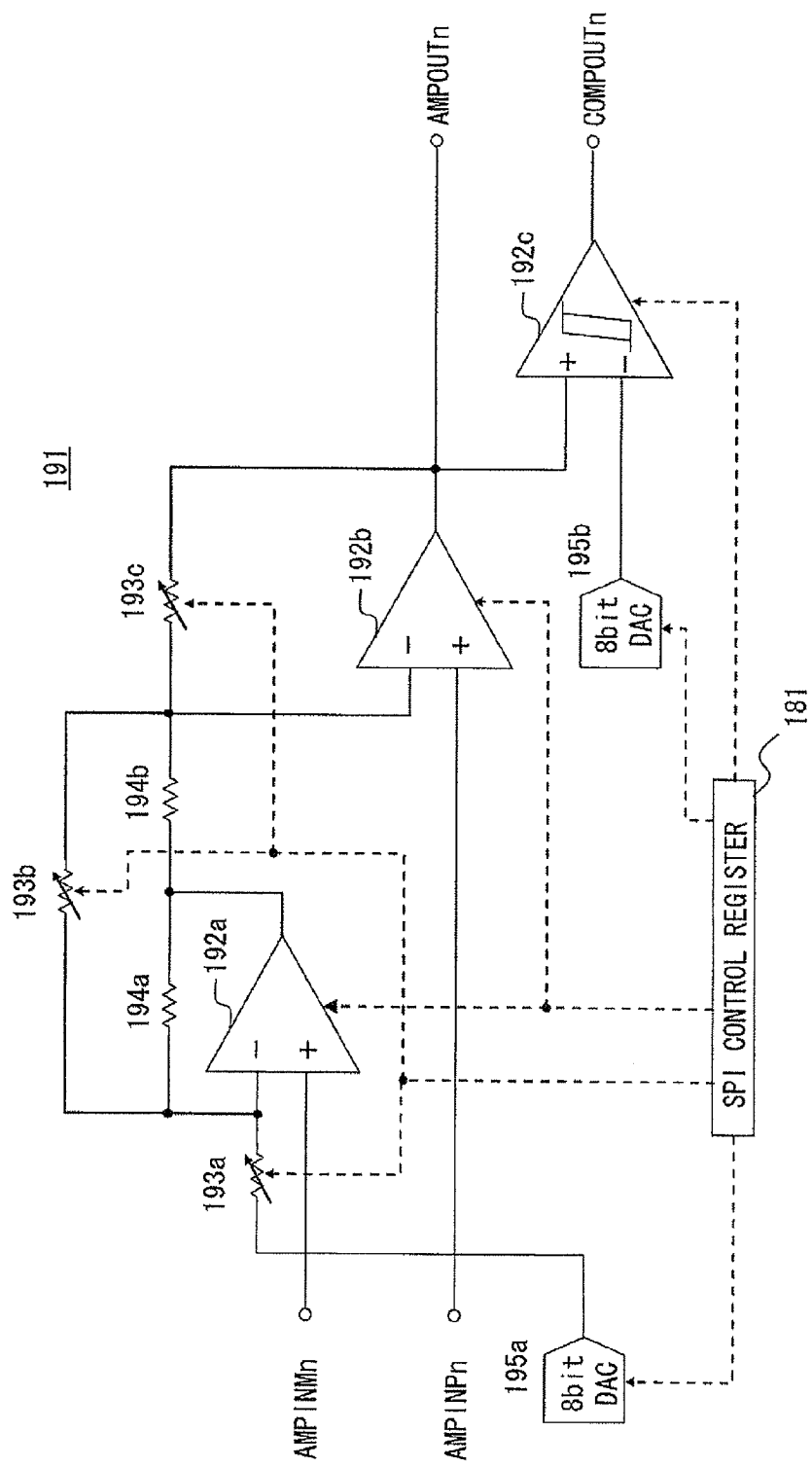
FIG. 50 is a circuit diagram showing a circuit configuration of the semiconductor device according to the third embodiment of the invention.

FIG. 50 shows a specific circuit configuration of the high-speed instrumentation amplifier 191. The high-speed instrumentation amplifier 191 is a high-speed instrumentation amplifier with a comparator intended for motor control, and it performs the amplification and voltage comparison of the output signal of a sensor used for motor control. As a change in characteristics, the gain of the high-speed instrumentation amplifier 191 can be set to be variable. For example, the gain can be set in units of 2 dB from 10 dB to 34 dB. Further, the slew rate can be set to be variable, and the power on/off can be switched by power-off mode.

Further, the high-speed instrumentation amplifier 191 includes a comparator for comparison of high-speed instrumentation amplifier output and the hysteresis voltage and reference voltage of the comparator are variable.

As shown in FIG. 50, the high-speed instrumentation amplifier 191 includes operational amplifiers 192a and 192b that operate as instrumentation amplifiers and an operational amplifier 192c that operates as a hysteresis comparator, and further includes variable resistors 193a to 193c that are connected to the operational amplifiers 192a to 192c, fixed resistors 194a and 194b, DACs 195a and 195b, and a SPI control register 181.

The gain, operating point, offset and the like of the high-speed instrumentation amplifier 191 can be changed by changing the resistance values of the variable resistors 193a to 193c and the setting of the DAC 195a according to the set value of the register 181. Further, the hysteresis voltage (reference voltage) of the comparator can be changed by the setting of the DAC 195b. Furthermore, the power on/off of the operational amplifiers 192a to 192c can be controlled according to the set value of the register 181.

In the high-speed instrumentation amplifier 191, when differential signals are input from external input terminals AMPINMn, AMPINPn (corresponding to AMPIN10, 11 to AMPIN40, 41), signals that are non-inverting amplified at high speed by two stages of instrumentation amplifiers composed of the operational amplifiers 192a and 192b are output to AMPOUTn (corresponding to AMPOUT1 to AMPOUT4). Further, a comparison signal as a result of comparing the output signal of the AMPOUTn and the reference voltage is output from the hysteresis comparator composed of the operational amplifiers 192c. Note that the MCU unit 200 performs motor control according to signals at AMPOUTn and COMPOUTn.

As described above, in the semiconductor device 1 according to this embodiment, the circuit configuration of the AFE unit 100 is fixed, and only the characteristics can be set to be variable. Therefore, one semiconductor device can support specific sensors having different characteristics, and it can be used for a specific application system. Particularly, it can be connected to a drive circuit of a multi-phase motor or the like.

Figure 51:
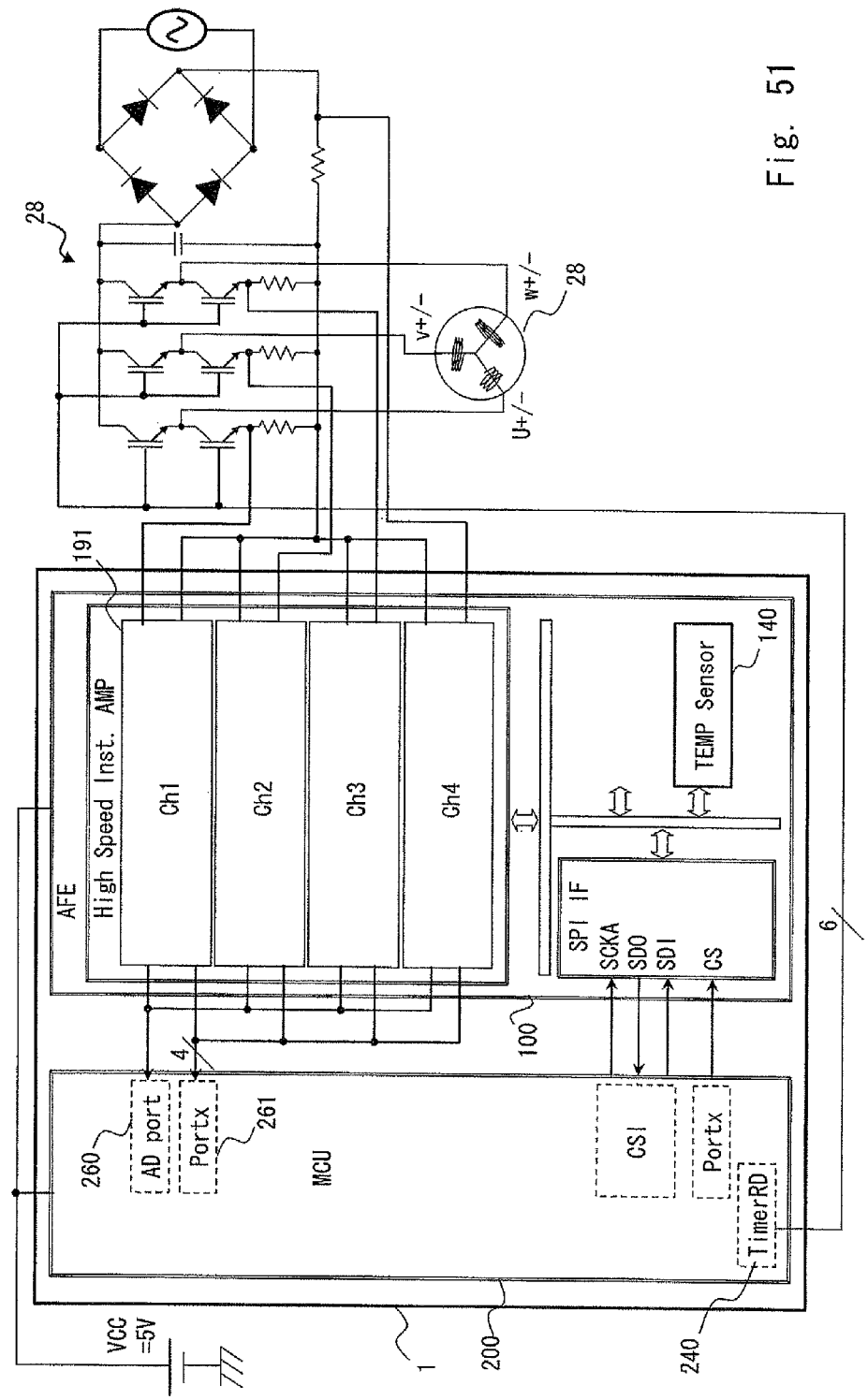
FIG. 51 is a system configuration diagram showing an application example of the semiconductor device according to the third embodiment of the invention.

FIG. 51 is an example of connecting a brushless motor 28 to the semiconductor device 1. This is applicable to an application system such as an air conditioner, a washing machine, a refrigerator, a robot or the like having the brushless motor 28, for example.

The input terminals of the respective high-speed instrumentation amplifiers 191 are connected to a drive circuit 29 of the brushless motor 28, the output terminals of the respective high-speed instrumentation amplifiers 191 are connected to the AD port 262 of the MCU unit 200, and the output terminals of the respective comparators of the high-speed instrumentation amplifiers 191 are connected to a control port 261 of the MCU unit 200. By setting the gain and offset and the like of the high-speed instrumentation amplifiers 191 and the reference voltage of the comparators in accordance with the characteristics of the brushless motor 28 and the drive circuit 29, the circuit characteristics most suitable for the brushless motor 28 can be set.

In this example, the drive circuit 29 is connected to the timer 240 of the MCU unit 200, and the brushless motor 28 is driven according to the clock pulse of the timer 240. Then, the signals of the drive circuit 29 that drives the multi-phase brushless motor 28 are amplified and compared by the high-speed instrumentation amplifiers 191, and drive control of the brushless motor 28 is thereby made by the MCU unit 200.

Further, although the configuration and operation of the setting evaluation system of the semiconductor device 1 according to this embodiment are basically the same as those of the first embodiment, only GUI for setting the AFE unit 100 of the semiconductor device 1 is different because the configuration of the semiconductor device 1 is different.

Figure 52:
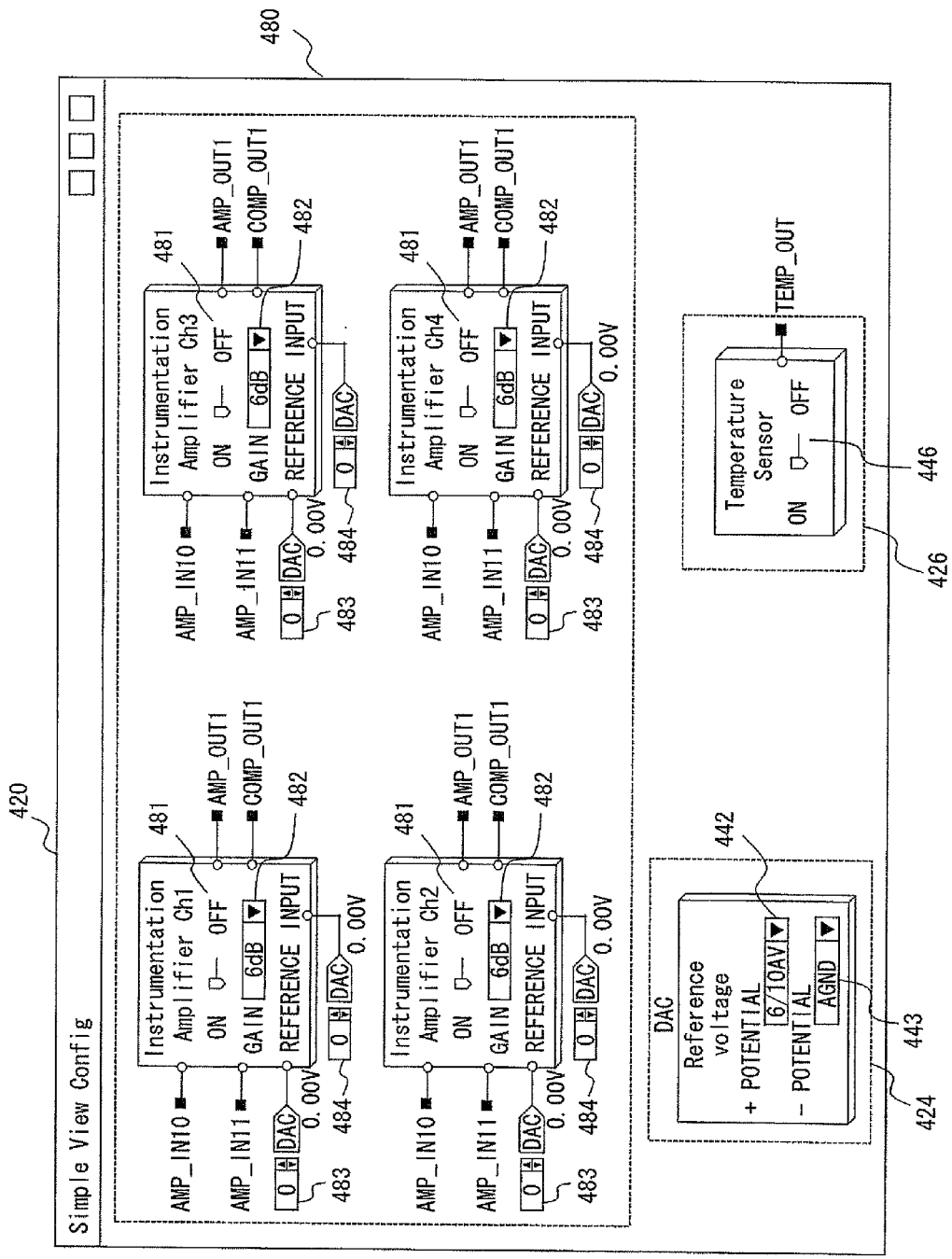
FIG. 52 is a display image diagram of GUI used in setting evaluation of the semiconductor device according to the third embodiment of the invention.

FIG. 52 is a display example of the SimpleViewConfig window, which is GUI according to this embodiment. The SimpleViewConfig window 420 is a window for setting the AFE unit 100 of the semiconductor device 1, and it corresponds to the configuration of the AFE unit 100 just like in FIG. 33 of the semiconductor device 1.

Specifically, the SimpleViewConfig window 420 includes a high-speed instrumentation amplifier setting area 480 for setting the high-speed instrumentation amplifier 191, a DAC reference voltage setting area 424 for setting the reference voltage of the DAC connected to each operational amplifier, and a temperature sensor setting area 426 for setting the temperature sensor 160, corresponding to the configuration of the AFE unit 100. The DAC reference voltage setting area 424 and the temperature sensor setting area 426 are the same as those of FIG. 33.

In the high-speed instrumentation amplifier setting area 480, 4ch high-speed instrumentation amplifiers can be set in accordance with the high-speed instrumentation amplifier 191. In the setting of each Ch of high-speed instrumentation amplifier, the power on/off of the high-speed instrumentation amplifier is set by "On/Off" slide switch 481, the gain of the high-speed instrumentation amplifier is set by "Gain" pull-down menu 482, and the output voltage of 8-bit DAC is set by "DAC" input box 483 and 484, as in the configurable amplifier and the gain amplifier according to the first embodiment. The "DAC" input box 483 allows setting of the offset or the like of the high-speed instrumentation amplifier, and the "DAC" input box 484 allows setting of the reference voltage of the comparator.

In this embodiment also, it is possible to make detailed settings by displaying the actual circuit configuration as shown in FIG. 36 or 38.

As described above, in this embodiment, the semiconductor device can be developed easily and the development process can be reduced, like the first embodiment. Further, in this embodiment, the semiconductor device is intended for use in motor control, and only the high-speed instrumentation amplifier or the like, which is required for motor control, is included. Because the semiconductor device does not include unnecessary circuits, the semiconductor device has a simple circuit configuration and can be reduced in size and power consumption.

Fourth Embodiment of the Present Invention

A fourth embodiment of the present invention is described hereinafter with reference to the drawings. In the above-described embodiments, the setting and evaluation of the AFE unit 100 of the semiconductor device 1 are mainly performed by the setting evaluation device 3. In this embodiment, the development and debugging of software (program) of the MCU unit 200 are performed in addition to the setting and evaluation of the AFE unit 100.

Figure 53:
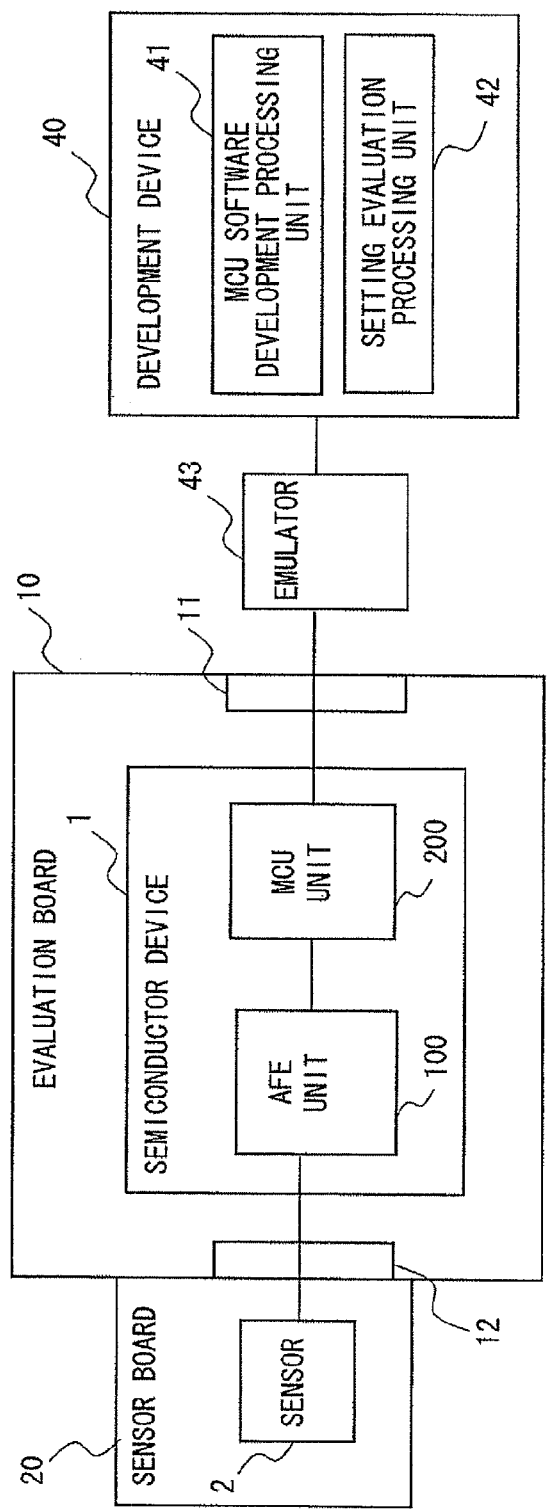
FIG. 53 is a configuration diagram of a development system including a semiconductor device according to a fourth embodiment of the invention.

FIG. 53 shows the configuration of a development system (development support system) of the semiconductor device according to this embodiment. The development system includes an evaluation board 10 on which the semiconductor device 1 according to this embodiment is mounted and a sensor board 20 on which the sensor 2 is mounted, which are the same as in FIG. 27, and further includes a development device 40 and an emulator 43.

The development device (development support device) 40 is an integrated development device for developing both of the AFE unit 100 and the MCU unit 200 of the semiconductor device 1, and it includes a MCU software development processing unit 41 and a setting evaluation processing unit 42. The development device 40 is a computer device composed of the same hardware as shown in FIG. 28, and a CPU executes a program to perform MCU software development processing and setting evaluation processing, thereby implementing the functions of the MCU software development processing unit 41 and the setting evaluation processing unit 42.

The setting evaluation processing unit 42 is the same function as the setting evaluation device of the first embodiment and performs the setting and evaluation of the AFE unit 100 of the semiconductor device 1. Specifically, the setting evaluation processing unit 42 has the same configuration and performs the same operation as shown in FIGS. 29 and 31 and enables the setting and evaluation of the AFE unit 100 through GUI.

The MCU software development processing unit 41 performs processing for the development of software to be executed by a CPU core of the MCU unit 200 of the semiconductor device 1. Specifically, the MCU software development processing unit 41 is a software development support tool for microcomputer such as the MCU unit 200, and has the environment to perform coding and build corresponding to the MCU unit 200 and a device driver. Particularly, in this embodiment, the MCU software development processing unit 41 cooperates with the setting evaluation processing unit 42 and generates a program containing information of the register 181 of the AFE unit 100 that is generated by the setting evaluation processing unit 42.

The emulator 43 is connected to the MCU unit 200 of the semiconductor device 1 and emulates the MCU unit 200. By the connection with the emulator 43, the MCU software development processing unit 41 can perform program debugging and writing.

Figure 54:
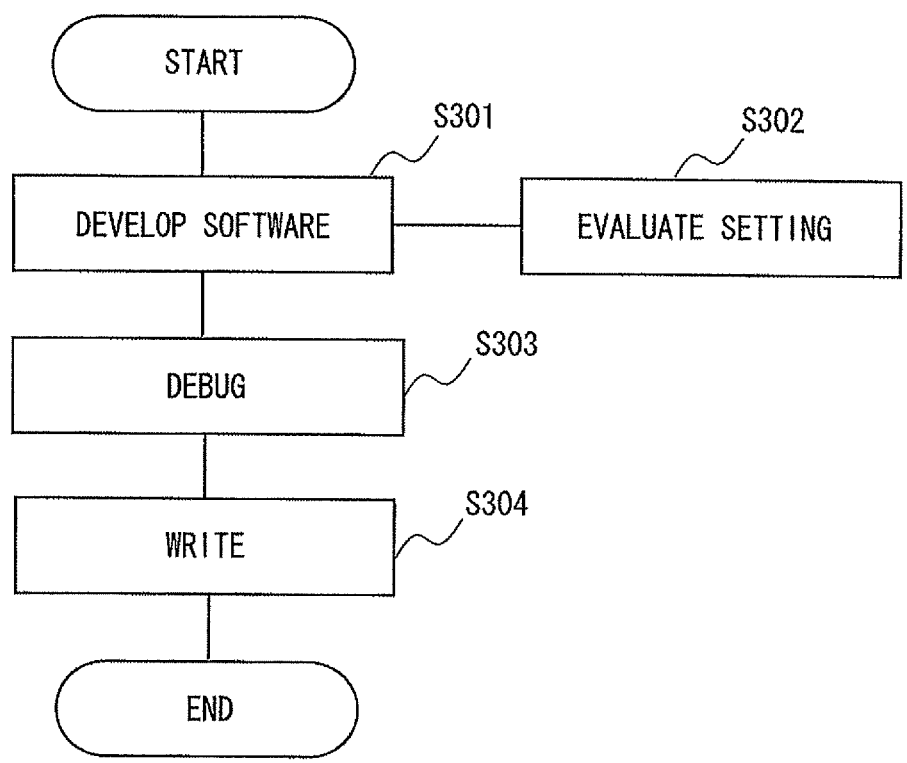
FIG. 54 is a flowchart showing a development method of the semiconductor device according to the fourth embodiment of the invention.
Figure 55:
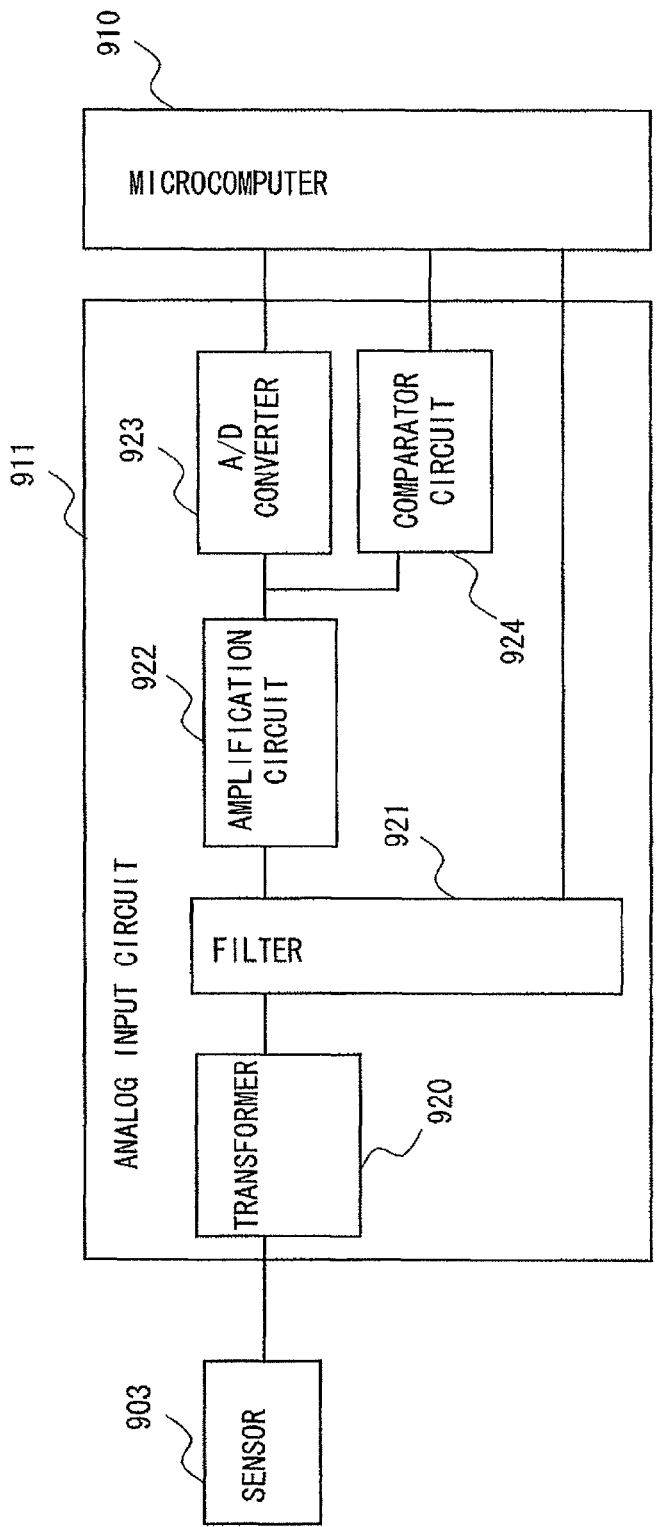
FIG. 55 is a configuration diagram showing a circuit configuration according to related art.

FIG. 54 shows a development method of the semiconductor device 1 according to this embodiment. First, the development device 40 develops software of the MCU unit 200 of the semiconductor device 1 (S301) and evaluates the setting of the AFE unit 100 of the semiconductor device 1 (S302).

Specifically, the MCU software development processing unit 41 generates a program to be executed in the MCU unit 200 by user's input and, concurrently, the setting evaluation processing unit 42 generates information of the register 181 of the AFE unit 100 by user's operation through the GUI. Then, the MCU software development processing unit 41 generates source code coded by the user and source code containing the information to be set to the register 181 of the AFE unit 100 which is generated by the setting evaluation processing unit 42. For example, the information to be directly written into the register 181 in the program that performs processing of dynamically rewriting the register 181 by the MCU unit 200 is contained in the source code.

Next, the development device 40 debugs the generated program (S303). Specifically, the MCU software development processing unit 41 debugs the source code containing the information of the register 181 by using the emulator 43. For example, it performs debugging including writing into the register 181 by the MCU unit 200 or the like.

Then, the development device 40 writes the debugged program into the semiconductor device 1 (S304). Specifically, the MCU software development processing unit 41 writes the generated and debugged program into the memory of the MCU unit 200 of the semiconductor device 1 by using the emulator 43. The development (manufacture) of the semiconductor device 1 including the MCU unit 200 and the AFE unit 100 thereby ends.

After that, when the semiconductor device 1 is activated, the CPU core of the MCU unit 200 executes the program written in the memory and writes the information of the register 181 written in the memory into the register 181. Then, the configuration and characteristics of the AFE unit 100 are set by the register 181, and the AFE unit 100 starts operating.

As described above, in this embodiment, the semiconductor device is developed in cooperation with the software development environment of the MCU unit in addition to the setting evaluation tool of the AFE unit of the semiconductor device. The coding and debugging of the MCU unit and the setting and evaluation of the AFE unit can be thereby performed in one environment, and it is thus possible to improve the development efficiency and further reduce the development period.

Note that the present invention is not restricted to the above-described embodiments, and various changes and modifications may be made without departing from the scope of the invention. Although the semiconductor device for a common measuring instrument and the semiconductor device for motor control are described in the second and third embodiments, respectively, the semiconductor device may be composed only of required circuits as a semiconductor device for other uses. For example, the semiconductor device may have a configuration composed only of a low offset non-inverting amplifier and a temperature sensor to serve as a semiconductor device for a high accuracy measuring instrument.

Further, when making settings using GUI, the circuit configuration included in the AFE unit of the semiconductor device may be recognized automatically, and the GUI may be displayed to allow settings in accordance with the recognized circuit configuration.

The first, second, third and fourth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor device comprising:
an analog front-end unit that includes a configurable amplifier to performs analog front-end processing of a measurement signal input from a sensor, the configurable amplifier including an operational amplifier and a switch that switches a destination of an input terminal of the operational amplifier to change circuit configurations and circuit characteristics of the analog front-end unit; and
a control unit that includes an analog-to-digital converter to converts the measurement signal after the analog front-end processing and a change timing detection unit,
wherein the control unit changes the configurations and characteristics of the analog front-end unit at a timing indicated by the change timing detection unit and the analog-to-digital converter stops the converting during the changing.

2. The semiconductor device according to claim 1, wherein the control unit changes the configurations and characteristics of the analog front-end unit on a regular basis in accordance with the indication by the change timing detection unit.

3. The semiconductor device according to claim 1, wherein the control unit includes a first serial interface unit, and the analog front-end unit includes a second serial interface unit and a register unit,
wherein the control unit sends setting information to change the circuit configurations and characteristics by the first serial interface unit, the analog front-end unit receives the setting information by the second serial interface unit and the second serial interface unit stores the setting information into the register unit.

4. The semiconductor device according to claim 3, wherein the control unit sends the setting information by executing a program including a code that describes the setting information.

5. The semiconductor device according to claim 1, wherein the configurable amplifier includes a plurality of operational amplifiers, and the switch switches connection between the plurality of operational amplifiers to change the configurations and characteristics.

6. The semiconductor device according to claim 1, wherein the configurable amplifier includes a variable resistor that is connected to the operational amplifier and switches a resistance value to change a gain.

7. The semiconductor device according to claim 1, wherein the configurable amplifier includes a D/A (digital-to-analog) converter that switches a voltage to be input to the operational amplifier to change an operating point or offset.

8. The semiconductor device according to claim 1, wherein the analog front-end unit includes a gain amplifier to execute a synchronous detection function to an output of the configurable amplifier where a gain is changeable in accordance with setting of the control unit.

9. The semiconductor device according to claim 1, wherein the analog front-end unit includes a gain amplifier with synchronous detection function where a gain is changeable in accordance with setting of the control unit and where connection configuration with the configurable amplifier is changeable.

10. The semiconductor device according to claim 9, wherein the analog front-end unit includes a filter where a cutoff frequency is changeable in accordance with setting of the control unit and where connection configuration with the configurable amplifier or the gain amplifier is changeable.

11. The semiconductor device according to claim 1, wherein the analog front-end unit includes a filter where a cutoff frequency is changeable in accordance with setting of the control unit.

12. The semiconductor device according to claim 11, wherein the filter includes a low-pass filter and a high-pass filter, and an order of connection of the low-pass filter and the high-pass filter is changeable in accordance with setting of the control unit.

13. The semiconductor device according to claim 1, wherein the analog front-end unit includes a variable regulator where a supply voltage to the control unit is changeable in accordance with setting of the control unit.

14. The semiconductor device according to claim 1, wherein the analog front-end unit includes a temperature sensor that outputs a measurement signal in accordance with a temperature to the control unit.

15. The semiconductor device according to claim 1, wherein the analog front-end unit switches power on/off of each internal circuit in accordance with setting of the control unit.

16. The semiconductor device according to claim 1, wherein the analog front-end unit includes a register that stores setting information to set the circuit configurations and the circuit characteristics, and
the control unit writes the setting information into the register and thereby changes the circuit configurations and the circuit characteristics.

17. The semiconductor device according to claim 1, wherein the analog front-end unit and the control unit are connected by a serial interface, and
the control unit sets the circuit configurations and the circuit characteristics through the serial interface.

18. A sensor system comprising:
a sensor that outputs a measurement signal indicating a specified measurement result; and
a semiconductor device that performs control operation in accordance with the measurement result, the semiconductor device including:
an analog front-end unit that includes a configurable amplifier to performs analog front-end processing of a measurement signal input from a sensor, the configurable amplifier including an operational amplifier and a switch that switches a destination of an input terminal of the operational amplifier to change circuit configurations and circuit characteristics of the analog front-end unit, and
a control unit that includes an analog-to-digital converter to convert the measurement signal after the analog front-end processing and change timing detection unit,
wherein the control unit changes the configurations and characteristics of the analog front-end unit at a timing indicated by the change timing detection unit and the analog-to-digital converter stops the converting during the changing.

* * * * *